(12) United States Patent
Oh et al.

(10) Patent No.: US 10,998,479 B2
(45) Date of Patent: May 4, 2021

(54) LIGHT EMITTING DIODE

(71) Applicant: SEOUL VIOSYS CO., LTD., Ansan-si (KR)

(72) Inventors: Se Hee Oh, Ansan-si (KR); Hyun A Kim, Ansan-si (KR); Jong Kyu Kim, Ansan-si (KR); Hyoung Jin Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 101 days.

(21) Appl. No.: 16/158,305

(22) Filed: Oct. 12, 2018

(65) Prior Publication Data

US 2019/0051805 A1    Feb. 14, 2019

Related U.S. Application Data

(63) Continuation of application No. PCT/KR2017/004420, filed on Apr. 26, 2017.

(30) Foreign Application Priority Data

May 3, 2016  (KR) .................. 10-2016-0054885
May 27, 2016  (KR) .................. 10-2016-0065501
Jun. 24, 2016  (KR) .................. 10-2016-0079392

(51) Int. Cl.
  *H01L 33/62*    (2010.01)
  *H01L 33/10*    (2010.01)
  (Continued)

(52) U.S. Cl.
  CPC .......... *H01L 33/62* (2013.01); *H01L 25/0753* (2013.01); *H01L 27/153* (2013.01);
  (Continued)

(58) Field of Classification Search
  None
  See application file for complete search history.

(56) References Cited

U.S. PATENT DOCUMENTS 8,476,666 B2   7/2013  Kim et al.
9,947,835 B2   4/2018  Seo et al.
(Continued)

FOREIGN PATENT DOCUMENTS

JP     2011-066073      3/2011
KR  10-2010-0003321    1/2010
(Continued)

OTHER PUBLICATIONS

English machine translations from IP.com of the Foreign Patent Document KR 10-2014-0072553 cited on Nov. 1, 2019 IDS (Year: 2020).*

(Continued)

*Primary Examiner* — Shaun M Campbell
*Assistant Examiner* — Aneta B Cieslewicz
(74) *Attorney, Agent, or Firm* — H.C. Park & Associates, PLC

(57) ABSTRACT

A light emitting diode includes a first light emitting cell and a second light emitting cell comprising an n-type semiconductor layer, and a p-type semiconductor layer, respectively; reflection structures contacting the p-type semiconductor layers; a first contact layer in ohmic contact with the n-type semiconductor layer of the first light emitting cell; a second contact layer in ohmic contact with the n-type semiconductor layer of the second light emitting cell and connected to the reflection structure on the first light emitting cell. An n-electrode pad is connected to the first contact layer; and a p-electrode pad is connected to the reflection structure on the second light emitting cell. The first light emitting cell and the second light emitting cell are isolated from each other, and their outer side surfaces are inclined steeper than the inner sides. Therefore, a forward voltage may be lowered and light output may be improved.

16 Claims, 29 Drawing Sheets

(51) Int. Cl.
- H01L 25/075 (2006.01)
- H01L 33/32 (2010.01)
- H01L 33/50 (2010.01)
- F21S 41/141 (2018.01)
- H01L 33/44 (2010.01)
- H01L 27/15 (2006.01)
- H01L 33/38 (2010.01)
- H01L 33/40 (2010.01)
- H01L 33/64 (2010.01)
- H01L 33/46 (2010.01)
- H01L 33/08 (2010.01)
- H01L 33/22 (2010.01)

(52) U.S. Cl.
CPC ............ *H01L 33/10* (2013.01); *H01L 33/325* (2013.01); *H01L 33/38* (2013.01); *H01L 33/405* (2013.01); *H01L 33/44* (2013.01); *H01L 33/50* (2013.01); *H01L 33/64* (2013.01); *F21S 41/141* (2018.01); *H01L 33/08* (2013.01); *H01L 33/22* (2013.01); *H01L 33/382* (2013.01); *H01L 33/46* (2013.01)

(56) References Cited

U.S. PATENT DOCUMENTS

| | | |
|---|---|---|
| 2011/0024781 A1 | 2/2011 | Fujimoto et al. |
| 2012/0074441 A1* | 3/2012 | Seo .................. H01L 27/153 257/91 |
| 2013/0248917 A1* | 9/2013 | Obata .................. H01L 33/38 257/99 |
| 2014/0008665 A1 | 1/2014 | Jo et al. |
| 2015/0362165 A1 | 12/2015 | Chu et al. |
| 2016/0005941 A1* | 1/2016 | Tsai .................. H01L 33/62 257/98 |
| 2016/0057833 A1 | 2/2016 | Oh et al. |
| 2016/0072011 A1 | 3/2016 | Chae et al. |
| 2016/0372630 A1* | 12/2016 | Jang .................. H01L 33/24 |
| 2017/0236979 A1* | 8/2017 | Seo .................. H01L 33/44 257/88 |
| 2019/0081221 A1* | 3/2019 | Jeon .................. H01L 33/54 |

FOREIGN PATENT DOCUMENTS

| | | |
|---|---|---|
| KR | 10-2011-0044188 | 4/2011 |
| KR | 10-2014-0028803 | 3/2014 |
| KR | 10-2014-0072553 | 6/2014 |
| KR | 10-2015-0144048 | 12/2015 |

OTHER PUBLICATIONS

English machine translations from the Korean Patent Office of the Foreign Patent Document KR 10-2014-0072553 cited on Nov. 1, 2019 IDS (Year: 2020).*
EP Search Report dated Oct. 17, 2019 in corresponding Application No. PCT/KR2017004420.
International Search Report dated Aug. 9, 2017, in International Application No. PCT/KR2017/004420 (with English Translation).
EP Search Report dated Nov. 12, 2020 in EP Application No. 20194164.8.

* cited by examiner

A-A

B-B

A-A

B-B

LIGHT EMITTING DIODE

CROSS-REFERENCE TO RELATED APPLICATIONS

This application is a Continuation of International Patent Application No. PCT/KR2017/004420, filed on Apr. 26, 2017, and claims priority from and the benefit of Korean Patent Application No. 10-2016-0054885, filed on May 3, 2016, Korean Patent Application No. 10-2016-0065501, filed on May 27, 2016, and Korean Patent Application No. 10-2016-0079392, filed on Jun. 24, 2016, all of which are hereby incorporated by reference for all purposes as if fully set forth herein.

BACKGROUND

Field

Exemplary embodiments of the present disclosure relate to an inorganic light emitting diode, more specifically to a chip-scale package type light emitting diode.

Discussion of the Background

In an inorganic light emitting diode, electrons supplied from an n-type semiconductor layer and holes supplied from a p-type semiconductor layer recombine in an active layer to emit light. In general, with good thermal stability and a direct transition type energy band structure, Group III-based nitrides, such as gallium nitride (GaN), aluminum nitride (AlN), and the like, have been spotlighted as materials for light sources in the visible range and the ultraviolet range. In particular, a gallium nitride-based light emitting diode is used as a light source in the ultraviolet or blue region in various fields such as a display, an automobile lamp, and general lighting. Particularly, blue and green light emitting diodes using indium gallium nitride are used in various fields including large full color flat panel displays, signal lamps, interior lighting, high density light sources, high resolution output systems, optical communication, and the like. Since a light emitting diode including a nitride semiconductor has advantages of a long lifetime, low power consumption, and rapid response, its usage area has been continuously expanded.

In the meantime, light emitting diodes having a plurality of light emitting cells connected in series or in parallel on a single substrate have been developed. Light emitting diodes having light emitting cells connected in series have an advantage of being operated at a relatively high voltage because the plurality of light emitting cells are connected in series.

In addition, light emitting diodes having a plurality of light emitting cells connected in parallel can distribute a current to the plurality of light emitting cells, compared to a case where a current is supplied to a single cell having the same area, and thus, there is an advantage that a problem of current concentration caused by defects can be alleviated.

The plurality of light emitting cells are separated from one another and electrically insulated by an isolation region on the substrate, and the light emitting cells are electrically connected by using a connector. An isolation process is performed to electrically isolate the light emitting cells, and the isolation region is formed to have a gentle slope to connect the connector. However, since the isolation region is formed to have the gentle slope, a light emitting area of the light emitting cells is significantly reduced, a forward voltage is rapidly increased, and a light output is reduced.

Meanwhile, a flip chip structure light emitting diode is required to further improve current spreading, heat dissipation efficiency, and light output. Particularly, a chip-scale package has been developed in recent years, for which a packaging process is performed at a wafer level, and thus a separate packaging process is not needed. Similarly to a typical light emitting diode package, the chip-scale package can be directly mounted on a printed circuit board or the like using solder or the like to manufacture a light emitting module, and can be suitably used for various applications such as a backlight unit. Since these light emitting diodes are smaller in size than standard packages and do not require a separate packaging process, a process can further be simplified, time and cost can be saved. Moreover, a chip-scale package type light emitting diode has a flip-chip shape electrode structure in general, and thus has excellent heat dissipation characteristics.

The above information disclosed in this Background section is only for understanding of the background of the inventive concepts, and, therefore, it may contain information that does not constitute prior art.

SUMMARY

Exemplary embodiments of the present disclosure provide a chip-scale package type light emitting diode with improved light extraction efficiency.

Exemplary embodiments of the present disclosure provide a light emitting diode having an evenly dispersed light emitting region.

Exemplary embodiments of the present disclosure provide a light emitting diode comprising a plurality of light emitting cells and alleviating light emission area reduction, and a light emitting device and a light emitting module having the light emitting diode.

Exemplary embodiments of the present disclosure provide a light emitting diode suitable for a flip chip structure to have excellent current spreading capability, and to increase heat dissipation efficiency and optical output, and a light emitting device and a light emitting module having the light emitting diode.

Additional features of the inventive concepts will be set forth in the description which follows, and in part will be apparent from the description, or may be learned by practice of the inventive concepts.

A light emitting diode in accordance with an exemplary embodiment comprises: a substrate; a first light emitting cell and a second light emitting cell disposed adjacent to each other on the substrate and each comprising an n-type semiconductor layer, a p-type semiconductor layer, and an active layer disposed between the n-type semiconductor layer and the p-type semiconductor layer; reflection structures disposed on the p-type semiconductor layers of the first light emitting cell and the second light emitting cell, respectively, and contacting the p-type semiconductor layers; a first contact layer in ohmic contact with the n-type semiconductor layer of the first light emitting cell; a second contact layer in ohmic contact with the n-type semiconductor layer of the second light emitting cell and connected to the reflection structure on the first light emitting cell; an n-electrode pad disposed over the first light emitting cell and electrically connected to the first contact layer; and a p-electrode pad disposed over the second light emitting cell and electrically connected to the reflection structure on the second light emitting cell, wherein the first light emitting cell and the second light emitting cell are isolated from each other by an isolation region exposing the substrate, wherein the n-type semiconductor layers of the first light emitting cell and the second light emitting cell comprise inner side surfaces facing each other and outer side surfaces exposed to outside, wherein the at least one outer side surface is inclined steeper than the inner sides.

In accordance with another embodiment of the present disclosure, a light emitting device may comprise the light emitting diode described above: and a wavelength conversion layer covering the substrate and side surfaces of the light emitting diode, and exposing the n-electrode pad and the p-electrode pad.

A light emitting diode in accordance with another embodiment of the present disclosure comprises: a first light emitting cell and a second light emitting cell each comprising an n-type semiconductor layer, a p-type semiconductor layer, and an active layer disposed between the n-type semiconductor layer and the p-type semiconductor layer, and having a first through-hole and a second through-hole passing through the active layers and the p-type semiconductor layers and exposing the n-type semiconductor layers, respectively; reflection structures having openings for exposing the first through-hole and the second through-hole and contacting the p-type semiconductor layers; a first contact layer in ohmic-contact with the n-type semiconductor layer on the first light emitting cell through the first through-hole; a second contact layer in ohmic-contact with the n-type semiconductor layer of the second light emitting cell through the second through-hole and connected to the reflection structure on the first light emitting cell; a resin layer covering the first and second contact layers over the first and second light emitting cells; an n-electrode pad electrically connected to the first contact layer through the resin layer, and protruding on the resin layer; and a p-electrode pad electrically connected to the reflection structure on the second light emitting cell through the resin layer and protruding on the resin layer, wherein the first light emitting cell and the second light emitting cell are isolated from each other by an isolation region.

In accordance with another embodiment of the present disclosure, a light emitting module is provided. The light emitting module comprises a printed circuit board; a plurality of light emitting diodes mounted on the printed circuit board; and a spacer having a through-hole shaped cavity disposed on the printed circuit board and exposing the plurality of light emitting diodes, wherein the spacer comprises a light reflection material. Here, the plurality of light emitting diodes comprise the light emitting diodes described above.

A light emitting diode in accordance with another embodiment of the present disclosure, comprises: a first conductivity type semiconductor layer; a mesa comprising a second conductivity type semiconductor layer disposed on the first conductivity type semiconductor layer and an active layer interposed between the second conductivity type semiconductor layer and the first conductivity type semiconductor layer; a first contact layer comprising an outer contact portion contacting the first conductivity type semiconductor layer near an edge of the first conductivity type semiconductor layer along a periphery of the mesa and an inner contact portion contacting the first conductivity type semiconductor layer in a region surrounded by the outer contact portion; a second contact layer disposed on the mesa and contacting the second conductivity type semiconductor layer; a first insulation layer covering the first conductivity type semiconductor layer and the mesa, and insulating the first contact layer from the mesa and the second contact layer, wherein the first insulation layer exposes the first conductivity type semiconductor layer for the outer contact portion and the inner contact portion to contact the first conductivity type semiconductor layer, and wherein the outer contact portion and the first insulation layer alternately contact the first conductivity type semiconductor layer along a side surface of the mesa.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
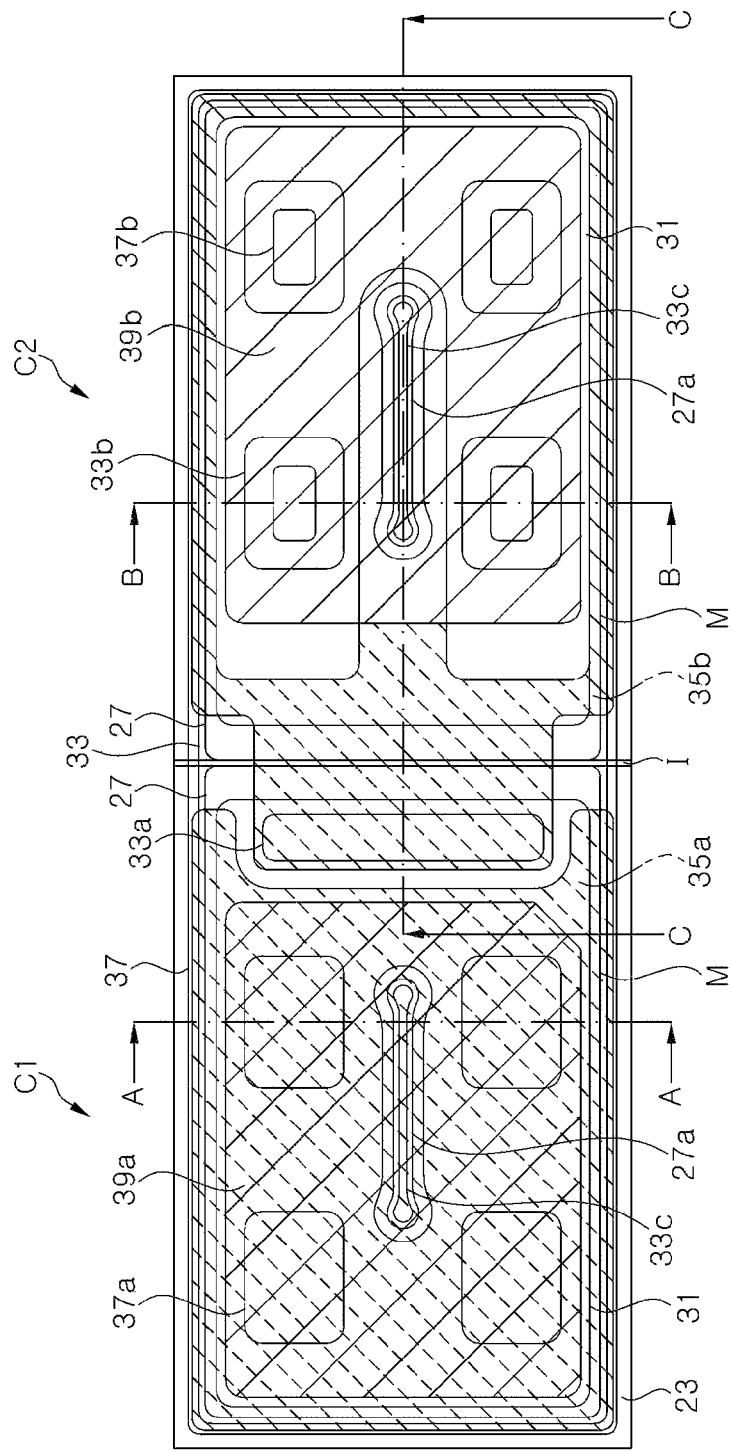
FIG. 1 is a schematic plan view illustrating a light emitting diode according to an exemplary embodiment of the present disclosure.

In the following description, for the purposes of explanation, numerous specific details are set forth in order to provide a thorough understanding of various exemplary embodiments or implementations of implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the scope of the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities is between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A light emitting diode in accordance with an exemplary embodiment comprises: a substrate; a first light emitting cell and a second light emitting cell disposed adjacent to each other on the substrate and each comprising an n-type semiconductor layer, a p-type semiconductor layer, and an active layer disposed between the n-type semiconductor layer and the p-type semiconductor layer; reflection structures disposed on the p-type semiconductor layers of the first light emitting cell and the second light emitting cell, respectively, and contacting the p-type semiconductor layers; a first contact layer in ohmic contact with the n-type semiconductor layer of the first light emitting cell; a second contact layer in ohmic contact with the n-type semiconductor layer of the second light emitting cell and connected to the reflection structure on the first light emitting cell; an n-electrode pad disposed over the first light emitting cell and electrically connected to the first contact layer; and a p-electrode pad disposed over the second light emitting cell and electrically connected to the reflection structure on the second light emitting cell, wherein the first light emitting cell and the second light emitting cell are isolated from each other by an isolation region exposing the substrate, wherein the n-type semiconductor layers of the first light emitting cell and the second light emitting cell comprise inner side surfaces facing each other and outer side surfaces exposed to outside, wherein the at least one outer side surface is inclined steeper than the inner sides.

Since the outer side surfaces of the n-type semiconductor layer is inclined steeper than the inner sides of the isolation region, a horizontal distance from a side of the substrate to an edge of an upper surface of the n-type semiconductor layer may be reduced. Therefore, an area of the upper surface of the n-type semiconductor layer may be increased, and thus a light emitting area can be increased.

Further, since the n-electrode pad and the p-electrode pad are disposed over the reflection structures, light emitted from the active layers to the n-electrode pad and the p-electrode pad can be reflected by the reflection structures and emitted through the substrate. Accordingly, a light emitting diode having a flip chip structure with high heat dissipation efficiency and high light extraction efficiency can be provided.

In some embodiments, each of the n-type semiconductor layers of the first and second light emitting cells may comprise one inner side surface and three outer side surfaces. Furthermore, the three outer side surfaces may be inclined steeper than the one inner side surface.

Further, three outer side surfaces of each of the n-type semiconductor layers of the first and second light emitting cell may be flush with the respective side surfaces of the substrate. For example, the outer side surfaces of the n-type semiconductor layers may be formed by scribing the n-type semiconductor layer together with the substrate, and thus may be formed together with the side surfaces of the substrate.

Each of the first light emitting cell and the second light emitting cell may be disposed on a partial region of the n-type semiconductor layer, and may comprise a mesa comprising the active layer and the p-type semiconductor layer. In addition, each of the first contact layer and the second contact layer may be in contact with the n-type semiconductor layer in a region between the outer side surfaces of the n-type semiconductor layer and the mesa along a periphery of the mesa. Since each of the first contact layer and the second contact layer contact the n-type semiconductor layer along the periphery of the mesa, current spreading capability in the n-type semiconductor layer is improved.

In addition, each of the mesas may have a through-hole exposing the n-type semiconductor layer through the p-type semiconductor layer and the active layer, and each of the first contact layer and the second contact layer may further contact the n-type semiconductor layer through the through-hole of the mesa. Therefore, the current spreading capability in the n-type semiconductor layer is further improved.

The through-holes have elongated shapes and may be disposed along a same line. In addition, the through-holes may pass through centers of the mesas, respectively. A single through-hole may be disposed in each mesa, and an elongated shape through-hole is disposed in a central region, which is advantageous for current spreading. In addition, compared with the case of forming a plurality of through-holes, a manufacturing process may be simplified and a process stability may be achieved.

The light emitting diode may further comprise a lower insulation layer covering the mesas and the reflection structures and disposed between the mesas and the first and second contact layers. The lower insulation layer may have a hole exposing the reflection structure on the first light emitting cell and the second contact layer may be connected to the reflection structure on the first light emitting cell through the hole.

In addition, the second contact layer may extend from the second light emitting cell to the first light emitting cell via an upper region of the isolation region. At this time, the second contact layer located in the upper region of the isolation region may be disposed within a width of the mesas.

Since the second contact layer is disposed within the width of the mesas, the second contact layer may be prevented from being short-circuited to the n-type semiconductor layer of the first light emitting cell.

Meanwhile, a portion of the first contact layer may overlap with the reflection structure on the first light emitting cell, and a portion of the second contact layer may overlap with the reflection structure on the second light emitting cell. In addition, each of the first and second contact layers may comprise a reflection metal layer, and thus a reflection efficiency for light emitted from the active layer may be increased.

Further, the lower insulation layer may comprise a distributed Bragg reflector. The lower insulation layer covers all of the edge regions and side surfaces of the mesas as well as upper regions of the reflection structures. Therefore, light emitted from the active layer may be reflected mostly by the reflection structure and the lower insulation layer, and thus a light output of the light emitting diode may be improved.

The hole of the lower insulation layer may have an elongated shape along the isolation region. The isolation region may be perpendicular to the same line along which the through-holes are disposed. Since the hole of the lower insulation layer has the elongated shape, the second contact layer may be connected to the reflection structure on the first light emitting cell in a relatively large area.

The light emitting diode may further comprise an upper insulation layer disposed between the first and second contact layers and the n-electrode and p-electrode pads. The upper insulation layer may have a first via-hole exposing the first contact layer and a second via-hole exposing the reflection structure on the second light emitting cell, the n-electrode pad may be connected to the first contact layer through the first via-hole, and the p-electrode pad may be connected to the reflection structure through the second via-hole.

In addition, each of the first light emitting cell and the second light emitting cell may comprise a mesa disposed on a partial region of the n-type semiconductor layer and comprising the active layer and the p-type semiconductor layer, wherein each of the first contact layer and the second contact layer may contact the n-type semiconductor layer along the periphery of the mesas in a region between an outer side surface of the n-type semiconductor layer and the mesa, and wherein the upper insulation layer may cover the first and second contact layers disposed between the outer side surfaces of the n-type semiconductor layers and the mesas, and may be connected to the n-type semiconductor layers between the outer side surfaces of the n-type semiconductor layers and the first and second contact layers.

In accordance with another embodiment of the present disclosure, a light emitting device may comprise the light emitting diode described above: and a wavelength conversion layer covering the substrate and side surfaces of the light emitting diode, and exposing the n-electrode pad and the p-electrode pad.

Further, the light emitting device may further comprise reflection sidewalls disposed on both side surfaces of the light emitting diode, respectively, and the wavelength conversion layer covering the side surfaces of the light emitting diode may be interposed between the sidewalls and the light emitting diode.

The reflection sidewall reflects light emitted from the light emitting diode and light converted by the wavelength conversion layer to increase luminous efficiency.

The reflection sidewalls may be disposed on longer side surfaces of the light emitting diode. These light emitting devices may be used as a side view light emitting device disposed near an edge of a light guide plate and emitting light to the light guide plate.

A light emitting diode in accordance with another embodiment of the present disclosure comprises: a first light emitting cell and a second light emitting cell each comprising an n-type semiconductor layer, a p-type semiconductor layer, and an active layer disposed between the n-type semiconductor layer and the p-type semiconductor layer, and having a first through-hole and a second through-hole passing through the active layers and the p-type semiconductor layers and exposing the n-type semiconductor layers, respectively; reflection structures having openings for exposing the first through-hole and the second through-hole and contacting the p-type semiconductor layers; a first contact layer in ohmic-contact with the n-type semiconductor layer on the first light emitting cell through the first through-hole; a second contact layer in ohmic-contact with the n-type semiconductor layer of the second light emitting cell through the second through-hole and connected to the reflection structure on the first light emitting cell; a resin layer covering the first and second contact layers over the first and second light emitting cells; an n-electrode pad electrically connected to the first contact layer through the resin layer, and protruding on the resin layer; and a p-electrode pad electrically connected to the reflection structure on the second light emitting cell through the resin layer and protruding on the resin layer, wherein the first light emitting cell and the second light emitting cell are isolated from each other by an isolation region.

In accordance with the present embodiment, two light emitting cells are connected to each other in series and integrated into one light emitting diode. Accordingly, it can be driven at a relatively high voltage, and light output may be increased. Furthermore, the n-electrode pad and the p-electrode pad are respectively disposed on the first and second light emitting cells using one resin layer. Accordingly, it is possible to simplify the processes related to manufacture and installation of light emitting diodes, compared to using separate light emitting diodes having both an n-electrode pad and a p-electrode pad. In addition, by using the resin layer, it is possible to directly mount the light emitting device on a printed circuit board or others as a chip-scale package without any separate packaging process such as formation of a housing, wire bonding, molding, and the like.

The n-electrode pad and the p-electrode pad may have a shape partially surrounding the first through-hole and the second through-hole in plan view, respectively. Concave portions may be formed in the resin layer formed on the first and second through-holes due to the first and second through-holes. In addition to this, by forming the n-electrode pad and the p-electrode pad to surround these concave portions, relatively deep concave portions are formed in a region surrounded by the n-electrode pad and the p-electrode pad. Accordingly, when the light emitting diode is mounted on a printed circuit board or others using a conductive adhesive such as solder, it is possible to prevent the solder or the like from being melted and overflowing to the outside in the reflow process.

In some exemplary embodiments, one n-electrode pad and one p-electrode pad may be disposed on the first and second light emitting cells to partially surround the first through-hole and the second through-hole, respectively. However, the present disclosure is not limited thereto, and the n-electrode pad and the p-electrode pad may comprise at least two portions partially surrounding the first through-hole and the second via-hole, respectively. That is, the electrode pad disposed on each light emitting cell may be divided into two or more portions as electrode pads of the same polarity.

In some exemplary embodiments, the first and second through-holes have a circular shape. However, the present disclosure is not limited thereto, and they may have an elongated shape.

Meanwhile, the n-type semiconductor layers of the first light emitting cell and the second light emitting cell comprise inner side surfaces facing each other and outer side surfaces exposed to the outside, and at least one of the outer side surfaces is inclined steeper than the inner side surface.

Since the outer side surface of the n-type semiconductor layer is inclined steeper than the inner side surface of the isolation region, a horizontal distance from a side of the substrate to an edge of an upper surface of the n-type semiconductor layer may be reduced. Therefore, an area of the upper surface of the n-type semiconductor layer may be increased, and thus a light emitting area may be increased.

Further, the inner side surfaces of the n-type semiconductor layers facing each other may have a stepped inclined surface. Therefore, a reliability of the second contact layer passing through the isolation region may be further improved.

Each of the first light emitting cell and the second light emitting cell may comprise a mesa disposed on a partial portion of the n-type semiconductor layer and comprising the active layer and the p-type semiconductor layer. In addition, each of the first contact layer and the second contact layer may additionally contact the n-type semiconductor layer in a region between the outer side surfaces of the n-type semiconductor layer and the mesa along a periphery of the mesa. Each of the first contact layer and the second contact layer contacts the n-type semiconductor layer along the periphery of the mesa, and thus current spreading capability in the n-type semiconductor layer is improved.

Meanwhile, the light emitting diode may further comprise a lower insulation layer covering the mesas and the reflection structures and disposed between the mesas and the first and second contact layers. The lower insulation layer may have a hole exposing the reflection structure on the first light emitting cell, and the second contact layer may be connected to the reflection structure on the first light emitting cell through the hole.

In addition, the second contact layer may extend from the second light emitting cell to the first light emitting cell via an upper region of the isolation region. At this time, the second contact layer disposed in the upper region of the isolation region may be disposed within a width of the mesas.

Since the second contact layer is disposed within the width of the mesas, it is possible to prevent the second contact layer from being short-circuited to the n-type semiconductor layer of the first light emitting cell.

Meanwhile, a portion of the first contact layer may overlap with the reflection structure on the first light emitting cell, and a portion of the second contact layer may overlap with the reflection structure on the second light emitting cell.

In some exemplary embodiments, the light emitting diode may comprise a third contact layer disposed limitedly on the second light emitting cell and electrically connected to the reflection structure on the second light emitting cell through the lower insulation layer, and the p-electrode pad may be electrically connected to the reflection structure on the second light emitting cell through the third contact layer. The n-electrode pad and the p-electrode pad may be disposed on the same level.

The first, second, and third contact layers may be formed of a same material by a same process. Further, the first, second, and third contact layers may comprise a reflection metal layer. Therefore, a reflection efficiency for light emitted from the active layer is increased.

In addition, the lower insulation layer may comprise a distributed Bragg reflector. The lower insulation layer covers all of edge regions and side surfaces of the mesas as well as upper regions of the reflection structures. Therefore, light emitted from the active layer may be reflected mostly by the reflection structure and the lower insulation layer, and thus a light output of the light emitting diode may be improved.

In addition, the resin layer may comprise a first via-hole filled with the n-electrode pad and a second via-hole filled with the p-electrode pad, and the first via-hole and the second via-hole may partially surround the first through-hole and the second through-hole in plan view, respectively. Accordingly, horizontal cross-sectional shapes of the n-electrode pad and the p-electrode pad may be the same as horizontal cross-sectional shapes of the first via-hole and the second via-hole. However, portions of the n-electrode pad and the p-electrode pad protruding on the resin layer may be larger than the first via-hole and the second via-hole, respectively.

The light emitting diode, in addition, may further comprise a substrate on which the first light emitting cell and the second light emitting cell are disposed, and the isolation region may expose an upper surface of the substrate. The substrate may be a growth substrate for growing the n-type semiconductor layers, the active layers, and the p-type semiconductor layers of the first light emitting cell and the second light emitting cell.

In accordance with another embodiment of the present disclosure, a light emitting module is provided. The light emitting module comprises a printed circuit board; a plurality of light emitting diodes mounted on the printed circuit board; and a spacer having a through-hole shaped cavity disposed on the printed circuit board and exposing the plurality of light emitting diodes, wherein the spacer comprises a light reflection material. Here, the plurality of light emitting diodes comprise the light emitting diodes described above.

In accordance with the present embodiment, it is possible to provide high light output by adopting the light emitting diode having technical characteristics described above. Further, by adopting the spacer of the light reflection material, luminous efficiency is improved while preventing the light emitting diode from being damaged by deformation of adjacent materials such as a light guide plate and the like.

Meanwhile, the spacer may have a plurality of cavities, and the plurality of light emitting diodes may be dispersed and disposed in the cavities. All the plurality of cavities don't need to have the same sizes.

In some exemplary embodiments, the spacer may be attached to the printed circuit board using an adhesive.

In some exemplary embodiments, the spacer may comprise a downwardly projecting protrusion, wherein the printed circuit board may comprise a concave portion corresponding to the protrusion, and wherein the protrusion may be inserted into the concave portion. Accordingly, the spacer may be firmly mounted on the printed circuit board.

A light emitting diode in accordance with another embodiment of the present disclosure, comprises: a first conductivity type semiconductor layer; a mesa comprising a second conductivity type semiconductor layer disposed on the first conductivity type semiconductor layer and an active layer interposed between the second conductivity type semiconductor layer and the first conductivity type semiconductor layer; a first contact layer comprising an outer contact portion contacting the first conductivity type semiconductor layer near an edge of the first conductivity type semiconductor layer along a periphery of the mesa and an inner contact portion contacting the first conductivity type semiconductor layer in a region surrounded by the outer contact portion; a second contact layer disposed on the mesa and contacting the second conductivity type semiconductor layer; a first insulation layer covering the first conductivity type semiconductor layer and the mesa, and insulating the first contact layer from the mesa and the second contact layer, wherein the first insulation layer exposes the first conductivity type semiconductor layer for the outer contact portion and the inner contact portion to contact the first conductivity type semiconductor layer, and wherein the outer contact portion and the first insulation layer alternately contact the first conductivity type semiconductor layer along a side surface of the mesa.

Since the first contact layer comprises the inner contact portion and the outer contact portion, the current spreading capability is excellent. In addition, since the outer contact portion does not continuously contact the first conductivity type semiconductor layer but alternately contacts the first conductivity type semiconductor layer with protruding portions of the first insulation layer, a contact area of the outer contact portion is reduced and thus light loss can be reduced.

An outer contact portion as described above may be applied also in a light emitting diode having a plurality of light emitting cells. For example, in a light emitting diode in which a first contact layer is formed near an edge of each light emitting cell, a first contact layer may not continuously contact a first conductivity type semiconductor layer, but the first contact layer and the first insulation layer may alternately contact the first conductivity type semiconductor layer along edges of the first conductivity type semiconductor layer.

Furthermore, the first insulation layer may comprise a distributed Bragg reflector. Therefore, light can be reflected at a high reflectance using the first insulation layer, and a light extraction efficiency is improved.

The first insulation layer may comprise a protrusion and a recess around the mesa. The first contact layer may contact the first conductivity type semiconductor layer at the recess of the first insulation layer.

Alternatively, the first contact layer may comprise a protrusion and a recess around the mesa, the protrusion of the first contact layer may contact the first conductivity type semiconductor layer, and the recess may be disposed on the insulation layer.

In some exemplary embodiments, the mesa may have fingers and an indent portion disposed between the fingers, and the inner contact portion may be disposed in the indent portion.

In other exemplary embodiments, the mesa may have a groove exposing the first conductivity type semiconductor layer through the second conductivity type semiconductor layer and the active layer, and the groove may be surrounded by the second conductivity type semiconductor layer and the active layer, and the inner contact portion may contact the first conductivity type semiconductor layer exposed in the groove.

The groove may have an H shape comprising two straight lines and a connection line connecting the straight lines, and may be disposed in a central region of the mesa.

Further, inner contact portions may be formed in the two straight lines in the H-shaped groove, and the first contact layer may be spaced apart from the first conductivity type semiconductor layer by the first insulation layer on the connection line in the H-shaped groove. In addition, at least one of end terminal portions of the groove may have a wider width than other portions of the straight line.

Meanwhile, a shortest distance between the inner contact portion and the outer contact portion may be the same at any point of the inner contact portion. By disposing the inner contact portion in the middle of the mesa, light may be emitted evenly across the entire area of the mesa.

In addition, a distance between the inner contact portions formed on the two straight lines may be the same as the shortest distance between the inner contact portion and the outer contact portion.

The light emitting diode may further comprise an upper insulation layer having a first opening overlapping the first contact layer and a second opening overlapping the second contact layer; a first electrode pad electrically connected to the first contact layer through the first opening; and a second electrode pad electrically connecting to the second contact layer through the second opening.

In addition, the light emitting diode may further comprise an intermediate connection portion connected to the second contact layer, wherein the first contact layer may have an opening overlapping the second contact layer, wherein the intermediate connection portion may be disposed in the opening of the first contact layer, wherein the second opening of the upper insulation layer may expose the intermediate connection, and wherein the second electrode pad may be connected to the intermediate connection portion. By disposing the intermediate connection portion, the first electrode pad and the second electrode pad may be formed at the same level and a manufacturing process of the light emitting diode may be further stabilized. The intermediate connection portion may be formed of the same material as the first contact layer in the same process.

Furthermore, the first insulation layer may have an opening exposing the second contact layer, and the intermediate connection portion may be connected to the second contact layer through the opening of the first insulation layer.

In some exemplary embodiments, the first insulation layer may have a plurality of openings exposing the second contact layer. In addition, the second opening of the upper insulation layer may expose all openings exposing the second contact layer.

The first insulation layer may be disposed on the first conductivity type semiconductor layer, around the second contact layer of the mesa, and on the second contact layer, and the first insulation layer disposed around the second contact layer may be thicker than the first insulation layer disposed on the second contact layer.

In addition, the first insulation layer disposed around the second contact layer of the mesa may be thicker than the first insulation layer disposed on the first conductivity type semiconductor layer.

In accordance with the present embodiments, unlike a prior art, light emission area reduction may be alleviated by forming outer side surfaces of an n-type semiconductor layer of a light emitting cell inclined relatively steeper than an isolation region, and thus it is possible to provide a light emitting diode having a low forward voltage and improved light output and a light emitting module having the light emitting diode.

Further, there is provided a light emitting diode of a flip chip structure having a plurality of light emitting cells by disposing a reflection structure on each light emitting cell and arranging an n-electrode pad and a p-electrode pad thereon.

Further, there are provided a light emitting diode of a flip chip structure having a plurality of light emitting cells by disposing a reflection structure on each light emitting cell and arranging an n-electrode pad and a p-electrode pad thereon, and a light emitting module having the same.

In addition, by arranging the n-electrode pad and the p-electrode pad using a resin layer, a chip scale package that does not require a separate packaging process may be provided.

In addition, a light emitting module having high luminous efficiency may be provided by using a spacer of a light reflection material.

In addition, an optical loss due to a first contact layer may be reduced by reducing a region in which the first contact layer contacts a first conductivity type semiconductor layer and increasing a region where a first insulation layer contacts the first conductivity type semiconductor layer, and more light may be reflected and a light extraction efficiency of the light emitting diode may be improved by using the first insulation layer comprising a distributed Bragg reflector having excellent reflection performance.

Figure 2:
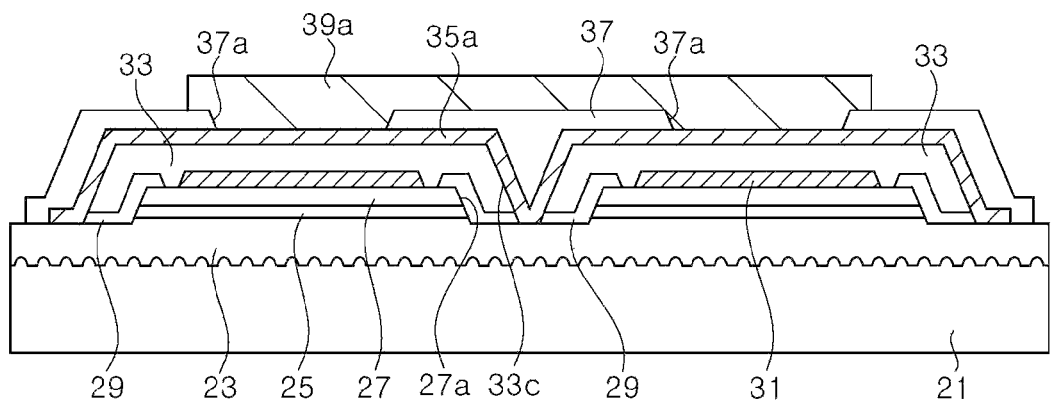
FIG. 2 is a schematic cross-sectional view taken along the line A-A in FIG. 1.
Figure 3:
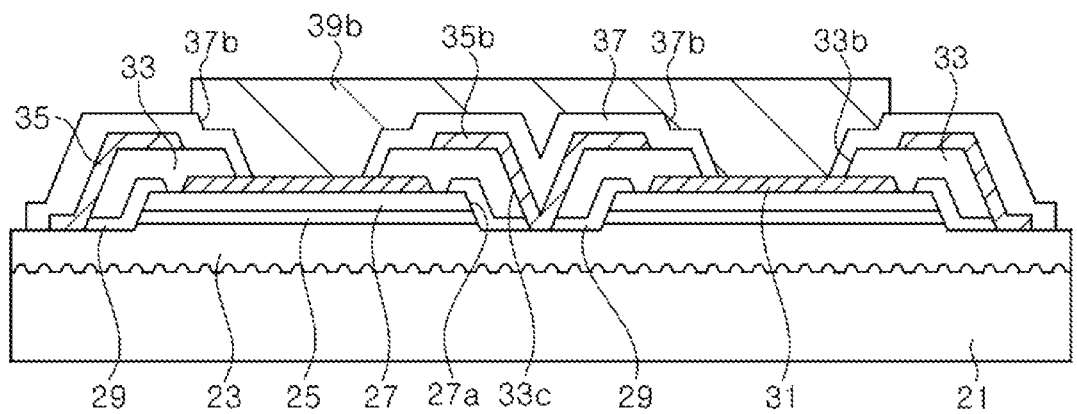
FIG. 3 is a schematic cross-sectional view taken along the line B-B of FIG. 1.
Figure 4:
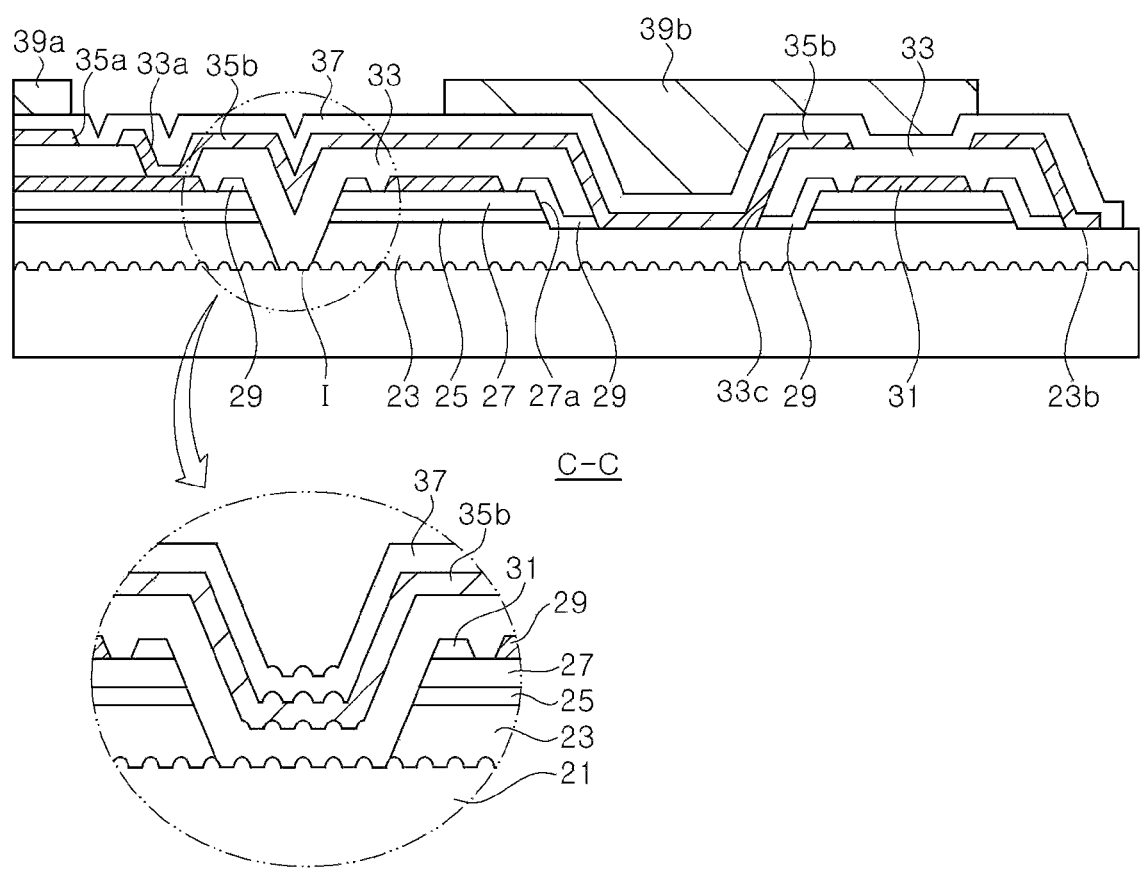
FIG. 4 is a schematic cross-sectional view taken along the line C-C of FIG. 1
Figure 5:
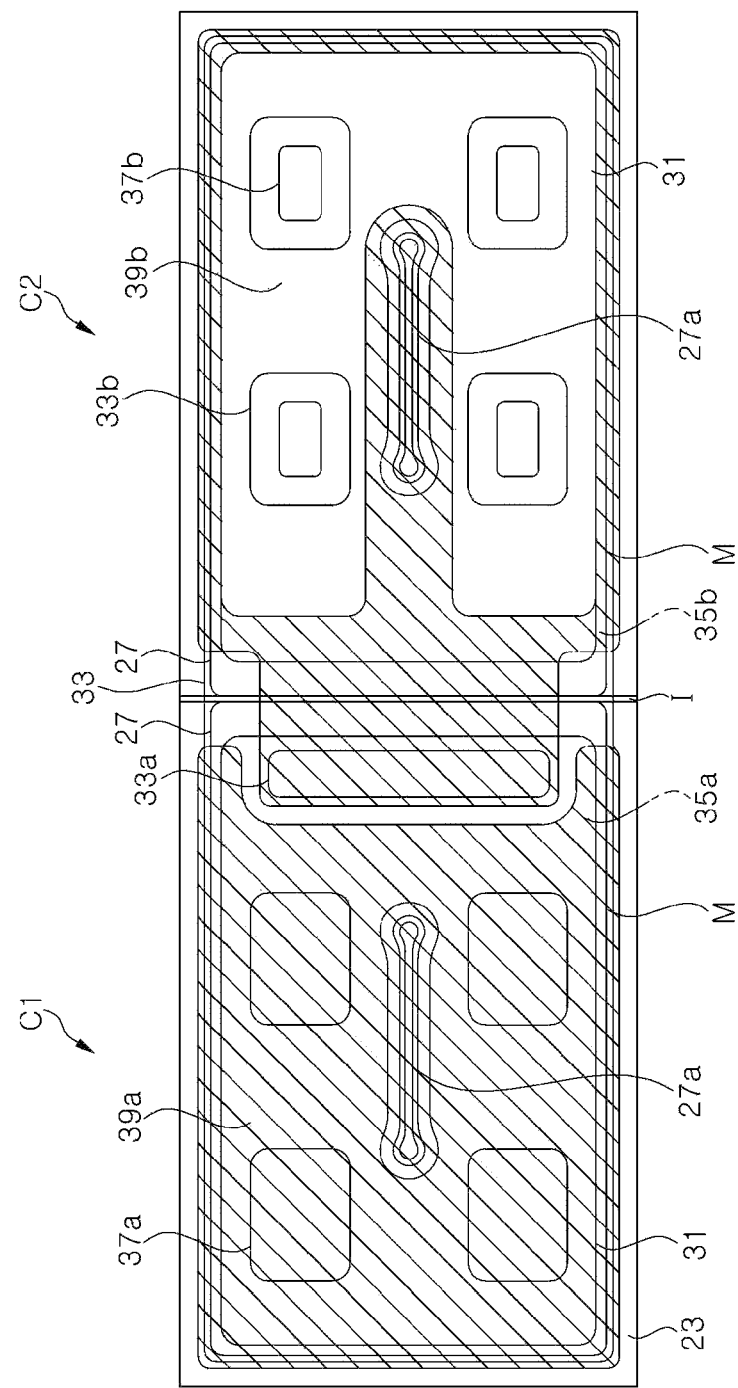
FIG. 5 is a schematic plan view in which a part of the configuration of FIG. 1 is omitted.

FIG. 1 is a schematic plan view illustrating a light emitting diode according to an exemplary embodiment of the present disclosure, FIGS. 2, 3 and 4 are schematic cross-sectional views taken along the lines A-A, B-B, and C-C in FIG. 1, respectively, and FIG. 5 is a schematic plan view in which a part of the light emitting diode according to the exemplary embodiment of the present disclosure is omitted.

Referring to FIGS. 1 to 4, the light emitting diode comprises a substrate 21, a first light emitting cell C1, a second light emitting cell C2, a reflection structure 31, first and second contact layers 35a and 35b, an n-electrode pad 39a, and a p-electrode pads 39b. The light emitting diode may also comprise a preliminary insulation layer 29, a lower insulation layer 33, and an upper insulation layer 37. Each of the first and second light emitting cells C1 and C2 comprises an n-type semiconductor layer 23, an active layer 25, and a p-type semiconductor layer 27.

The substrate 21 may be a growth substrate for growing a III-V nitride based semiconductor layer, for example, a sapphire substrate, and particularly a patterned sapphire substrate. The substrate 21 is preferably an insulating substrate, but is not limited to an insulating substrate. However, when light emitting cells disposed on the substrate 21 are connected to each other in series, the substrate 21 must be insulated from the light emitting cells. Therefore, the substrate 21 is insulative, or when the substrate 21 is conductive, an insulation material layer is formed between the light emitting cells C1 and C2 and the substrate 21 for the light emitting cells C1 and C2 to be insulated from the substrate 21. The substrate 21 may have a rectangular outer shape as shown in FIG. 1. A side surface of the substrate 21 may be formed by laser scribing and cracking using the laser scribing.

The first and second light emitting cells C1 and C2 are disposed on the substrate 21. The first and second light emitting cells C1 and C2 are separated from each other by an isolation region I exposing the substrate 21. Therefore, semiconductor layers of the first light emitting cell C1 and the second light emitting cell C2 are spaced apart from each other. Each of the first and second light emitting cells C1 and C2 are disposed facing each other and may have a square or rectangular shape, respectively. In particular, the first and second light emitting cells C1 and C2 may have elongated rectangular shapes in a direction facing each other.

Each of the first and second light emitting cells C1 and C2 comprises an n-type semiconductor layer 23, an active layer 25 and a p-type semiconductor layer 27. The n-type semiconductor layer 23, the active layer 25 and the p-type semiconductor layer 27 may be formed of III-V nitride semiconductors, for example, nitride semiconductors such as (Al, Ga, In)N. The n-type semiconductor layer 23, the active layer 25, and the p-type semiconductor layer 27 may be grown and formed on the substrate 21 in a chamber using a known method such as Metal Organic Chemical Vapor Deposition (MOCVD). In addition, the n-type semiconductor is layer 23 comprises n-type impurities (for example Si, Ge, and Sn), and the p-type semiconductor layer 27 comprises p-type impurities (for example, Mg, Sr, and Ba). For example, in one embodiment, the n-type semiconductor layer 23 may comprise GaN or AlGaN containing Si as a dopant, and the p-type semiconductor layer 27 may comprise GaN or AlGaN containing Mg as a dopant. Although each of the n-type semiconductor layer 23 and the p-type semiconductor layer 27 is shown as a single layer in the drawings, these layers may be multi-layered and may also comprise a superlattice layer. The active layer 25 may comprise a single quantum well structure or a multiple quantum well structure, and a composition ratio of the nitride-based semiconductor is adjusted so as to emit a desired wavelength. For example, the active layer 25 may emit blue light or ultraviolet light.

The isolation region I separates the light emitting cells C1 and C2 from each other. The substrate 21 is exposed to the isolation region I through semiconductor layers. The isolation region I is formed using photolithography and etching processes, at this time, the photoresist pattern is reflowed using a high-temperature baking process to form a photoresist pattern having a gentle slope, and thus relatively gently sloped side surfaces may be formed in the isolation region I by etching the semiconductor layers using the photoresist pattern as a mask.

The light emitting cells C1 and C2 face each other with the isolation region I interposed therebetween. Side surfaces of the light emitting cells C1 and C2 facing each other are defined as inner side surfaces. In the meantime, side surfaces of the light emitting cells other than the inner side surfaces are defined as outer side surfaces. Therefore, the n-type semiconductor layers 23 in the first and second light emitting cells C1 and C2 also comprise inner and outer sides surfaces, respectively.

For example, the n-type semiconductor layer 23 may comprise one inner side surface and three outer side surfaces. As shown in FIG. 4, the outer side surfaces of the n-type semiconductor layer 23 may be inclined steeper than the inner side surface. In the present embodiment, all of the outer side surfaces of the n-type semiconductor layer 23 are described as being inclined steeper than the inner side surface, however, the present disclosure is not limited thereto, but includes that at least one outer side surface is inclined steeper than the inner side surface. In addition, only the outer side surfaces of both sides perpendicular to the isolation region I may be relatively inclined steeper, and the outer side surface parallel to the isolation region may be inclined as gently as the isolation region I.

Further, the relatively inclined steeper outer side surfaces may be flush with side surfaces of the substrate 21. For example, the outer side surfaces of the n-type semiconductor layers 23 may be formed by scribing the n-type semiconductor layer 23 together with the substrate 21, and thus may be formed together with the side surfaces of the substrate 21.

A mesa M is disposed on each of n-type semiconductor layers 23. The mesa M may be located on an inner region of a region surrounded by the side surfaces of the n-type semiconductor layer 23, and thus regions near edges adjacent to the outer side surfaces of the n-type semiconductor layer 23 are not covered by the mesa M, but are exposed to the outside. However, a side surface of the mesa M and a side surface of the n-type semiconductor layer 23 on a sidewall of the isolation region I may be continuous with each other.

The mesa M comprises a p-type semiconductor layer 27 and an active layer 25. The active layer 25 is interposed between the n-type semiconductor layer 23 and the p-type semiconductor layer 27. Although an inner side surface of the mesa M is shown as being inclined in the same manner as outer side surfaces, the present disclosure is not limited thereto, but the inner side surface of the mesa M may be more gentle than the outer side surfaces. Accordingly, a stability of a second contact layer 35b described later may be improved.

The mesa M may have a through-hole 27a passing through the p-type semiconductor layer 27 and the active layer 25. A plurality of through-holes may be formed in the mesa M, but the single through-hole 27a may be formed as shown in FIG. 1. In this case, the through-hole 27a may have an elongated shape passing through a center of the mesa M. In particular, through-holes 27a in the first light emitting cell C1 and the second light emitting cell C2 may be arranged on the same line. The lines on which the through-holes 27a are disposed may be orthogonal to the isolation region I.

Reflection structures 31 are disposed on the p-type semiconductor layers 27 of the first and second light emitting cells C1 and C2, respectively. The reflection structures 31 contact the p-type semiconductor layers 27. The reflection structure 31 may be disposed substantially over the entire area of the mesa M in an upper region of the mesa M. For example, the reflection structure 31 may cover more than 80%, further more than 90% of the upper region of the mesa M.

The reflection structure 31 may comprise a metal layer having reflectivity and thus may reflect light generated in the active layer 25 and traveling to the reflection structure 31, toward the substrate 21. For example, the metal layer having reflectivity may comprise Ag or Al. In addition, a Ni layer may be formed between the metal layer having reflectivity and the p-type semiconductor layer 27 so as to help the reflection structure 31 to be in ohmic-contact with the p-type semiconductor layer 27. Alternatively, the reflection structure 31 may comprise a transparent oxide layer such as ITO (indium tin oxide) or ZnO.

In the meantime, a preliminary insulation layer 29 may cover the mesa M in a periphery of the reflection structure 31. The preliminary insulation layer 29 may be formed of $SiO_2$ using a chemical vapor deposition technique, for example, and may cover a side of the mesa M and may further cover a partial region of the n-type semiconductor layer 23. The preliminary insulation layer 29 may be removed at sides of the isolation region I as shown in FIG. 4.

The lower insulation layer 33 covers the mesas M and covers the reflection structures 31 and the preliminary insulation layer 29. The lower insulation layer 33, in addition, covers the isolation region I and sidewalls of the mesa M and covers a portion of the n-type semiconductor layer 23 in a periphery of the mesa M. As shown in the enlarged cross-sectional view of FIG. 4, the lower insulation layer 33 may be formed along a shape of protrusions on the substrate 21 in the isolation region I when the substrate 21 is a patterned sapphire substrate.

The lower insulation layer 33 is disposed between the first and second contact layers 35a and 35b and the first and second light emitting cells C1 and C2, and provides a passage for the first and second contact layers 35a and 35b to be connected to the n-type semiconductor layer 23 or the reflection structure 31. For example, the lower insulation layer 33 has a hole 33a exposing the reflection structure 31 on the first light emitting cell C1, a hole 33b exposing the reflection structure 31 on the second light emitting cell C2 and an opening 33c exposing the n-type semiconductor layer 23 in the through-hole 27a. In addition, the lower insulation layer 33 covers the periphery of the mesa M, but exposes regions near edges of the n-type semiconductor layer 23.

As shown in FIG. 1, the hole 33a may have an elongated shape in a direction perpendicular to a longitudinal direction of the through hole 27a, for example, in parallel to the isolation region I, and is disposed closer to the isolation region I than the through-hole 27a. Therefore, current may be injected into the reflection structure 31 on the first light emitting cell C1 in a wider area. Although the single hole 33a is described as exposing the reflection structure 31 on the first light emitting cell C1 in the present embodiment, a plurality of holes 33a may be provided.

In the meantime, the hole 33b is disposed on the second light emitting cell C2 and a plurality of holes may be provided as shown in FIG. 1. Although four holes 33b are shown in the present embodiment, the present disclosure is not limited thereto, but fewer or more holes 33b may be disposed. However, centers of the holes 33b are located farther from the isolation region I than a center of the mesa M. Accordingly, current concentration near the isolation region I may be prevented and spread the current to a wide region of the first light emitting cell C2.

The opening 33c exposes the n-type semiconductor layer 23 in the through-hole 27a and provides a passage for the first contact layer 35a and the second contact layer 35b to be connected to the n-type semiconductor layer 23.

The lower insulation layer 33 may be formed of an insulating material such as $SiO_2$ or $Si_3N_4$, and may be formed as a single layer or multiple layers. Further, the lower insulation layer 33 may comprise a distributed Bragg reflector formed by repeatedly stacking material layers having different refractive indices, for example, $SiO_2/TiO_2$. When the lower insulation layer 33 comprises the distributed Bragg reflector, light incident on a region other than the reflection structure 31 may be reflected and light extraction efficiency may be further improved.

The first contact layer 35a is disposed on the first light emitting cell C and is in ohmic-contact with the n-type semiconductor layer 23. The first contact layer 35a may be in ohmic-contact with the n-type semiconductor layer 23 in a region between an outer side surface of the n-type semiconductor layer 23 and the mesa M along the periphery of the mesa M, as well illustrated in the FIG. 5. In addition, the first contact layer 35a may be in ohmic-contact with the n-type semiconductor layer 23 exposed by the opening 33c of the lower insulation layer 33 in the through-hole 27a of the mesa M. Further, the first contact layer 35a may cover the upper region and sides of the mesa M except for a partial region around the hole 33a.

The second contact layer 35b is in ohmic-contact with the n-type semiconductor layer 23 of the second light emitting cell C2 and connected to the reflection structure 31 of the first light emitting cell C1. Therefore, the second contact layer 35b electrically connects the p-type semiconductor layer 27 of the first light emitting cell C1 and the n-type semiconductor layer 23 of the second light emitting cell C2.

The second contact layer 35b may be in ohmic-contact with the n-type semiconductor layer 23 in the region between the outer side surface of the n-type semiconductor layer 23 and the mesa M along the periphery of the mesa M. In addition, the second contact layer 35b may be in ohmic-contact with the n-type semiconductor layer 23 exposed by the opening 33c of the lower insulation layer 33 in the through-hole 27a of the mesa M. Further, the second contact layer 35b is connected to the reflection structure 31 exposed in the hole 33a. To do this, the second contact layer 35b extends from the second light emitting cell C2 to the first light emitting cell C1 passing through the upper portion of the isolation region I. At this time, the second contact layer 35b passing through the upper portion of the isolation region I is within a width of the mesa M, as shown in FIG. 1. Therefore, the second contact layer 35b may be prevented from being short-circuited to the n-type semiconductor layer 23 of the first light emitting cell C1. In addition, since the second contact layer 35b passes through the isolation region I inclined relatively gently, a process stability is improved. The second contact layer 35b is disposed on the lower insulation layer 33 on the isolation region I and may be formed to have irregularities according to a shape of the lower insulation layer 33.

The first and second contact layers 35a and 35b may comprise a highly reflective metal layer such as an Al layer and the highly reflective metal layer may be formed on an adhesive layer such as Ti, Cr, Ni, or others. In addition, a protective layer of a single layer or a multilayer structure of Ni, Cr, Au, or others may be formed on the highly reflective metal layer. The first and second contact layers 35a and 35b may have a multilayer structure of Cr/Al/Ni/Ti/Ni/Ti/Au/Ti, for example.

An upper insulation layer 37 is disposed on the first contact layer 35a and the second contact layer 35b, and has an opening 37a exposing the first contact layer 35a and an opening 37b exposing the reflection structure 31. The opening 37b may be disposed in the hole 33b of the lower insulation layer 33. The upper insulation layer 37 also covers the first and second contact layers 35a and 35b connected to the n-type semiconductor layer 23 in the periphery of the mesa M. As well illustrated in FIGS. 2 to 4, a region between the first and second contact layers 35a and 35b and an edge of the n-type semiconductor layer 23 is covered with the upper insulation layer 37. Therefore, the first and second contact layers 35a and 35b may be protected from an external environment such as moisture or others by the upper insulation layer 37. The upper insulation layer 37 may also cover the second contact layer 35b on the isolation region I, and may be formed to have irregularities according to the shape of the second contact layer 35b.

The upper insulation layer 37 may be formed of a single layer of $SiO_2$ or $Si_3N_4$, but it is not limited thereto. For example, the upper insulation layer 37 may have a multiple layer structure comprising a silicon nitride layer and a silicon oxide layer, or may be a distributed Bragg reflector where a silicon oxide layer and a titanium oxide layer are alternately laminated.

An n-electrode pad 39a is electrically connected to the first contact layer 35a through the opening 37a of the upper insulation layer 37, and a p-electrode pad 39b is electrically connected to the reflection structure 31 through the opening 37b. The n-electrode pad 39a and the p-electrode pad 39b may be disposed within the upper region of the mesa M, respectively.

Figure 6:
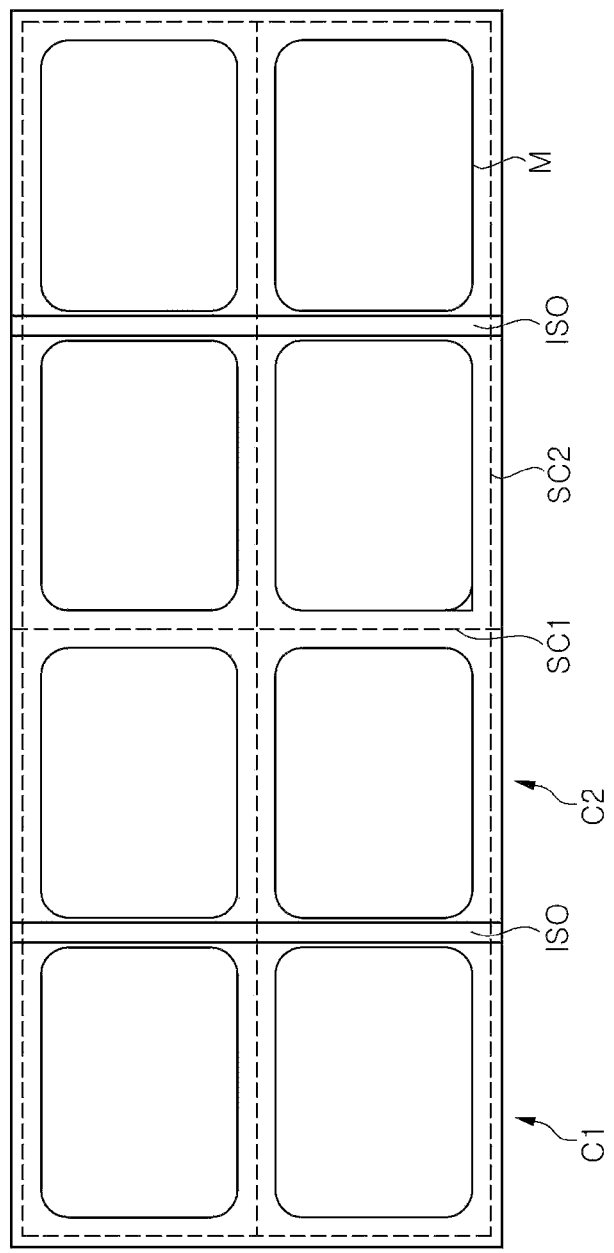
FIG. 6 is a schematic plan view illustrating a method of manufacturing a light emitting diode according to an embodiment of the present disclosure.

FIG. 6 is a schematic plan view illustrating a method of manufacturing a light emitting diode according to an embodiment of the present disclosure.

Referring to FIG. 6, a plurality of light emitting diodes are generally manufactured on one substrate 21. Here, four light emitting diode regions are illustrated, and each light emitting diode region comprises a first light emitting cell region C1 and a second light emitting cell region C2.

First, an n-type semiconductor layer 23, an active layer 25, and a p-type semiconductor layer 27 are grown on a substrate 21. These semiconductor layers 23, 25, 27 are grown as continuous layers on the substrate 21.

Next, mesas M are formed by patterning the p-type semiconductor layer 27 and the active layer 25. The mesas M are formed on the respective light emitting cell regions C1 and C2. The mesas M may be formed using photolithography and etching processes.

Thereafter, a preliminary insulation layer 29, which is not shown, is formed to cover the mesas M, and then the preliminary insulation layer 29 on a region for forming a reflection structure 31 is etched by using a photoresist pattern. Then, the reflection structure 31 is formed by the lift-off technique using the same photoresist pattern.

Next, an isolation region (isolation region, ISO) is formed. The isolation region is formed between the mesas M in each light emitting diode region and the first light emitting cell C1 and the second light emitting cell C2 are separated by the isolation region ISO. The isolation region ISO is formed by etching the n-type semiconductor layer 23 to expose an upper surface of the substrate 21 using a photolithography and etching technique using a photoresist pattern. At this time, side surfaces of the isolation region ISO may be formed to have a gentle slope by reflowing the photoresist.

As shown in FIG. 6, the isolation region ISO may be formed within each light emitting diode region between the mesas M. However, the isolation region ISO may not be formed in a region for dividing the light emitting diodes.

Then, after the lower insulation layer 33, the first and second contact layers 35a and 35b, the upper insulation layer 37, the n-electrode pad 39a, and the p-electrode pad 39b are sequentially formed, scribing lines SC1 and SC2 are formed using a laser scribing process. The laser scribing lines SC1 and SC2 are for dividing the light emitting diodes into individual units, and the dividing positions are defined by the scribing, and the n-type semiconductor layer 23 is divided into individual light emitting diode units. Subsequently, the substrate 21 may be divided by cracking after the scribing process.

According to the present embodiment, since the isolation region ISO is formed between the first and second light emitting cells C1 and C2 in the light emitting diode, inner side surfaces of the n-type semiconductor layers 23 disposed at positions where the first light emitting cell C1 faces the second light emitting cell C2 are formed to have a relatively gentle slope. On the contrary, since the outer side surfaces of the n-type semiconductor layers 23 are formed by laser scribing and cracking, they have a relatively steep slope, and further the outer side surfaces of the n-type semiconductor layers 23 may be flush with sides of the substrate 21.

Figure 7A:
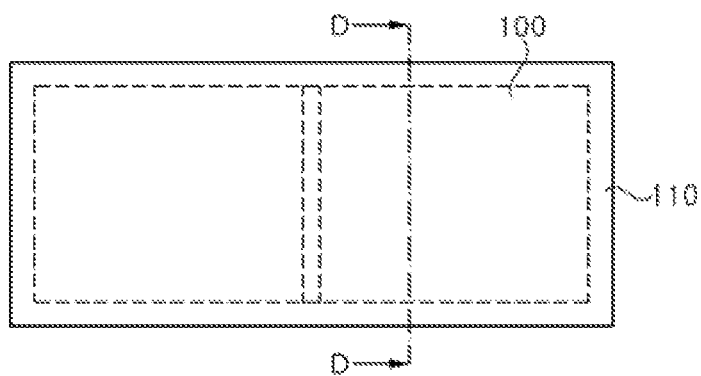
FIG. 7A and FIG. 7B are schematic plan views and are cross-sectional views illustrating a light emitting device comprising a light emitting diode according to an embodiment of the present disclosure.
Figure 7B:
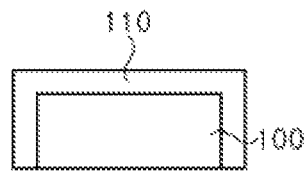

FIG. 7A is a schematic plan view and FIG. 7B is a cross-sectional view illustrating a light emitting device comprising a light emitting diode according to an embodiment is of the present disclosure, Where FIG. 7B is a cross-sectional view taken along the line D-D in FIG. 7A.

Referring to FIG. 7A and 7B, the light emitting device comprises a light emitting diode 100 and a wavelength conversion layer 110. The light emitting diode 100 is the same as the light emitting diode described above with reference to FIGS. 1 to 5, and thus detailed descriptions thereof will be omitted.

In the meantime, the wavelength conversion layer 110 covers sides and an upper surface, and exposes a lower surface of the light emitting diode 100. The light emitting diode 100 has a substrate 21 on the upper surface side, and has an n-electrode pad 39a and a p-electrode pad 39b on the lower surface side. The substrate 21 is covered with the wavelength conversion layer 110, and the n- and p-electrode pads 39a and 39b are exposed to the outside of the wavelength conversion layer 110. Accordingly, the light emitting device may be mounted on a printed circuit board or others by using the n and p-electrode pads 39a and 39b.

The light emitting device according to the present embodiment differs from packages manufactured by using a conventional lead frame or a printed circuit board. That is, the light emitting device does not require a separate housing because the n and p-electrode pads 39a and 39b formed on the light emitting diode chip function as lead terminals.

Figure 8A:
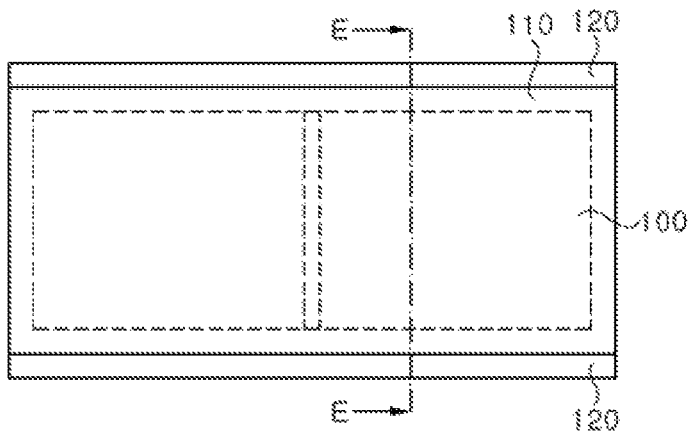
FIG. 8A and FIG. 8B are schematic plan views and are cross-sectional views illustrating a light emitting device according to another embodiment of the present disclosure.
Figure 8B:
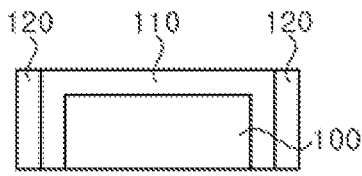

FIG. 8A is a schematic plan view and FIG. 8B is a cross-sectional view illustrating a light emitting device according to another embodiment of the present disclosure, where FIG. 8B is a cross-sectional view taken along the line E-E in FIG. 8A.

Referring to FIG. 8A and FIG. 8B, the light emitting device according to the present embodiment is substantially similar to the light emitting device described with reference to FIG. 7A and FIG. 7B, but differs in that reflection sidewalls 120 are disposed along both sides of the light emitting diode 100.

The reflection sidewalls 120 are disposed along long sides of the light emitting diode 100 and may be omitted on short sides of the light emitting diode 100. Meanwhile, a wavelength conversion layer 110 is disposed between the reflection sidewalls 120 and the light emitting diode 100. The reflection sidewalls 120 may be formed by a LED reflector such as PA9T and thus may be easily formed using a molding process.

Accordingly, light emitted from the light emitting diode 100 is wavelength-converted on the wavelength conversion layer 110, reflected by the reflection sidewalls 120, and emitted toward an upper surface of the light emitting diode 100. In addition, a portion of the light emitted from the light emitting diode 100 is also emitted toward short side surfaces of the light emitting diode 100.

The light emitting device may be used as a side view light emitting device, for example. That is, the light emitting device may be disposed on a side surface of a light guide plate to emit light toward the side surface of the light guide plate, and may be used as a backlight light source, for example.

The light emitting diode and the light emitting device described above can be applied to various applications such as a lighting apparatus, a backlight light source, or a headlight.

Figure 9:
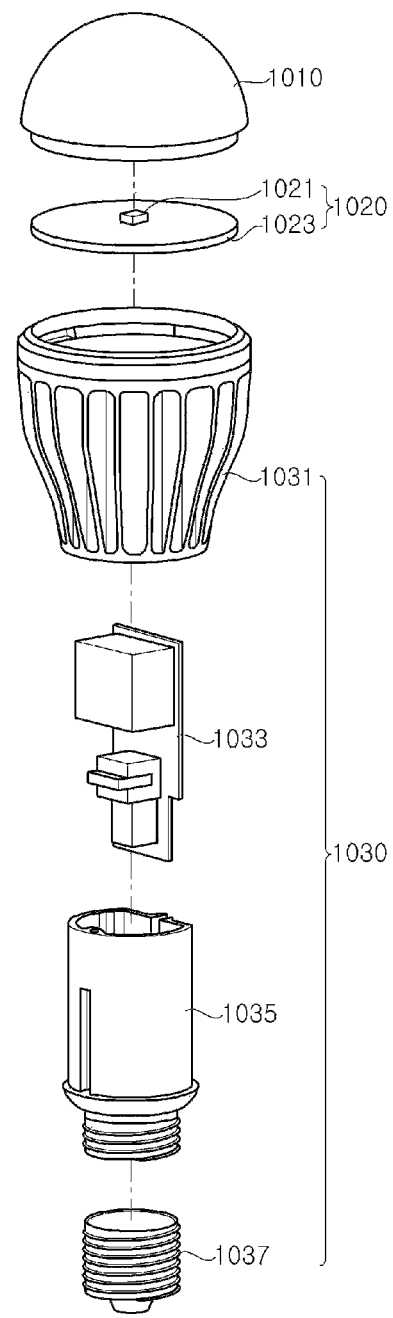
FIG. 9 is an exploded perspective view illustrating a lighting apparatus to which a light emitting diode according to an exemplary embodiment of the present disclosure is applied.

FIG. 9 is an exploded perspective view illustrating a lighting apparatus to which a light emitting diode according to an exemplary embodiment of the present disclosure is applied.

Referring to FIG. 9, the lighting apparatus according to this exemplary embodiment includes a diffusive cover 1010, a light emitting diode module 1020, and a body 1030. The body 1030 may receive the light emitting diode module 1020 and the diffusive cover 1010 may be disposed on the body 1030 to cover an upper surface of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033, and the power supply case 1035 having the power supply 1033 secured therein may be disposed within the body case 1031. The power source connection 1037 is disposed at a lower end of the power supply case 1035 and is coupled thereto. Accordingly, the power source connection 1037 is electrically connected to the power supply 1033 within the power supply case 1035 and can serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light transmitting material and light orientation of the lighting apparatus may be adjusted through regulation of the shape and optical transmissivity of the diffusive cover 1010. Thus, the diffusive cover 1010 may be modified to have various shapes depending on usage and applications of the lighting apparatus.

Figure 10:
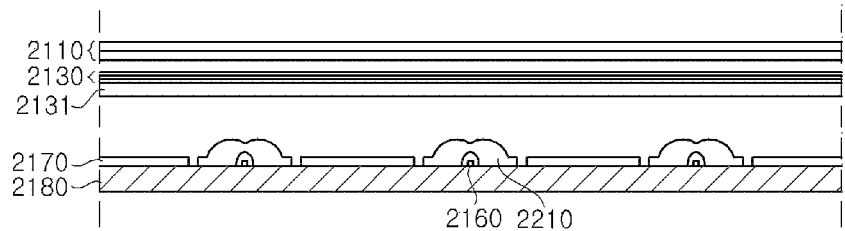
FIG. 10 is a cross-sectional view illustrating a display apparatus to which a light emitting diode according to another exemplary embodiment of the present disclosure is applied.

FIG. 10 is a cross-sectional view illustrating a display apparatus to which a light emitting diode according to another exemplary embodiment of the present disclosure is applied.

The display apparatus according to this exemplary embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the periphery of the display panel 2110 to supply driving signals to a gate line. Here, the gate driving PCBs may be formed on a thin film transistor substrate instead of being formed on separate PCBs.

The backlight unit includes a light source module which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper surface thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. Alternatively, when a reflective material is coated on a surface thereof, the substrate may be disposed on the reflective sheet 2170. Further, a plurality of substrates may be arranged parallel to one another, without being limited thereto. However, it should be understood that the backlight unit includes a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 may be disposed on each of the light emitting diodes 2160 to improve uniformity of light emitted from the plurality of light emitting diodes 2160.

The diffusive plate 2131 and the optical sheets 2130 are disposed above the light emitting diode 2160. Light emitted from the light emitting diodes 2160 may be supplied in the form of sheet light to the display panel 2110 through the diffusive plate 2131 and the optical sheets 2130.

In this way, the light emitting diodes according to the exemplary embodiments may be applied to direct type displays like the display apparatus according to this exemplary embodiment.

Figure 11:
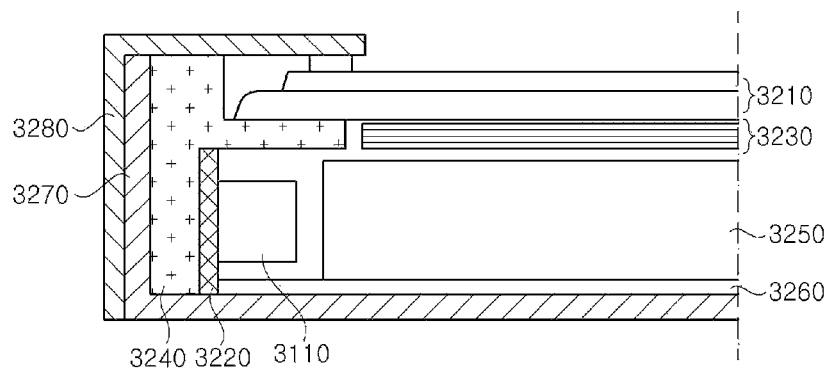
FIG. 11 is a cross-sectional view illustrating a display apparatus to which a light emitting diode according to another exemplary embodiment of the present disclosure is applied.

FIG. 11 is a cross-sectional view illustrating a display apparatus to which a light emitting diode according to another exemplary embodiment of the present disclosure is applied.

The display apparatus according to this exemplary embodiment includes a display panel 3210 on which an image is displayed, and a backlight unit disposed at a rear side of the display panel 3210 and emitting light thereto. Further, the display apparatus includes a frame 240 supporting the display panel 3210 and receiving the backlight unit, and covers 3240, 3280 surrounding the display panel 3210.

The display panel 3210 is not particularly limited and may be, for example, a liquid crystal panel including a liquid crystal layer. A gate driving PCB may be further disposed at the periphery of the display panel 3210 to supply driving signals to a gate line. Here, the gate driving PCB may be formed on a thin film transistor substrate instead of being formed on a separate PCB. The display panel 3210 is secured by the covers 3240, 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper surface thereof, a light source module disposed at one side inside the lower cover 3270, and a light guide plate 3250 disposed parallel to the light source module and converting spot light into sheet light. In addition, the backlight unit according to this exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the exemplary embodiments may be applied to edge type displays like the display apparatus according to this exemplary embodiment.

Figure 12:
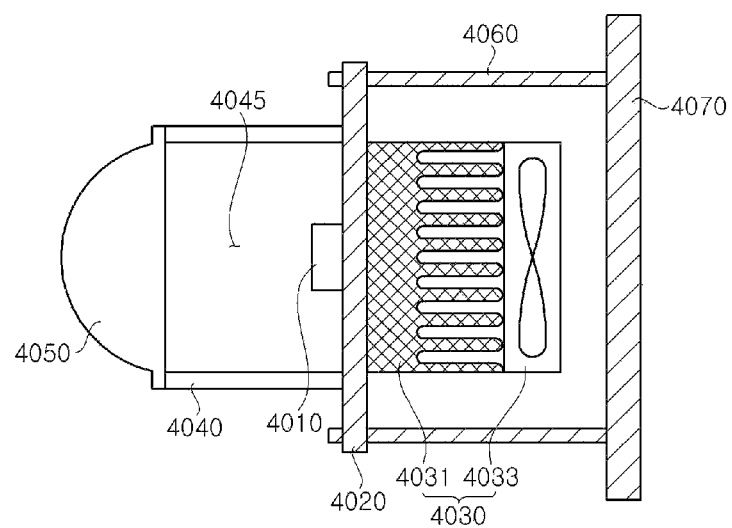
FIG. 12 is a cross-sectional view illustrating an example in which a light emitting diode according to another embodiment of the present disclosure is applied to a headlight.

FIG. 12 is a cross-sectional view illustrating an example in which a light emitting diode according to another embodiment of the present disclosure is applied to a headlight.

Referring to FIG. 12, the headlight according to this exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and is disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be separated from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus can act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033 to dissipate heat generated upon operation of the light emitting diode 4010.

In this way, the light emitting diodes according to the exemplary embodiments may be applied to headlights like the headlight according to this exemplary embodiment, particularly, vehicular headlights.

Figure 13:
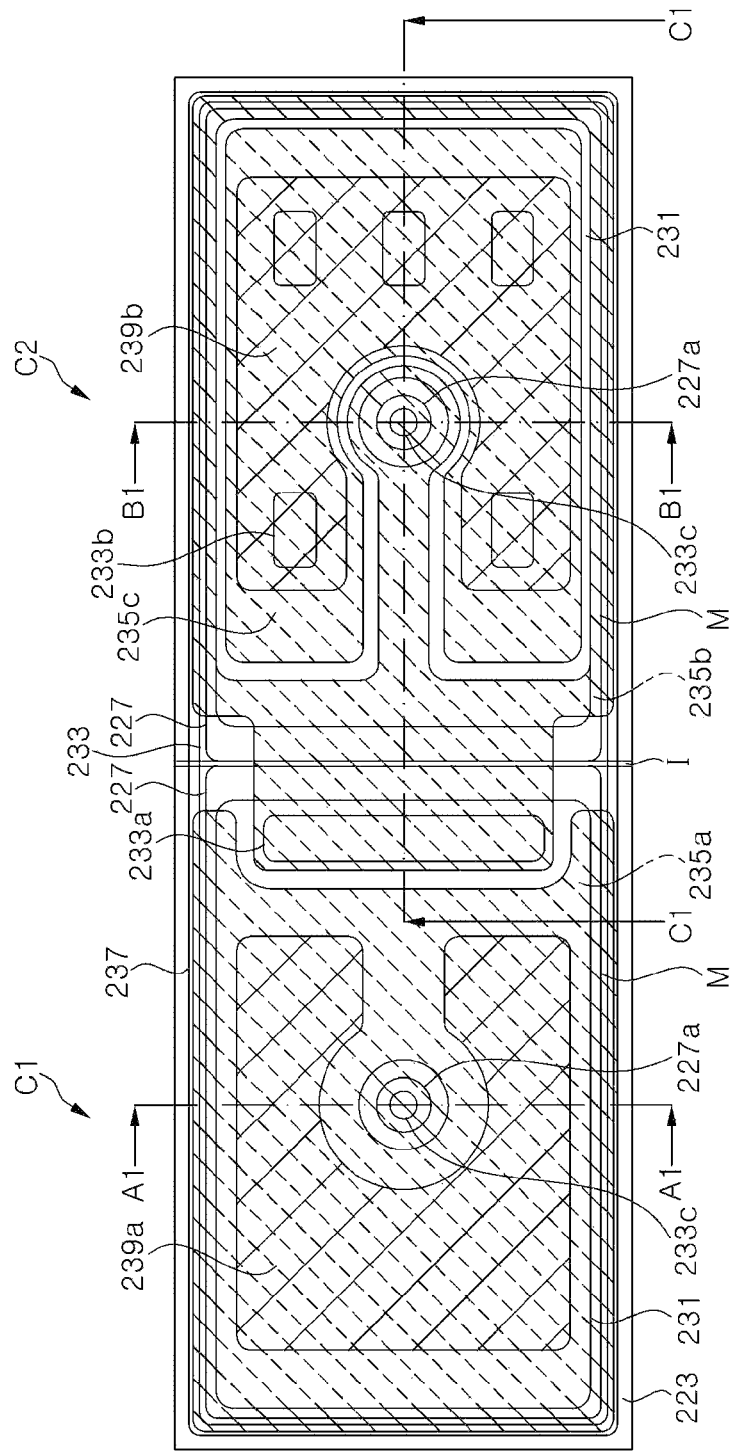
FIG. 13 is a schematic plan view illustrating a light emitting diode according to another embodiment of the present disclosure.
Figure 14:
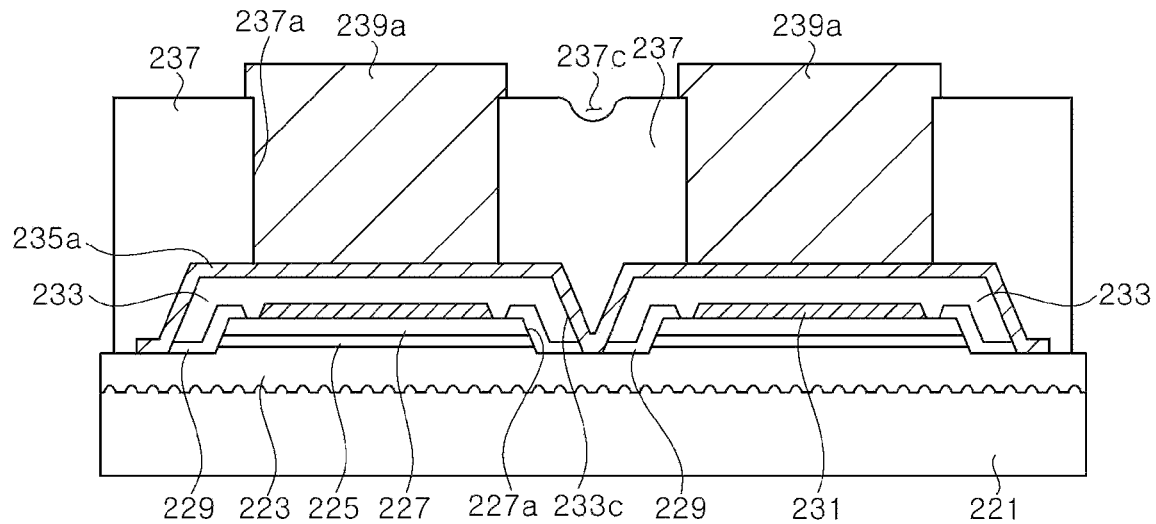
FIG. 14 is a schematic cross-sectional view taken along the line A1-A1 of FIG. 13.
Figure 15:
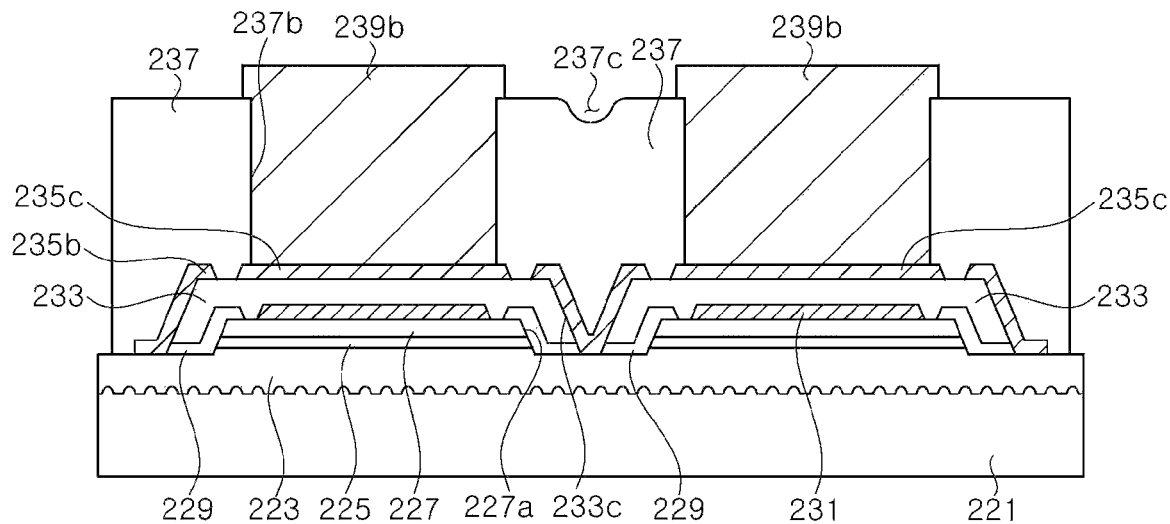
FIG. 15 is a schematic cross-sectional view taken along the line B1-B1 of FIG. 13.
Figure 16:
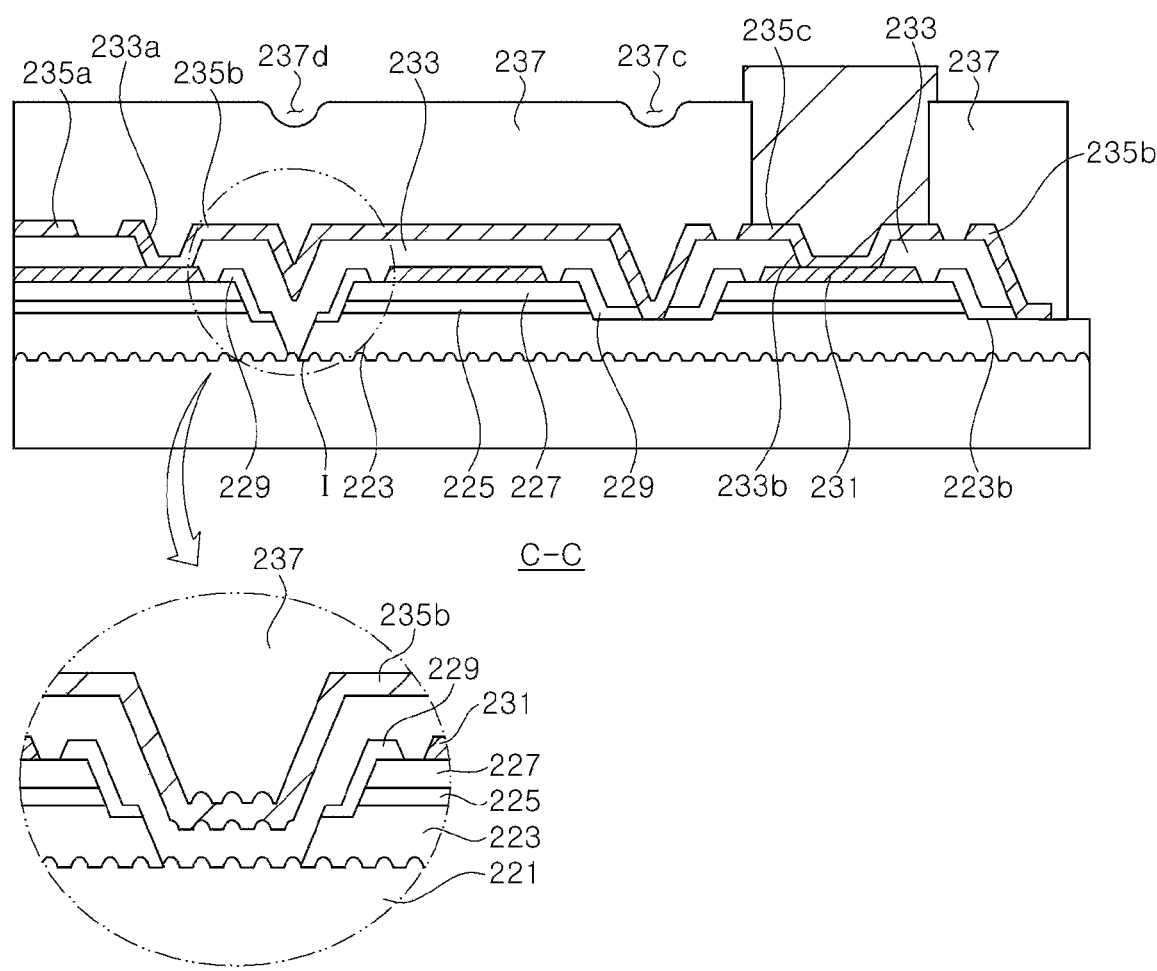
FIG. 16 is a schematic cross-sectional view taken along the line C1-C1 in FIG. 13.

FIG. 13 is a schematic plan view illustrating a light emitting diode according to another embodiment of the present disclosure, and FIGS. 14, 15 and 16 are cross-sectional views taken along the line A1-A1, B1-B1 and C1-C1 of the FIG. 13, respectively.

Referring to FIGS. 13 to 16, the light emitting diode comprises a substrate 221, a first light emitting cell C1, a second light emitting cell C2, a reflection structure 231, a first, second, and third contact layers 235a, 235b, and 235c, an n-pad electrode 239a and a p-pad electrode 239b. The light emitting diode may also comprise a preliminary insulation layer 229, a lower insulation layer 233, and a resin layer 237. Each of the first and second light emitting cells C1 and C2 comprises an n-type semiconductor layer 223, an active layer 225, and a p-type semiconductor layer 227.

The substrate 221 is a growth substrate for growing a III-V nitride based semiconductor layer, which is the same as the substrate 21 described with reference to FIGS. 1 to 4, and thus a detailed descriptions thereof will be omitted in order to avoid redundancy. In addition, the substrate 221 may be removed from the light emitting cells C1 and C2 using techniques such as laser lift-off, chemical lift-off, grinding, or others.

The first and second light emitting cells C1 and C2 are disposed on the substrate 221. The first and second light emitting cells C1 and C2 are separated from each other by an isolation region I exposing the substrate 221. Here, the isolation region I is a region for separating the light emitting cells C1 and C2 from each other, and is distinguished from a scribing or dicing region for dividing the substrate 221. The semiconductor layers of the first light emitting cell C1 and the second light emitting cell C2 are spaced apart from each other by the isolation region I. Each of the first and second light emitting cells C1 and C2 are disposed facing each other and may have a square or rectangular shape, respectively. In particular, the first and second light emitting cells C1 and C2 may have elongated rectangular shapes in a direction facing each other.

Each of the first and second light emitting cells C1 and C2 comprises the n-type semiconductor layer 223, the active layer 225 and the p-type semiconductor layer 227. Since the n-type semiconductor layer 223, the active layer 225 and the p-type semiconductor layer 227 are the same as the n-type semiconductor layer 23, the active layer 25 and the p-type semiconductor layer 27 described with reference to FIGS. 1 to 4, the detailed descriptions thereof will be omitted in order to avoid redundancy.

The isolation region I separates the light emitting cells C1 and C2 from each is other. The substrate 221 is exposed to the isolation region I through semiconductor layers. The isolation region I is formed using photolithography and etching processes, at this time, photoresist is reflowed using a high-temperature baking process to form a photoresist pattern having a gentle slope, and thus relatively gently sloped side surfaces may be formed in the isolation region I by etching the semiconductor layers using the photoresist pattern as a mask. Further, as shown in FIG. 16, a stepped inclined surface may be formed in the isolation region I. After the mesa formation process to expose the n-type semiconductor layer 223 is performed first, the stepped inclined surface may be formed in the isolation region I by forming the isolation region exposing the substrate 221.

The light emitting cells C1 and C2 face each other with the isolation region I interposed therebetween. Since inner side surfaces and outer side surfaces of the light emitting cells C1 and C2 are the same as those described with reference to FIGS. 1 to 4, detailed descriptions will be omitted in order to avoid duplication.

A mesa M is disposed on each of n-type semiconductor layers 223. The mesa M may be located on an inner region of a region surrounded by the side surfaces of the n-type semiconductor layer 223, and thus regions near edges adjacent to the outer side surfaces of the n-type semiconductor layer 223 is not covered by the mesa M, but is exposed to the outside. In addition, a side surface of the mesa M and a side surface of the n-type semiconductor layer 223 on a sidewall of the isolation region I may be discontinuous with each other, and thus the stepped inclined surface described above may be formed.

The mesa M comprises a p-type semiconductor layer 227 and an active layer 225. The active layer 225 is interposed between the n-type semiconductor layer 223 and the p-type semiconductor layer 227. Although an inner side surface of the mesa M is shown as being inclined in the same manner as outer side surfaces, the present disclosure is not limited thereto, but the inner side surface of the mesa M may be more gentle than the outer side surfaces. Accordingly, a stability of a second contact layer 235b described later may be improved.

The mesa M may have a through-hole 227a passing through the p-type semiconductor layer 227 and the active layer 225. A plurality of through-holes may be formed in the mesa M, or the single through-hole 227a may be formed as shown in FIG. 13. In this case, the through-hole 227a may have a circular shape near a center of the mesa M, but the present disclosure is not limited thereto. and may have an elongated shape passing through the center of the mesa M, as shown in FIG. 1.

Reflection structures 231 are disposed on the p-type semiconductor layers 227 of the first and second light emitting cells C1 and C2, respectively. The reflection structures 231 contact the p-type semiconductor layers 227. The reflection structure 231 has an opening exposing the through-hole 227a and may be disposed substantially over the entire area of the mesa M. For example, the reflection structure 231 may cover more than 80%, further more than 90% of an upper region of the mesa M.

The reflection structure 231 may comprise a metal layer having reflectivity, or a transparent oxide layer such as ITO (indium tin oxide) or ZnO as described with reference to FIGS. 1 to 4.

In the meantime, a preliminary insulation layer 229 may cover the mesa M in a periphery of the reflection structure 231. The preliminary insulation layer 229 may be formed of $SiO_2$ using a chemical vapor deposition technique, for example, and may cover a side of the mesa M and may further cover a partial region of the n-type semiconductor layer 223. As shown in FIG. 16, the preliminary insulation layer 229 may be removed from a lower inclined surface but remain on an upper inclined surface and the stepped surface at the stepped inclined surface of the isolation region I.

The lower insulation layer 233 covers the mesas M and covers the reflection structures 231 and the preliminary insulation layer 229. The lower insulation layer 233, in addition, covers the isolation region I and sidewalls of the mesa M, and covers a portion of the n-type semiconductor layer 223 in a periphery of the mesa M. As shown in the enlarged cross-sectional view of FIG. 16, the lower insulation layer 233 may be formed along a shape of protrusions on the substrate 221 in the isolation region I when the substrate 221 is a patterned sapphire substrate.

The lower insulation layer 233 is disposed between the first, second, and third contact layers 235a, 235b, and 235c and the first and second light emitting cells C1 and C2, and provides a passage for the first, second, and contact layers 235a, 235b, and 235c to be connected to the n-type semiconductor layer 223 or the reflection structure 231. For example, the lower insulation layer 233 has a hole 233a exposing the reflection structure 231 on the first light emitting cell C1, a hole 233b exposing the reflection structure 231 on the second light emitting cell C2 and an opening 233c exposing the n-type semiconductor layer 223 in the through-hole 227a. In addition, the lower insulation layer 233 covers the periphery of the mesa M, but exposes regions near edges of the n-type semiconductor layer 223.

As shown in FIG. 13, the hole 233a may have an elongated shape in parallel to the isolation region I, and is disposed closer to the isolation region I than the through-hole 227a. Therefore, current may be injected into the reflection structure 231 on the first light emitting cell C1 in a wider area. Although the single hole 233a is described as exposing the reflection structure 231 on the first light emitting cell C1 in the present embodiment, a plurality of holes 233a may be provided.

In the meantime, the hole 233b is disposed on the second light emitting cell C2 and a plurality of holes may be provided as shown in FIG. 13. Although five holes 233b are shown in the present embodiment, the present disclosure is not limited thereto, but fewer or more holes 233b may be disposed. The center of all of the holes 233b are located farther from the isolation region I than a center of the mesa M. Accordingly, current concentration near the isolation region I may be prevented and spread the current to a wide region of the second light emitting cell C2.

The opening 233c exposes the n-type semiconductor layer 223 in the through-hole 227a and provides a passage for the first contact layer 235a and the second contact layer 235b to be connected to the n-type semiconductor layer 223.

The lower insulation layer 233 may be formed of an insulating material such as $SiO_2$ or $Si_3N_4$, and may be formed as a single layer or multiple layers. Further, the lower insulation layer 233 may comprise a distributed Bragg reflector formed by repeatedly stacking material layers having different refractive indices, for example, $SiO_2/TiO_2$. When the lower insulation layer 233 comprises the distributed Bragg reflector, light incident on a region other than the reflection structure 231 may be reflected and light extraction efficiency may be further improved.

The first contact layer 235a is disposed on the first light emitting cell C1 and is in ohmic-contact with the n-type semiconductor layer 223. The first contact layer 235a may be in ohmic-contact with the n-type semiconductor layer 223 in a region between an outer side surface of the n-type semiconductor layer 223 and the mesa M along the periphery of the mesa M. In addition, the first contact layer 235a may be in ohmic-contact with the n-type semiconductor layer 223 exposed by the opening 233c of the lower insulation layer 233 in the through-hole 227a of the mesa M. Further, the first contact layer 235a may cover the upper region and sides of the mesa M except for a partial region around the hole 233a.

The second contact layer 235b is in ohmic-contact with the n-type semiconductor layer 223 of the second light emitting cell C2 and connected to the reflection structure 231 of the first light emitting cell C1. Therefore, the second contact layer 235b electrically connects the p-type semiconductor layer 227 of the first light emitting cell C1 and the n-type semiconductor layer 223 of the second light emitting cell C2.

The second contact layer 235b may be in ohmic-contact with the n-type semiconductor layer 223 in the region between the outer side surface of the n-type semiconductor layer 223 and the mesa M along the periphery of the mesa M. In addition, the second contact layer 235b may be in ohmic-contact with the n-type semiconductor layer 223 exposed by the opening 233c of the lower insulation layer 233 in the through-hole 227a of the mesa M. Further, the second contact layer 235b is connected to the reflection structure 231 exposed in the hole 233a. To do this, the second contact layer 235b extends from the second light emitting cell C2 to the first light emitting cell C1 crossing over the isolation region I. At this time, the second contact layer 235b crossing over the isolation region I is within a width of the mesa M, as shown in FIG. 13. Therefore, the second contact layer 235b may be prevented from being short-circuited to the n-type semiconductor layer 223 of the first light emitting cell C1. In addition, since the second contact layer 235b passes over the isolation region I inclined relatively gently and stepped, a process stability is improved. The second contact layer 235b is disposed on the lower insulation layer 233 on the isolation region I and may be formed to have irregularities according to a shape of the lower insulation layer 233.

The third contact layer 235c is disposed on the lower insulation layer 233 on the second light emitting cell C2. The third contact layer 235c is connected to the reflection structure 231 through the holes 233b of the lower insulation layer 233 and electrically connected to the p-type semiconductor layer 227 through the reflection structure 231. The third contact layer 235c may be disposed in a region surrounded by the second contact layer 235b and may have a shape partially surrounding the second through-hole 227a. The third contact layer 235c is located at the same level as the first and second contact layers 235a and 235b and helps the resin layer 237 and the n- and p-electrode pads 239a and 239b to form easily thereon. The third contact layer 235c may be omitted.

The first, second, and third contact layers 235a, 235b, and 235c may be formed by the same process using the same material. The first, second, and third contact layers 235a, 235b, and 235c may comprise a highly reflective metal layer such as an Al layer and the highly reflective metal layer may be formed on an adhesive layer such as Ti, Cr, Ni, or others. In addition, a protective layer of a single layer or a multi-layer structure of Ni, Cr, Au, or others may be formed on the highly reflective metal layer. The first, second, and third contact layers 235a, 235b, and 235c may have a multilayer structure of Cr/Al/Ni/Ti/Ni/Ti/Au/Ti, for example.

The resin layer 237 is disposed on the first contact layer 235a and the second contact layer 235b, and comprises a first via-hole 237a exposing the first contact layer 235a and a second via-hole 237b exposing the third contact layer 235c. The first and second via-holes 237a and 237b are formed in a shape partially surrounding the first through-hole 227a and the second through-hole 227b in plan view. When the third contact layer 235c is omitted, the lower insulation layer 233 and the holes 233b of the lower insulation layer (233) are exposed through the second via-hole 237b.

The resin layer 237 may have concave portions 237c on the first through-hole 227a and the second through-hole 227b. The concave portions 237c may be formed corresponding to the first through-hole 227a and the second through-hole 227a.

The resin layer 237 also covers the first and second contact layers 235a and 235b connected to the n-type semiconductor layer 223 in the periphery of the mesa M. As well illustrated in FIGS. 14 to 16, a region between the first and second contact layers 235a and 235b and an edge of the n-type semiconductor layer 223 is covered with the resin layer 237. Therefore, the first and second contact layers 235a and 235b may be protected from an external environment such as moisture or others by the resin layer 237. The resin layer 237 may also cover the second contact layer 235b on the isolation region I, and may be formed to have a concave portion 237d according to the shape of the second contact layer 235b.

The resin layer 237 may be formed of a photosensitive resin such as a photoresist, and may be formed by using a technique such as spin coating, for example. Meanwhile, the first and second via-holes 237a and 237b may be formed by photolithography and development processes.

The n-electrode pad 239a fills the first via-hole 237a of the resin layer 237 and is electrically connected to the first contact layer 235a. In addition, the p-electrode pad fills the second via-hole 237b and is electrically connected to the third contact layer 235c. When the third contact layer 235c is omitted, the p-electrode pad 239b may be directly connected to the reflection structure 231. The n-electrode pad 239a and the p-electrode pad 239b may partially surround the first through-hole 227a and the second through-hole 227b, respectively, in plan view as well illustrated in FIG. 13. Accordingly, the n-electrode pad 239a and the p-electrode pad 239b partially surround the concave portions 237c. The n-electrode pad 239a and the p-electrode pad 239b may surround ½ or more, and further ⅔ or more of the circumferences of the first through-hole 227a and the second through-hole 227b. The n-electrode pad 239a and the p-electrode pad 239b may protrude over the resin layer 237. Accordingly, in a case where a deep groove is formed on the first and second through-holes 227a and 227b, and the light emitting diode with the groove is bonded using a conductive adhesive such as solder, the solder can be trapped and thus it is possible to prevent the solder from overflowing to the outside. The n-electrode pad 239a and the p-electrode pad 239b may be disposed within the upper region of the mesa M, respectively.

Figure 17:
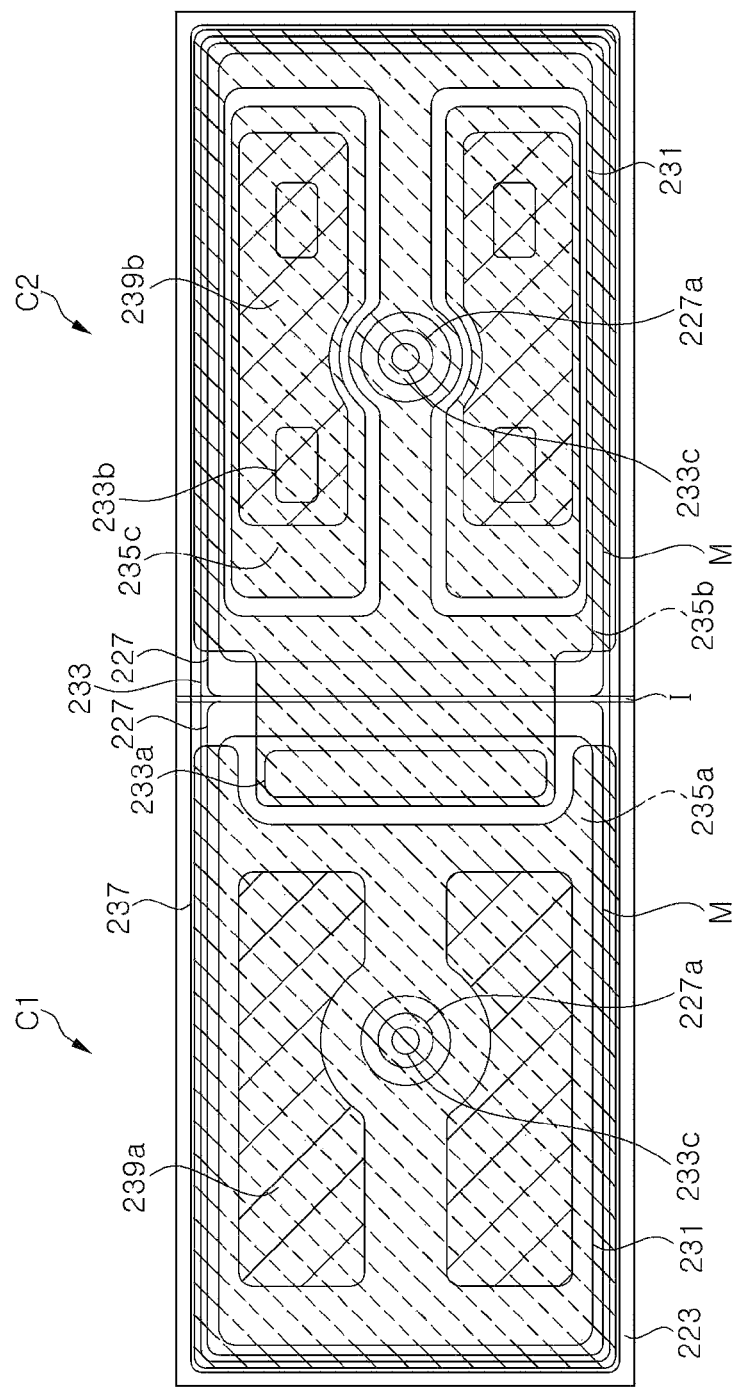
FIG. 17 is a schematic plan view illustrating a light emitting diode according to another embodiment of the present disclosure.

FIG. 17 is a schematic plan view illustrating a light emitting diode according to another embodiment of the present disclosure.

Referring to FIG. 17, the light emitting diode according to the present embodiment is substantially similar to the light emitting diode described with reference to FIG. 13, but there is a difference in that an n-electrode pad 239a and a p-electrode pad 239b are divided into a plurality of portions. That is, in the embodiments described above, each of the n-electrode pad 239a and the p-electrode pad 239b is formed as one, and they are disposed on the first light emitting cell C1 and the second light emitting cell C2, respectively. In contrast, in the present embodiment, the n-electrode pad 239a is divided into two portions and disposed on the first light emitting cell C1, and the p-electrode pad 239a is also divided into two portions and disposed on the second light emitting cell C2.

The respective portions of the n-electrode pad 239a and the p-electrode pad 239b partially surround a first through-hole 227a and a second through-hole 227b in plan view.

The electrode pads 239a and 239b may be divided into a larger number of portions. The conductive adhesive such as solder and the like can fill a region between concave portions 237c and the respective portions of the electrode pads 239a and 239b, and thus it is prevented from overflowing to the outside beyond a region of the electrode pads.

Figure 18:
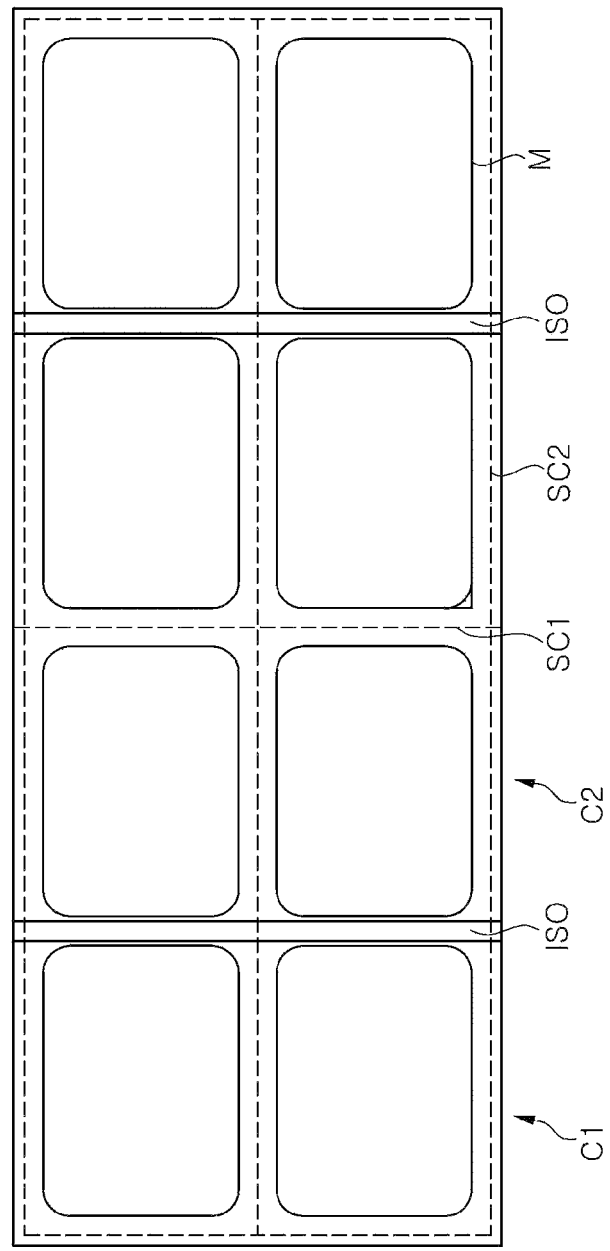
FIG. 18 is a schematic plan view illustrating a method of manufacturing a light emitting diode according to another embodiment of the present disclosure.

FIG. 18 is a schematic plan view illustrating a method of manufacturing a light emitting diode according to another embodiment of the present disclosure.

Referring to FIG. 18, a plurality of light emitting diodes are generally manufactured on one substrate 221. Here, four light emitting diode regions are illustrated, and each light emitting diode region comprises a first light emitting cell region C1 and a second light emitting cell region C2.

First, an n-type semiconductor layer 223, an active layer 225 and a p-type semiconductor layer 227 are grown on the substrate 221. These semiconductor layers 223, 225, and 227 are grown as continuous layers on the substrate 221.

Next, mesas M are formed by patterning the p-type semiconductor layer 227 and the active layer 225. The mesas M are formed on the respective light emitting cell regions C1 and C2. The mesas M may be formed using photolithography and etching processes.

Thereafter, a preliminary insulation layer 229, which is not shown, is formed to cover the mesas M, and then the preliminary insulation layer 229 on a region for forming a reflection structure 231 is etched by using a photoresist pattern. Then, the reflection structure 231 is formed by the lift-off technique using the same photoresist pattern.

Next, an isolation region (isolation region, ISO) is formed. The isolation region is formed between the mesas M in each light emitting diode region and the first light emitting cell C1 and the second light emitting cell C2 are separated by the isolation region ISO. The isolation region ISO is formed by etching the n-type semiconductor layer 223 to expose an upper surface of the substrate 221 using a photolithography and etching technique using a photoresist pattern. At this time, side surfaces of the isolation region ISO may be formed to have a gentle slope by reflowing photoresist. In addition, a mesa formation process and an isolation region (ISO) formation process are combined and a stepped inclined surface on side surfaces where the first light emitting cell C1 faces the second light emitting cell C2.

In the meantime, as shown in FIG. 18, the isolation region ISO may be formed within each light emitting diode region between the mesas M. That is, the isolation region ISO is not formed in a region for dividing the light emitting diodes through scribing.

Then, after the lower insulation layer 233, the first, second, and third contact layers 235a, 235b, and 235c, a resin layer 237, an n-electrode pad 239a, and a p-pad electrode 239b are sequentially formed, scribing lines SC1 and SC2 are formed using a laser scribing process. The n-electrode pad 239a and the p-electrode pad 239b may be formed to fill a first and second via-holes 237a and 237b in the resin layer 237 using a technique such as electrolytic plating or electroless plating. At this time, the first and third contact layers 235a and 235c may be used as a seed layer, and these contact layers are electrically connected to each other for electrolytic plating, and then separated from each other by laser scribing. The laser scribing lines SC1 and SC2 are for dividing the light emitting diodes into individual units, and the dividing positions are defined by the scribing, and the n-type semiconductor layer 223 is divided into individual light emitting diode units. Subsequently, the substrate 221 may be divided by cracking after the scribing process.

According to the present embodiment, since the isolation region ISO is formed between the first and second light emitting cells C1 and C2 in the light emitting diode, inner side surfaces of the n-type semiconductor layers 223 disposed at positions where the first light emitting cell C1 faces the second light emitting cell C2 are formed to have a relatively gentle slope. On the contrary, since the outer side surfaces of the n-type semiconductor layers 223 are formed by laser scribing and cracking, they have a relatively steep slope, and further the outer side surfaces of the n-type semiconductor layers 223 may be flush with sides of the substrate 221.

Figure 19A:
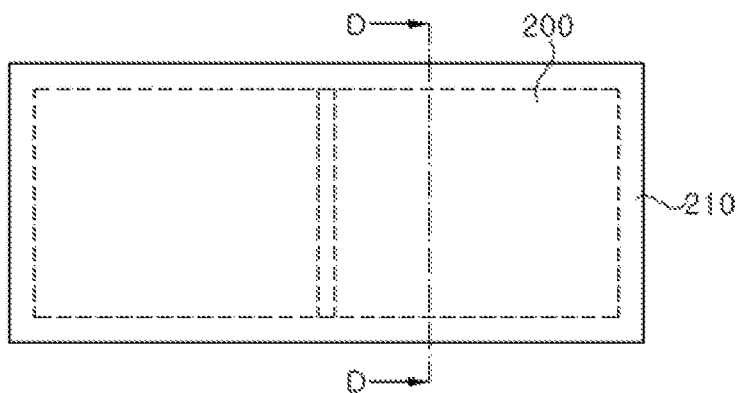
FIG. 19A and FIG. 19B are schematic plan views and are cross-sectional views illustrating a light emitting device comprising a light emitting diode according to another embodiment of the present disclosure.
Figure 19B:
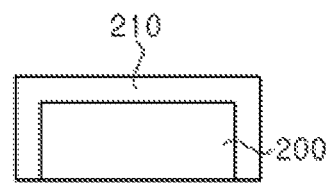

FIG. 19A is a schematic plan view and FIG. 19B is a cross-sectional view illustrating a light emitting device comprising a light emitting diode according to an embodiment of the present disclosure, where FIG. 19B is a cross-sectional view taken along the line D-D in FIG. 19A.

Referring to FIG. 19A and FIG. 19B, the light emitting device comprises a light emitting diode 200 and a wavelength conversion layer 210. The light emitting diode 200 is the same as the light emitting diode described above with reference to FIGS. 13 to 16 or FIG. 17, and thus detailed descriptions thereof will be omitted.

In the meantime, the wavelength conversion layer 210 covers sides and an upper surface, and exposes a lower surface of the light emitting diode 200. The light emitting diode 200 has a substrate 221 on the upper surface side, and has an n-electrode pad 239a and a p-electrode pad 239b on the lower surface side. The substrate 221 is covered with the wavelength conversion layer 210, and the n- and p-electrode pads 239a and 239b are exposed to the outside of the wavelength conversion layer 210. Accordingly, the light emitting device may be mounted on a printed circuit board or others by using the n and p-electrode pads 239a and 239b.

The light emitting device according to the present embodiment differs from packages manufactured by using a conventional lead frame or a printed circuit board. That is, the light emitting device does not require a separate housing because the n and p-electrode pads 239a and 239b formed on the light emitting diode chip function as lead terminals.

Figure 20A:
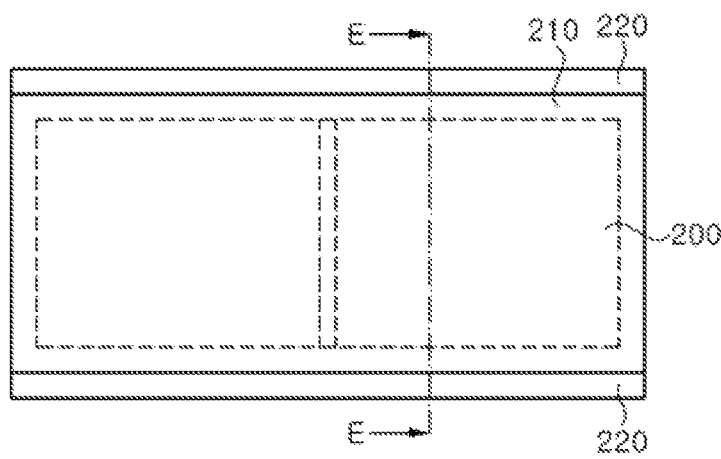
FIG. 20A and FIG. 20B are schematic plan views and are cross-sectional views illustrating a light emitting device according to another embodiment of the present disclosure.
Figure 20B:
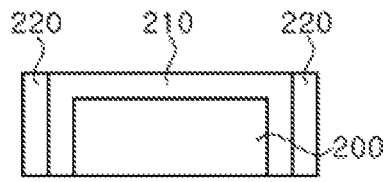

FIG. 20A is a schematic plan view and FIG. 20B is a cross-sectional view illustrating a light emitting device according to another embodiment of the present disclosure, where FIG. 20B is a cross-sectional view taken along the line E-E in FIG. 20A.

Referring to FIG. 20A and FIG. 20B, the light emitting device according to the present embodiment is substantially similar to the light emitting device described with reference to FIG. 19A and FIG. 19B, but differs in that reflection sidewalls 220 are disposed along both sides of the light emitting diode 200.

The reflection sidewalls 220 are disposed along long sides of the light emitting diode 200 and may be omitted on short sides of the light emitting diode 200. Meanwhile, a wavelength conversion layer 210 is disposed between the reflection sidewalls 220 and the light emitting diode 200. The reflection sidewalls 220 may be formed by a LED reflector such as PCT, PAST or SMC (Silicon Molding Compound) and thus may be easily formed using a molding process.

Accordingly, light emitted from the light emitting diode 200 is wavelength-converted on the wavelength conversion layer 210, reflected by the reflection sidewalls 220, and emitted toward an upper surface of the light emitting diode 200. In addition, a portion of the light emitted from the light emitting diode 200 is also emitted toward short side surfaces of the light emitting diode 200.

The light emitting device may be disposed on a side surface of a light guide plate to emit light toward the side surface of the light guide plate, and may be used as a backlight light source, for example.

Figure 21:
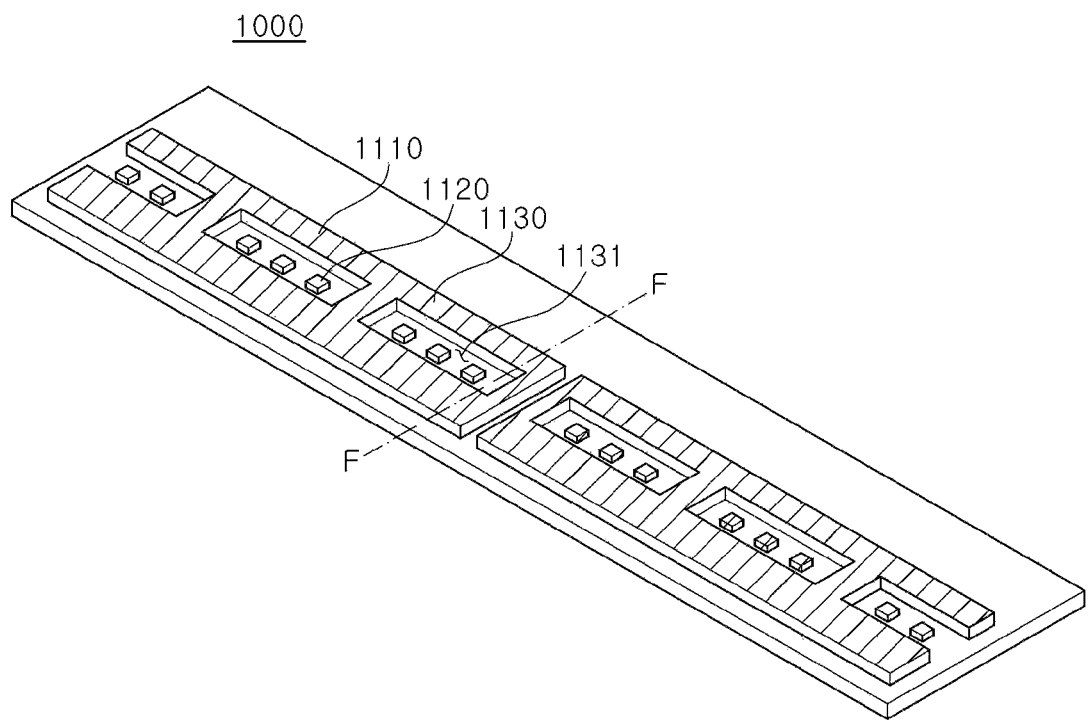
FIG. 21 is a schematic perspective view illustrating a light emitting module comprising a light emitting diode according to an embodiment of the present disclosure.
Figure 22:
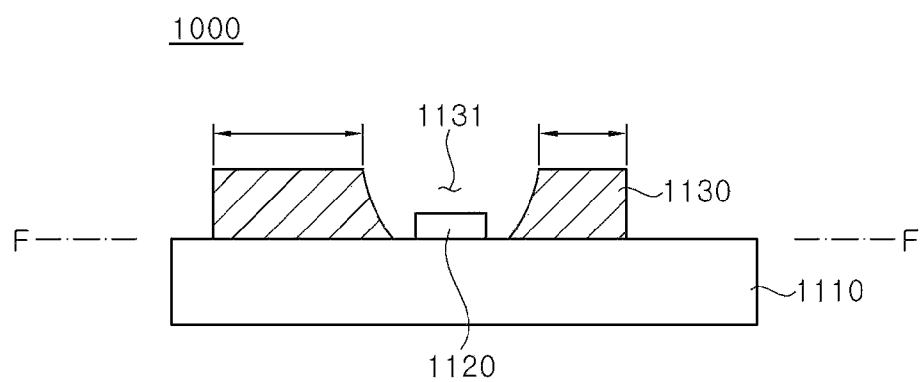
FIG. 22 is a schematic cross-sectional view taken along the line F-F in FIG. 21.

FIG. 21 is a schematic perspective view illustrating a light emitting module comprising a light emitting diode according to an embodiment of the present disclosure, and FIG. 22 is a schematic cross-sectional view taken along the line F-F in FIG. 21. The light emitting module according to the present embodiment is disposed on the side surface of the light guide plate to emit light, and thus may be used for an edge type backlight unit.

Referring to FIGS. 21 and 22, a light emitting module 1000 comprises a printed circuit board (PCB) 1110, a light emitting device 1120, and a spacer 1130.

The printed circuit board 1110 may be an FR4 printed circuit board or a metal printed circuit board (Metal PCB). When the printed circuit board 1110 is a metal PCB, the heat generated by the light emitting device 1120 may be conducted to the outside and heat dissipation function of the light emitting module 1000 may be improved.

The light emitting device 1120 is the same as the light emitting device described with reference to FIG. 19 or FIG. 20 and may be a light emitting device comprising the light emitting diode 200 and the wavelength conversion layer 210, or may be a light emitting diode 200 without the wavelength conversion layer 210. A plurality of light emitting devices 1120 are mounted on an upper surface of the printed circuit board 1110. The plurality of light emitting devices 1120 do not need to be all the same, and only a portion of them may comprise the light emitting diodes 200 described above.

The plurality of light emitting devices 1120 are disposed apart from one another. At this time, an interval between neighboring light emitting devices 1120 is not necessarily the same, or they may be arranged to have a different interval.

The spacer 1130 is disposed on the upper surface of the printed circuit board 1110. A through-hole shaped cavity 1131 is formed in the spacer 1130. The cavity 1131 of the spacer 1130 exposes the printed circuit board 1110. The light emitting devices 1120 are located inside the cavity 1131 formed in this way.

A plurality of cavities 1131 are formed in the spacer 1130. In addition, a plurality of light emitting devices 1120 may be disposed inside of each cavity 1131. In one embodiment, at least one cavity 1131 of the plurality of cavities 1131 may be different in length from the other cavities 1131. In addition, at least one cavity 1131 of the plurality of cavities 1131 may be provided with a different number of light emitting devices 1120 from the other cavities 1131.

The spacer 1130 may be thicker than the light emitting device 1120. That is, an upper surface of the spacer 1130 is located higher than an upper surface of the light emitting device 1120. For example, a thickness of the light emitting device 1120 is 0.4 mm, and a thickness of the spacer 1130 is 0.7 mm. The printed circuit board 1110 may be thermally expanded by heat emitted from the light emitting devices 1120, and thus the light emitting devices 1120 may be damaged by touching a light guide plate (not shown). The spacer 1130 keeps the light emitting device 1120 away from the light guide plate to prevent the light emitting devices 1120 from being damaged by the light guide plate.

The cavity 1131 of the spacer 1130 is formed to increase its width from a lower portion to an upper portion. Further, a side surface of the cavity 1131 may be formed as a curved surface. Therefore, light emitted from a side of the light emitting device 1120 may be reflected to a light incident portion of the light guide plate at the side surface of the cavity 1131 (not shown), and thus it is possible to improve light condensing efficiency of the light emitting module 1000.

One side wall and another side wall of the spacer 1130 may be formed to have different widths. Here, one of both side walls formed in a longitudinal direction of the spacer 1130 becomes the one side wall, and the other one becomes the another side wall.

The spacer 1130 is formed of a light reflection material. Or the spacer 1130 may be coated with the light reflection material. For example, the spacer 1130 may be formed of a reflection material such as white silicone, reflection metal material, white plastic, white film, PCT (Polycyclohexylene Terephthalate), PAST (Polyamide 9T), or others.

The plurality of spacers 1130 may be disposed on the upper surface of the printed circuit board 1110 in a longitudinal direction. Each of the spacers 1130 may be disposed apart from one another, and thus it is possible to prevent the spacers 1130 from being deformed by thermal expansion.

FIGS. 23 to 26 are cross-sectional views illustrating various methods of attaching spacers.

Figure 23:
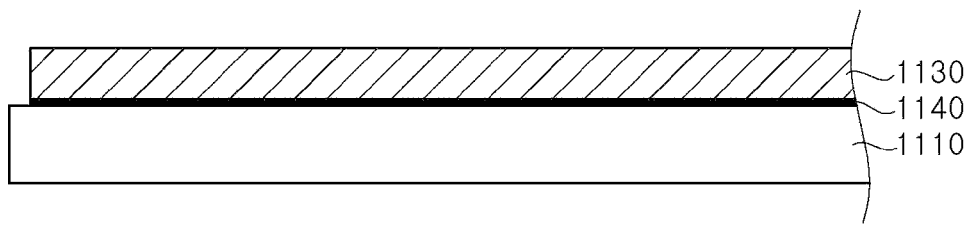
FIGS. 23, 24, 25, and 26 are cross-sectional views illustrating various methods of attaching spacers.

Referring to FIG. 23, a spacer 1130 is attached to a printed circuit board 1110 by an adhesive 1140. The adhesive 1140 is interposed between the printed circuit board 1110 and the spacer 1130. In this way, the spacer 1130 is fixed to the printed circuit board 1110 by an adhesive force of the adhesive 1140.

Figure 24:
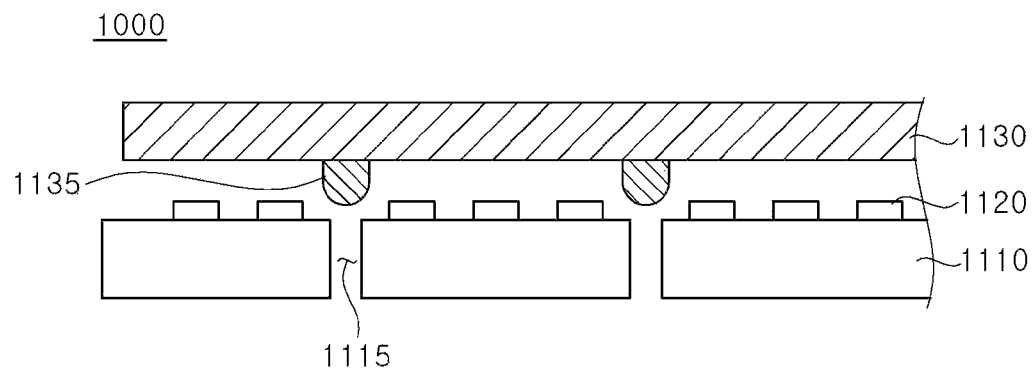
Figure 25:
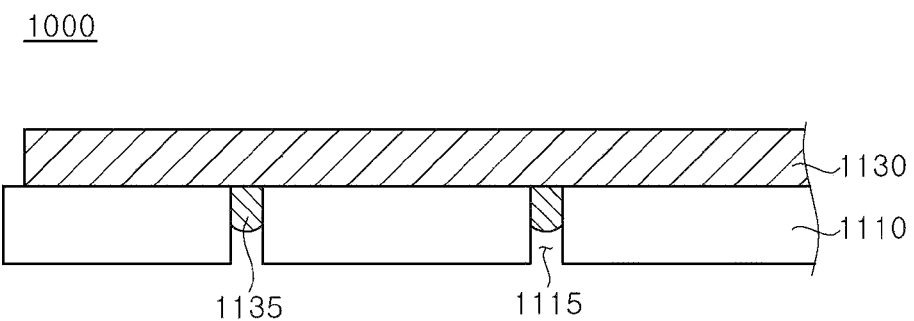

Referring to FIGS. 24 and 25, the a spacer 1130 may be attached to the printed circuit board 1110 by a protrusion 1135 of the spacer 1130 and a concave portion 1115 of the printed circuit board 1110.

For example, the spacer 1130 comprises the protrusion 1135. The protrusion 1135 is formed on a lower surface of the spacer 1130, and is formed to protrude downward. In addition, the printed circuit board 1110 comprises the through-hole shaped concave portion 1115. The concave portion 1115 is formed at a location corresponding to the protrusion 1135 of the spacer 1130. When the spacer 1130 is disposed on the printed circuit board 1110, the protrusion 1135 is inserted into the concave portion 1115 by pressing the spacer 1130 toward the printed circuit board 1110. In this manner, the spacer 1130 is fixed to the printed circuit board 1110. In the embodiment of the present disclosure, the concave portion 1115 is described as the through-hole shaped, but the present disclosure is not limited thereto. It is possible for the concave portion 1115 to be formed as a groove shape on an upper surface of the printed circuit board 1110.

A diameter of the concave portion 1115 of the printed circuit board 1110 is smaller than a diameter of the protrusion 1135 of the spacer 1130. For example, the diameter of the concave portion 1115 can have a size for the protrusion 1135 to be inserted into the concave portion 1115 only when the spacer 1130 is pressed toward the substrate. Further, the protrusion 1135 of the spacer 1130 may have an elastic force.

Therefore, the protrusion 1135 is forcibly inserted into the concave portion 1115 by a force pressing the spacer 1130 in the direction of the printed circuit board 1110. When the force applied to the spacer 1130 is removed, a state in which the protrusion 1135 is inserted in the concave portion 1115 is maintained, and the spacer 1130 is fixed in a state of being in contact with the printed circuit board 1110 as shown in FIG. 25.

According to the present embodiment, a length of the protrusion 1135 is smaller than a thickness of the printed circuit board 1110. Therefore, even when the concave portion 1115 is formed as a through-hole shape, it is possible to prevent the protrusion 1135 from protruding to a lower portion of the printed circuit board 1110 when the printed circuit board 1110 and the spacer 1130 are combined.

Figure 26:
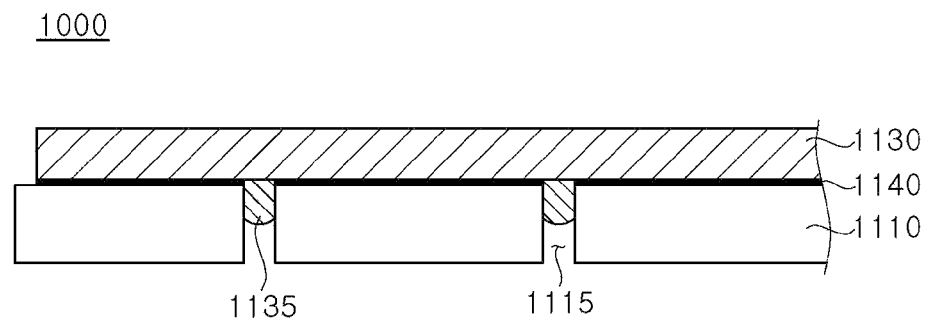

Referring to FIG. 26, a spacer 1130 may be attached to a printed circuit board 1110 by an adhesive 1140, a protrusion 1135 formed on the spacer 1130 and a concave portion 1115 formed on the printed circuit board 1110.

The adhesive 1140 is interposed between the printed circuit board 1110 and the spacer 1130. In addition, the spacer 1130 comprises the protrusion 1135 and the printed circuit board 1110 comprises the concave portion 1115.

In order to attach the spacer 1130 to the printed circuit board 1110, the spacer 1130 is pressed in the direction of the printed circuit board 1110 with the adhesive 1140 applied to an upper surface of the printed circuit board 1110 or a lower surface of the spacer 1130. At this time, the spacer 1130 is fixed to the printed circuit board 1110 by an adhesive force of the adhesive 1140 and an insertion of the protrusion 1135 of the spacer 1130 into the concave portion 1115 of the printed circuit board 1110.

Figure 27:
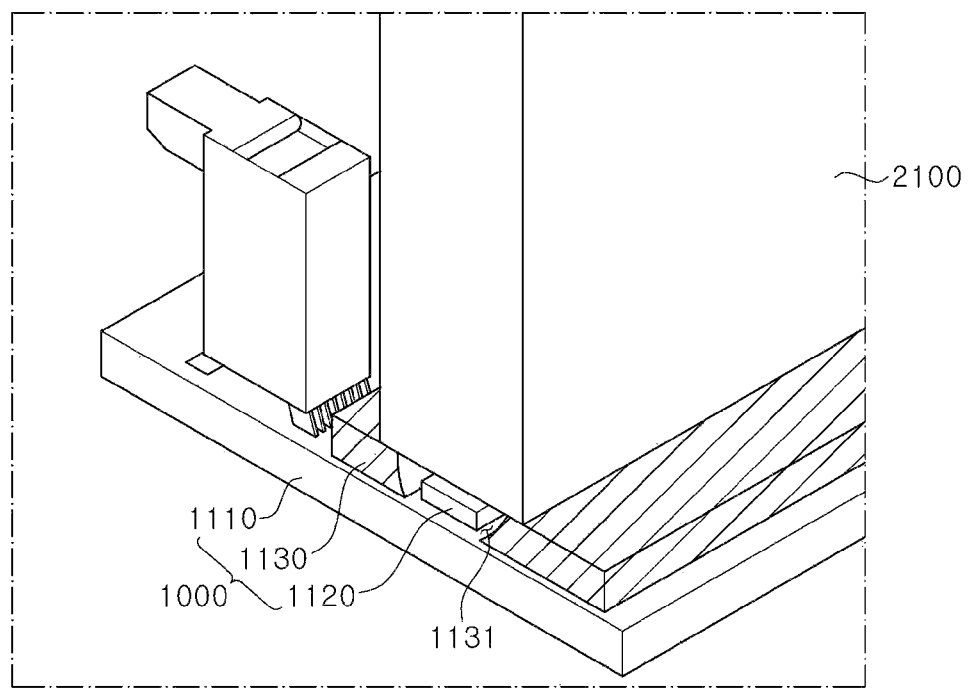
FIG. 27 is a partial perspective view illustrating a display apparatus according to an embodiment of the present disclosure.

FIG. 27 is a partial perspective view illustrating a display apparatus according to an embodiment of the present disclosure.

Referring to FIG. 27, a display device 2000 comprises a light emitting module 1000 and a light guide plate 2100. The light emitting module 1000 is the same as the light emitting module 1000 of FIGS. 21 to 26. Therefore, redundant descriptions of element portions of the light emitting module 1000 will be omitted.

Side surfaces of the light guide plate 2100 are disposed over the spacer 1130. At this time, an upper surface of the spacer 1130 and a light incident surface of the light guide plate 2100 may be in contact with each other.

A maximum width of a cavity 1131 is smaller than a thickness of the light guide plate 2100. More specifically, the maximum width of the cavity 1131 is smaller than a width of the light incidence surface of the light guide plate 2100. Accordingly, all light emitted from a light emitting device 1120 may be incident on the light guide plate 2100, and thus luminous efficiency is increased.

In addition, the upper surface of the spacer 1130 is located higher than an upper surface of the light emitting device 1120. Therefore, the spacer 1130 may prevent the light guide plate 2100 from being deformed by heat and damaging the light emitting device 1120.

In the present embodiment, it is explained that the light emitting diode 100 is applied to the light emitting module 1000 used in a backlight unit of a display, but the light emitting diode 100 may be applied to general lighting, automobile head lights, or others.

Figure 28A:
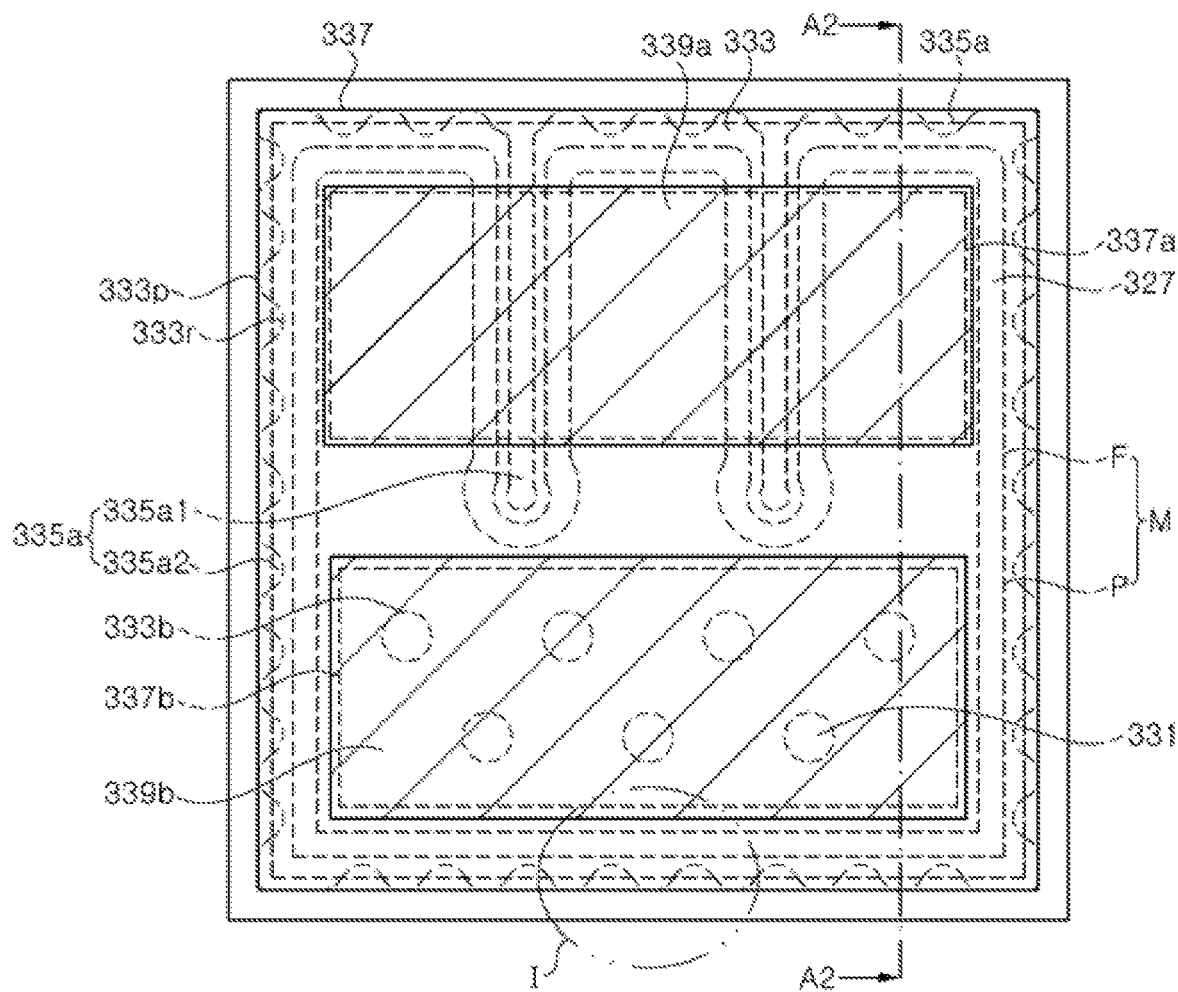
FIG. 28A and FIG. 28B show schematic plan views of a light emitting diode according to another embodiment of the present disclosure.
Figure 28B:
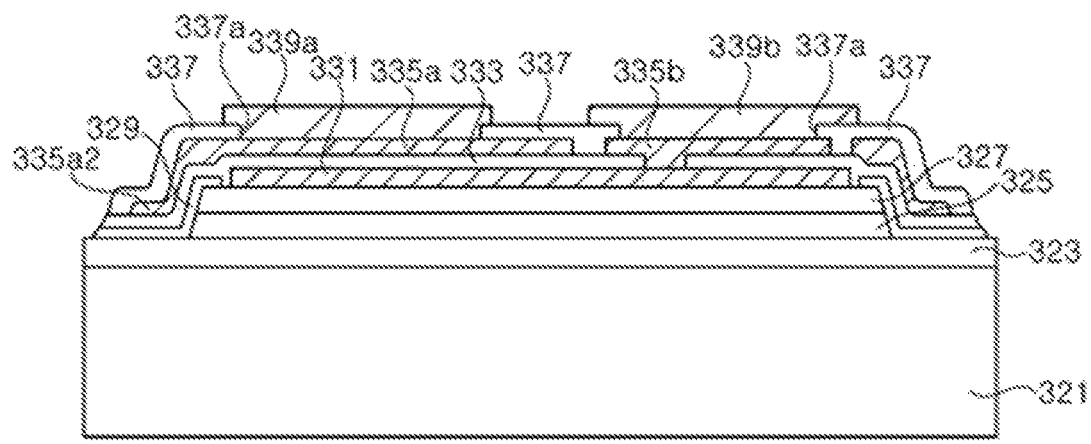
Figure 29:
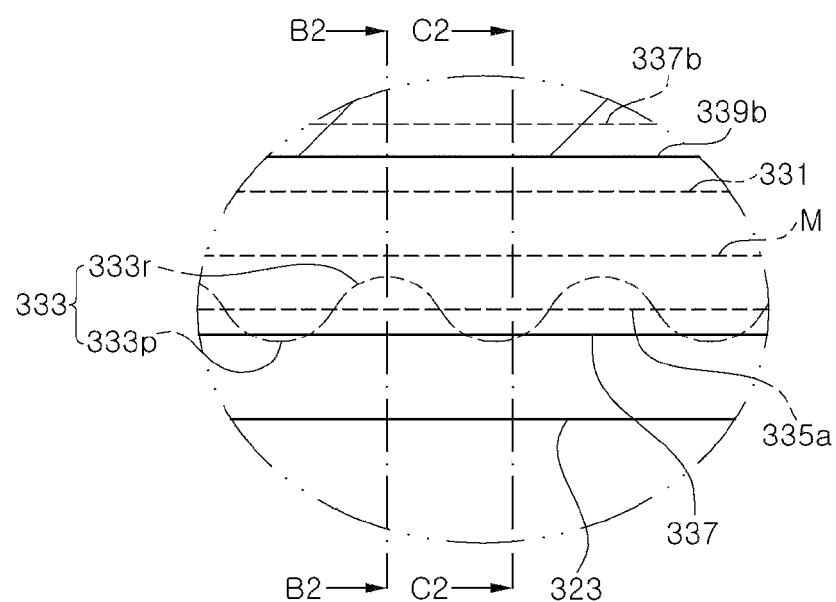
FIG. 29 is an enlarged view of a portion indicated by I in FIG. 28A.
Figure 30A:
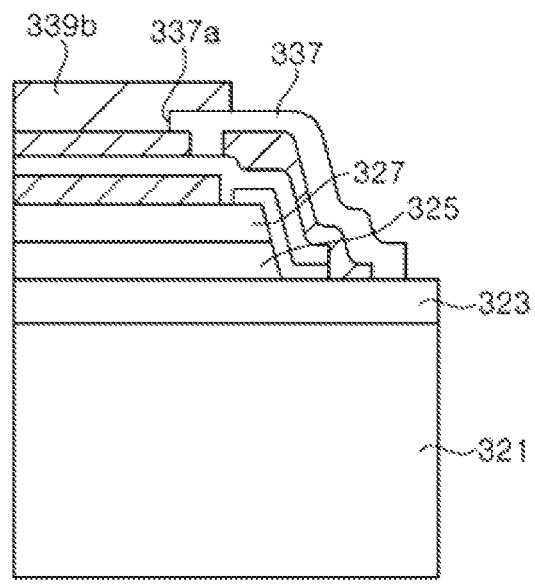
FIG. 30A and FIG. 30B are cross-sectional views taken along the line B2-B2 and a cross-sectional view taken along the line C2-C2 in FIG. 29.
Figure 30B:
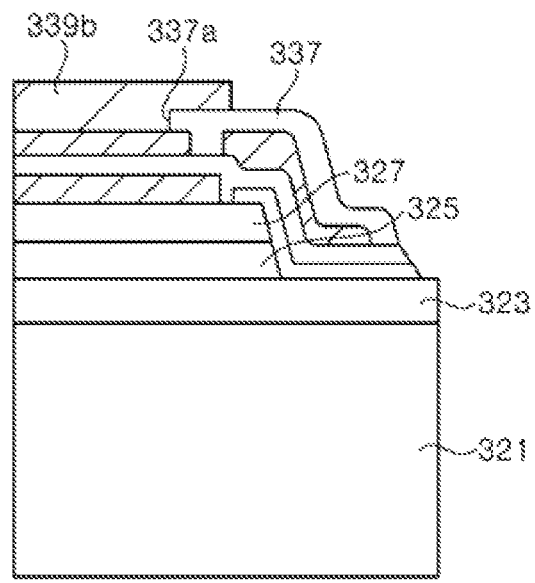

FIG. 28A is a schematic plan view and FIG. 28B is a cross-sectional view for illustrating a light emitting diode according to another embodiment of the present disclosure. Here, the cross-sectional view of FIG. 28B is taken along the line A2-A2 in the plan view of FIG. 28A. In the meantime, FIG. 29 is an enlarged view of a portion indicated by I in FIG. 28A, and FIG. 30A is a partial cross-sectional view taken along the line B2-B2 in FIG. 29 and FIG. 30B is a partial cross-sectional view taken along the line C2-C2 in FIG. 29.

Referring to FIG. 28A and FIG. 28B, the light emitting diode comprises a substrate 321, a first conductivity type semiconductor layer 323, an active layer 325, a second conductivity type semiconductor layer 327, a first contact layer 335a, a second contact layer 331, first insulation layers 329 and 333, an upper insulation layer 337, a first electrode pad 339a, and a second electrode pad 339b.

As the substrate 321, any substrate capable of growing a gallium nitride based semiconductor layer may be used without limitation. As an example of the substrate 321, there can be various kinds such as a sapphire substrate, a gallium nitride substrate, a SiC substrate, a Si substrate, or others. The substrate 321 may have a rectangular or square outer shape as shown in plan view (a). A size of the substrate 321 may be a square shape of 1000 µm×1000 µm or 700 µm×700 µm or a rectangular shape of a similar size, for example. The size of the substrate 321 is not particularly limited and may be variously selected.

The first conductivity type semiconductor layer 323 is disposed on the substrate 321. The first conductivity type semiconductor layer 323 is a layer grown on the substrate 321 and is a gallium nitride based semiconductor layer. The first conductivity type semiconductor layer 323 may be a gallium nitride based semiconductor layer doped with an impurity, for example, Si.

A mesa M is disposed on the first conductivity type semiconductor layer. The mesa M may be located on an inner region of a region surrounded by the first conductivity type semiconductor layer 323, and thus regions near edges adjacent to the first conductivity type semiconductor layer are not covered by the mesa M, but are exposed to the outside.

The mesa M comprises the second conductivity type semiconductor layer 327 and the active layer 325. The active layer 325 is interposed between the first conductivity type semiconductor layer 323 and the second conductivity type semiconductor layer 327. The active layer 325 may have a single quantum well structure or a multiple quantum well structure. A composition and a thickness of the well layer in the active layer 325 determine a wavelength of generated light. In particular, by controlling the composition of the well layer, it is possible to provide an active layer generating ultraviolet light, blue light or green light.

In the meantime, the second conductivity type semiconductor layer 327 may be a p-type impurity, for example, a gallium nitride-based semiconductor layer doped with Mg. Each of the first conductivity type semiconductor layer 323 and the second conductivity type semiconductor layer 327 may be a single layer, but they are not limited thereto, they may comprise multiple layers or superlattice layers.

In the meantime, the mesa M may comprise a finger F and a palm P. An indent portion is formed between the fingers Fs, and an upper surface of the first conductivity type semiconductor layer 323 is exposed by the indent portion. In the present embodiment, the mesa M is described as having the finger F and the palm P, but it is not limited thereto. For example, the mesa M may have a rectangular shape similar to the substrate 321, and through-holes may be formed in the mesa M to expose the first conductivity type semiconductor layer 323. In addition, in the present embodiment, three finger Fs are shown, however a number of fingers Fs is not limited to three, but may be two, four, or more.

In the meantime, the second contact layer 331 is disposed over the mesa M and contacts the second conductivity type semiconductor layer 327. The second contact layer 331 may be disposed substantially over the entire area of the mesa M in an upper region of the mesa M. For example, the second contact layer 331 may cover more than 80%, further more than 90% of the upper region of the mesa M.

The second contact layer 331 may comprise a metal layer having reflectivity, and thus may reflect light generated in the active layer 325 and traveling to the second contact layer 331, toward the substrate 321. Alternatively, the second contact layer 331 may comprise a transparent oxide layer such as ITO (indium tin oxide) or ZnO.

In the meantime, a preliminary insulation layer 329 may cover the mesa M in a periphery of the second contact layer 331. The preliminary insulation layer 329 may be formed of $SiO_2$, and may cover a side of the mesa M and may further cover a partial region of the first conductivity type semiconductor layer 323. In another embodiment, the preliminary insulation layer 329 may be disposed only in a periphery of the second contact layer 331 over the mesa M.

In the meantime, the first contact layer 335a covers an upper region of the mesa M. The first contact layer 335a comprises an inner contact portion 335a1 and an outer contact portion 335a2 contacting with the first conductivity type semiconductor layer 323. The outer contact portion 335a2 contacts the first conductivity type semiconductor layer 323 near an edge of the substrate 321 along a periphery of the mesa M, and the inner contact portion 335a1 contacts the first conductivity type semiconductor layer 323 in a region surrounded by the outer contact portion 335a2. As shown in FIG. 28 (a), or better shown in FIG. 35, the inner contact portion 335a1 may extend to the outer contact portion 335a2. The inner contact portion 335a1 may be connected to, or may be spaced apart from the outer contact portion 335a2.

Meanwhile, the first contact layer 335a may have an opening in the upper region of the mesa M, and an intermediate connection portion 335b may be disposed in the opening. The intermediate connection portion 335b may be formed together while forming the first contact layer 335a.

A lower insulation layer 333 is disposed between the first contact layer 335a and the mesa M and may insulate the first contact layer 335a from the mesa M and the second contact layer 331. In addition, the lower insulation layer 333 covers the preliminary insulation layer 329 and is integrated with the preliminary insulation layer 329, and has opening regions 333a1 and 333a2 exposing the first conductivity type semiconductor layer 323. An integrated insulation of the lower insulation layer 333 with the preliminary insulation layer 329 disposed between the mesa M and the first contact layer 335a will be referred to as a first insulation layer. The outer contact portion 335a2 and the inner contact portion 335a1 described above may be formed by the opening regions 333a1 and 333a2 formed in the lower insulation layer 333 and the preliminary insulation layer 329. The lower insulation layer 333 may also be interposed between the intermediate connection portion 335b and the second contact layer 331, and may have an opening 333b exposing the second contact layer 331. The intermediate connection portion 335b may be connected to the second contact layer 331 through these openings 333b.

As well shown in FIG. 29, first insulation layers 329 and 333 have protrusions 333p and recesses 333r near an edge of the substrate 321. The protrusions 333p are located closer to the edge of the substrate 321 than the recesses 333r. The protrusions 333p and the recesses 333r may be located on the first conductivity type semiconductor layer 323. The opening region 333a2 where the first conductivity type semiconductor layer 323 is exposed is reduced by the protrusions 333p.

FIG. 30A is a cross-sectional view taken along the line B2-B2 passing through a recess 333r in FIG. 29, and FIG. 30B is a cross-sectional view taken along the line C2-C2 passing through a protrusion 333p in FIG. 29. As known with FIGS. 30A and 30B, a front line of the first contact layer 335a is located on the protrusion 333p and also contacts the first conductivity type semiconductor layer 323 near the recess 333r.

That is, the first contact layer 335a contacts the first conductivity type semiconductor layer 323 exposed by the recess 333r and forms the outer contact portion 335a2. Accordingly, the outer contact portions 335a2 and the protrusions 333p alternately contact with the first conductivity type semiconductor layer along the periphery of the mesa M, and thus a contact area of the outer contact portion 335a2 is reduced. Therefore, light loss due to the first contact layer 335a can be reduced.

The upper insulation layer 337 is disposed on the first contact layer 335a and the intermediate connection portion 335b, and has an opening 337a exposing the first contact layer 335a and an opening 337b exposing the intermediate connection portion 335b. In addition, the upper insulation layer 337 may cover sidewalls of the opening of the first contact layer 335a and sidewalls of the intermediate connection portion 335b.

The first insulation layers 329 and 333 and the upper insulation layer 337 may be formed of a single layer of $SiO_2$, but the present disclosure is not limited thereto. For example, the lower insulation layer 333 or the upper insulation layer 337 may have a multiple layer structure comprising a silicon nitride layer and a silicon oxide layer, or may be a distributed Bragg reflector where a silicon oxide layer and a titanium oxide layer are alternately laminated.

Particularly, when the lower insulation layer 333 is formed of the distributed Bragg reflector with high reflectance, light extraction efficiency may be increased by reflecting light by using the protrusion 333p of the lower insulation layer 333.

The first electrode pad 339a is electrically connected to the first contact layer 335a through the opening 337a of the upper insulation layer 337, and the second electrode pad 339b is electrically connected to the intermediate connection portion 335b through the opening 337b. Accordingly, the second electrode pad may be electrically connected to the second contact layer 331 via the intermediate connection portion 335b.

In the present embodiment, it was described that the outer contact portion 335a2 does not continuously contact the first conductivity type semiconductor layer 323 along the periphery of the mesa M, and the outer contact portions 335a2 and first protrusions 333p alternately contact the first conductivity type semiconductor layer along the periphery of the mesa M. The technical features are not limited to the present embodiment, but can be similarly applied to the embodiment with the plurality of light emitting cells C1 and C2 described above. For example, protrusions and recesses of the first insulation layers 33 and 233 are formed along the mesas M of each of the light emitting cells C1 and C2, and the first contact layers 35a and 235a and the second contact layers 35b and 235b may intermittently contact the first conductivity type semiconductor layers 23 and 223 at the recesses of the first insulation layers 33 and 233 along the periphery of the mesas M.

FIGS. 28A to 30B are schematically shown for convenience of explanation, and structures of the light emitting diode and respective elements will be more clearly understood through the light emitting diode manufacturing method described later.

FIGS. 31A to 37B are views for illustrating a method of manufacturing a light emitting diode according to an embodiment of the present disclosure. FIGS. 31A to 37A are plan views, and FIGS. 31B to 37B are cross-sectional views taken along the line G-G.

Figure 31A:
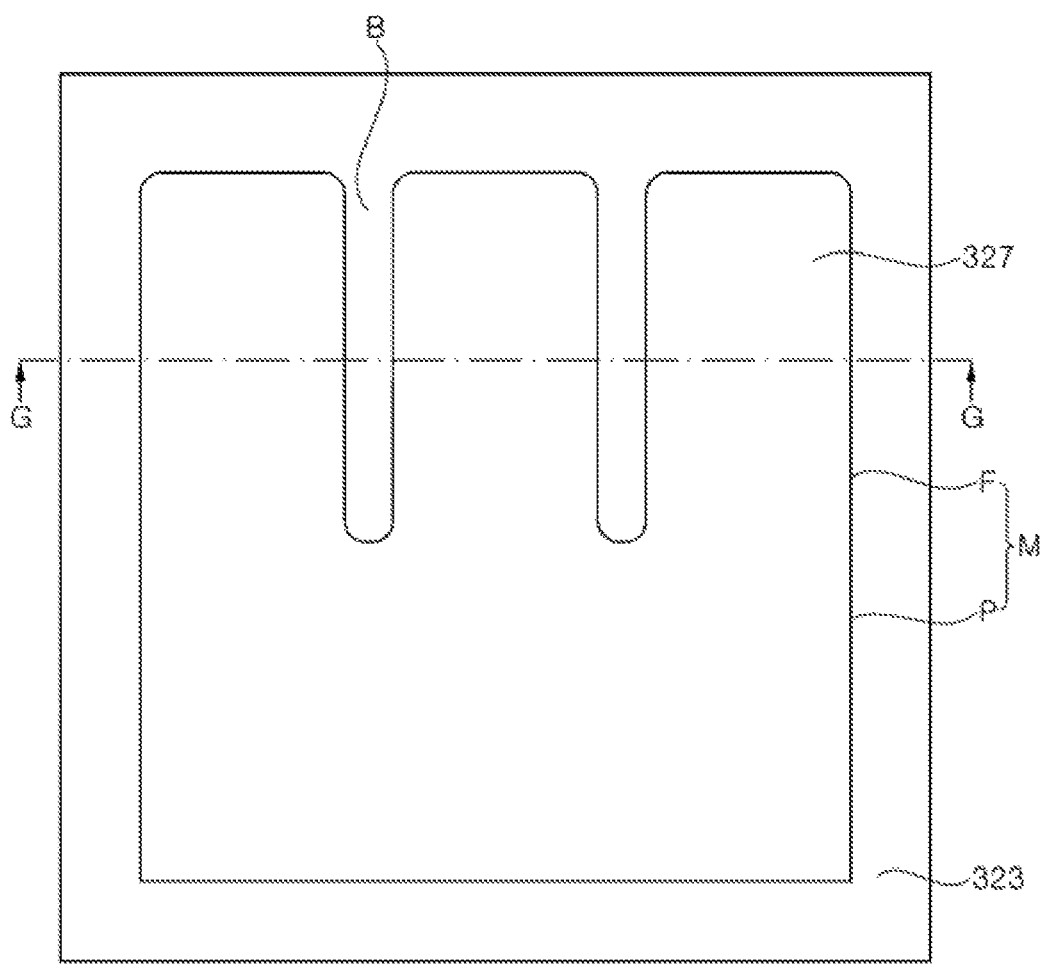
FIGS. 31A, 32A, 33A, 34A, 35A, 36A, and 37A are schematic plan views illustrating a method of manufacturing a light emitting diode according to another embodiment of the present disclosure
Figure 31B:
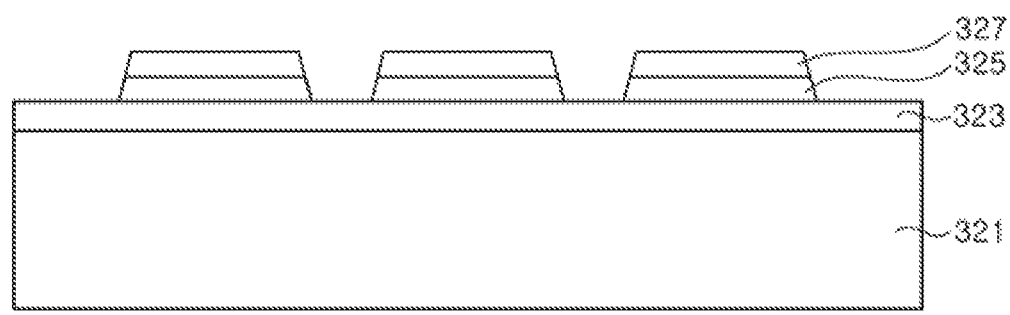
FIGS. 31B, 32B, 33B, 34B, 35B, 36B, and 37B are respective cross-sectional views taken along the line G-G of each of the plan views.

First of all, referring to FIGS. 31A and 31B, a first conductivity type semiconductor layer 323, an active layer 325, and a second conductivity type semiconductor layer 327 are grown on a substrate 321. As the substrate 321, any substrate capable of growing a gallium nitride-based semiconductor layer may be used without limitation. As an example of the substrate 321, there can be various kinds such as a sapphire substrate, a gallium nitride substrate, a SiC substrate, a Si substrate, or others.

Meanwhile, the first conductivity type semiconductor layer 323 may comprise an n-type gallium nitride layer, and the second conductivity type semiconductor layer 327 may comprise a p-type gallium nitride layer. In addition, the active layer 325 may be a single quantum well structure or a multiple quantum well structure, and may comprise a well layer and a barrier layer. Further, the well layer may have its compositional element selected depending on a wavelength of a required light, and may comprise InGaN, for example.

The first conductivity type semiconductor layer 323, the active layer 325 and the second conductivity type semiconductor layer 327 may be grown on the substrate 321 by Metal Organic Chemical Vapor Deposition (MOCVD). Here, the first conductivity type semiconductor layer 323 may be doped with an n-type impurity, for example, Si. The first conductivity type semiconductor layer 323 may have a doping concentration within a range of $8E17/cm^3$ to is $1E18/cm^3$, for example.

Next, a mesa M disposed on the first conductivity type semiconductor layer 323 is formed by patterning the second conductivity type semiconductor layer 327 and the active layer 325. The mesa M may comprise the active layer 325 and the second conductivity type semiconductor layer 327, and may further comprise a partial thickness of the first conductivity type semiconductor layer 323. In addition, the mesa M is disposed on an inner region of an edge of the first conductivity type semiconductor layer 323, and may comprise a finger F and a palm P. However, the present disclosure is not limited thereto, but it may have a structure where a groove is formed within a quadrangular mesa. This will be described later in another embodiment.

In the meantime, as shown in FIGS. 31A and 31B, the number of fingers Fs may be three, it is not limited thereto, but may be two or four or more. Accordingly, the first conductivity type semiconductor layer 323 around the mesa M is exposed, and an indent B is disposed between fingers Fs. A length of the indent B is not particularly limited, but may be up to about half the length of one side of the mesa M. Accordingly, the fingers Fs may have approximately the same length as the palm P. By disposing the fingers Fs and the palm P, the second conductivity type semiconductor layer 327 may be connected as one and subsequent processes for current spreading may be simplified.

A side surface of the mesa M may be formed to be inclined by using a process such as photoresist reflow. An inclined profile of the side surface of the mesa M improves an extraction efficiency of light generated in the active layer 325.

Figure 32A:
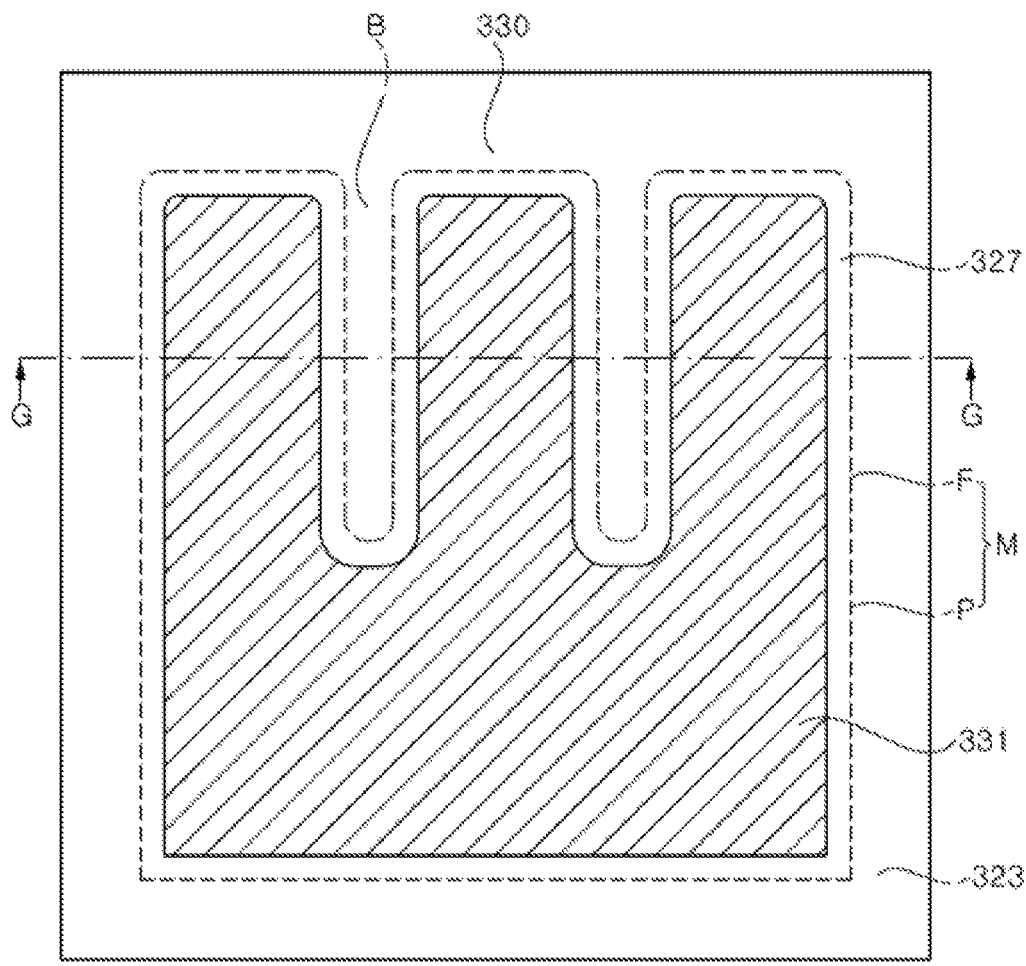
Figure 32B:
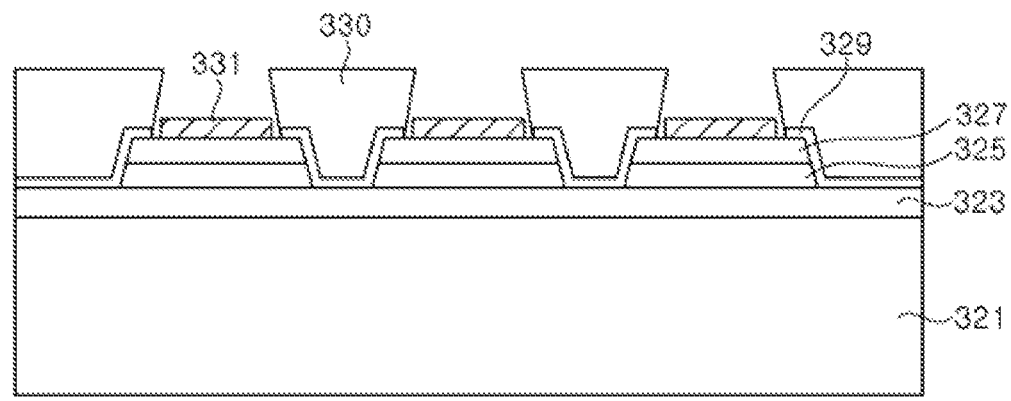

Referring to FIGS. 32A and 32B, a preliminary insulation layer 329 is formed to cover the first conductivity type semiconductor layer 323 and the mesa M. The preliminary insulation layer 329 may be formed of $SiO_2$ using a chemical vapor deposition technique, for example.

A photoresist pattern 330 is formed on the preliminary insulation layer 329. The photoresist pattern 330 has an opening exposing an upper region of the mesa M. The opening may be substantially similar to a shape of the mesa M, but may be formed slightly smaller than the mesa M. That is, the photoresist may cover edge portions of the mesa M. Further, the opening may be formed to have larger width of a bottom portion than a width of an inlet. For example, by using a negative type photoresist, the photoresist pattern 330 having an opening with the shape described above may be easily formed.

Thereafter, the preliminary insulation layer 329 is etched by using the photoresist pattern 330 as an etching mask, and thus the second conductivity type semiconductor layer 327 is exposed. The preliminary insulation layer 329 may be etched by using a wet etching technique, for example.

Then, a second contact layer (e.g., p contact layer 331) is formed. The second contact layer 331 may be formed on the mesa M by a coating technique using an electron beam evaporation method.

Figure 33A:
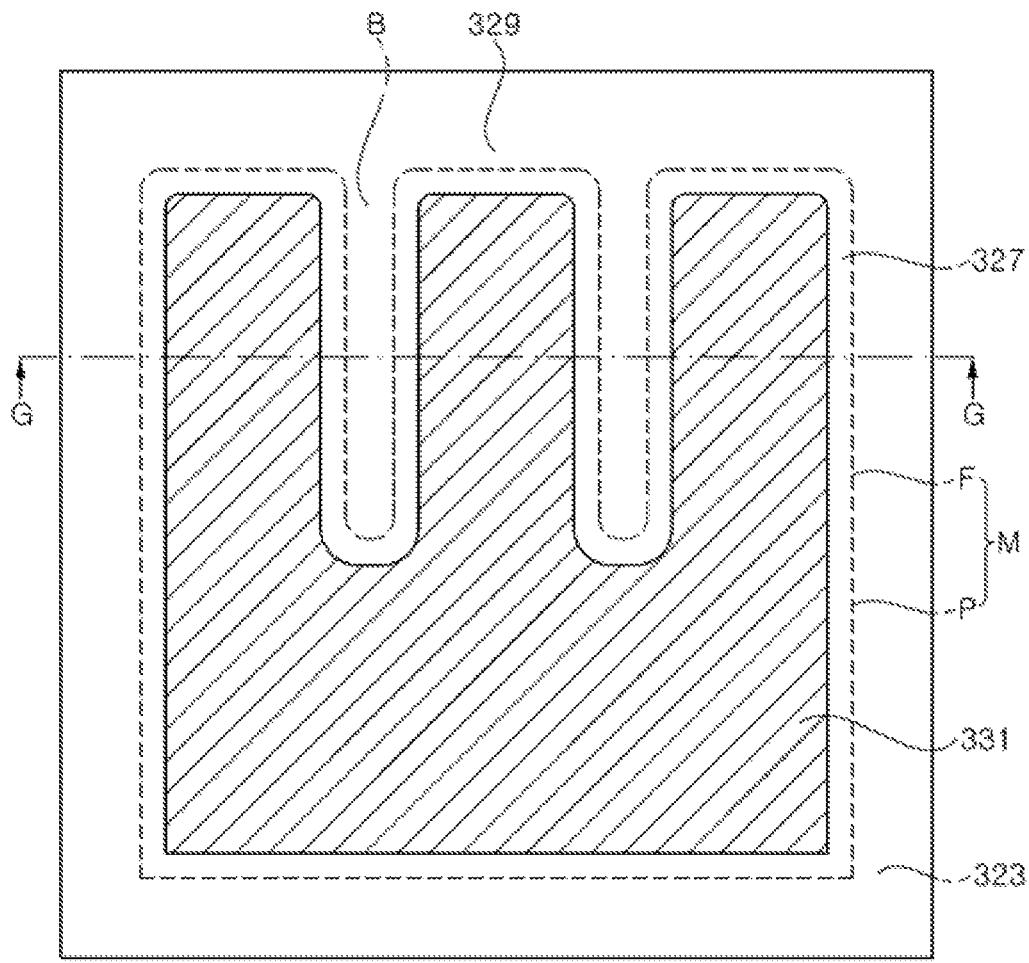
Figure 33B:
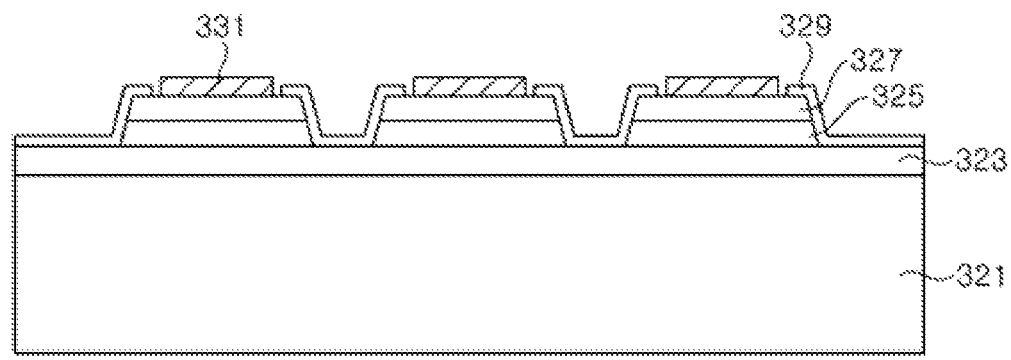

Referring to FIGS. 33A and 33B, the photoresist pattern 330 is removed. In addition, a material deposited on the photoresist is also removed along with the photoresist pattern 330. As a result, the second contact layer 331 contacting the second conductivity type semiconductor layer 327 remains on the mesa M, and the preliminary insulation layer 329 remains around the second contact layer 331. The preliminary insulation layer 329 may also cover an exposed portion of the first conductivity type semiconductor layer 323.

Here, the second contact layer 331 may be a single metal material layer, it is not limited thereto, but may be a multiple layered structure. For example, the second contact layer 331 may comprise a reflection layer, a capping layer, and an anti-oxidation layer. Further, a stress relieving layer may be interposed between the reflection layer and the capping layer.

The reflection layer may be formed of Ni/Ag/Ni/Au, for example, and the capping layer may cover an upper surface and side surfaces of the reflection layer to protect the reflection layer. The reflection layer is formed using an electron beam evaporation method, and the capping layer is formed using a sputtering technique or an electron-beam evaporation method (e.g., planetary e-beam evaporation) in which a layer is vacuum deposited while the substrate 321 is tilted and rotated. The capping layer may comprise Ni, Pt, Ti, or Cr, and may be formed by depositing one pair or more of Ni/Pt or one pair or more of of Ni/Ti, for example. Alternatively, the capping layer may comprise TiW, W, or Mo.

The stress relieving layer is interposed between the reflection layer and the capping layer to relieve stress, and thus may be variously selected depending on metal materials the reflection layer and the capping layer. When the reflection layer is Al or an Al alloy, and the capping layer comprises W, TiW, or Mo, the stress relieving layer may be a single layer of Ag, Cu, Ni, Pt, Ti, Rh, Pd, or Cr, or may be multiple layers of Cu, Ni, Pt, Ti, Rh, Pd, or Ag. In addition, when the reflection layer is Al or an Al alloy, and the capping layer is Cr, Pt, Rh, Pd, or Ni, the stress relieving layer may be a single layer of Ag or Cu, or multiple layers of Ni, Au, Cu or Ag.

In addition, when the reflection layer is Ag or an Ag alloy, and a capping metal portion 332 comprises W, TiW, or Mo, the stress relieving layer is a single layer of Cu, Ni, Pt, Ti, Rh, Pd, or Cr or multiple layers of Cu, Ni, Pt, Ti, Rh, Pd, Cr, or Au. In addition, when the reflection layer is Ag or an Ag alloy, and the capping layer is Cr or Ni, the stress relieving layer may be a single layer of Cu, Cr, Rh, Pd, TiW, or Ti, or multiple layers of Ni, Au, or Cu.

Further, an antioxidant layer contains Au to prevent oxidation of the capping layer, and may be formed of Au/Ni or Au/Ti, for example. Ti is preferred because of good adhesion of an oxide layer such as SiO2. The antioxidant layer may also be formed by using sputtering or electron-beam evaporation (e.g., planetary e-beam evaporation) in which a layer is vacuum deposited while the substrate 321 is tilted and rotated.

In the present embodiment, the second contact layer 331 is described as a metal layer, it is not limited thereto, but any material being in ohmic-contact with the second conductivity type semiconductor layer 327 may be used as the second contact layer 331. For example, the second contact layer 331 may be a transparent conductive layer such as ITO or ZnO.

Figure 34A:
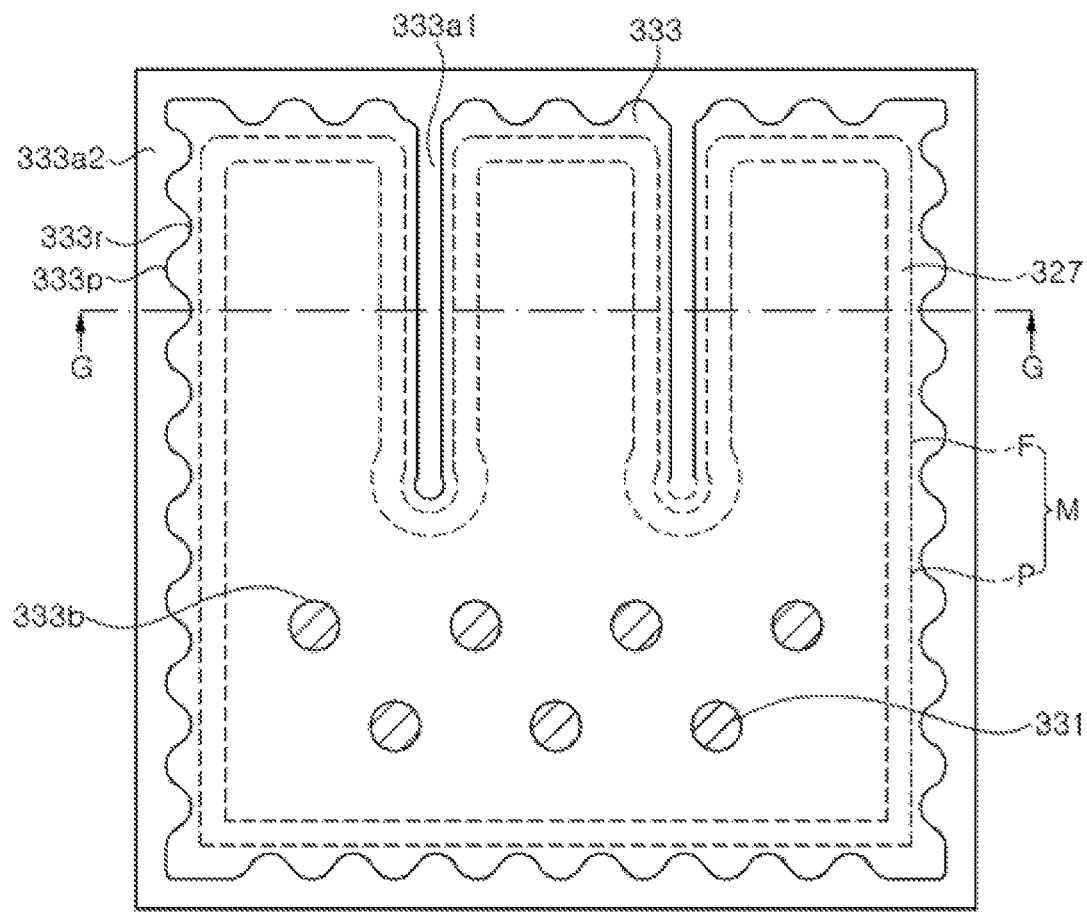
Figure 34B:
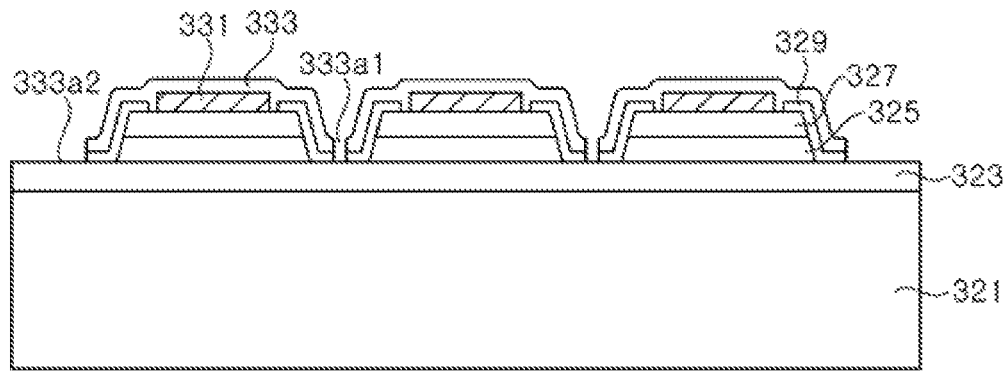

Referring to FIGS. 34A and 34B, a lower insulation layer 333 covering the mesa M and the first conductivity type semiconductor layer 323 is formed. The lower insulation layer 333 covers the second contact layer 331 and also covers the preliminary insulation layer 329. Accordingly, the lower insulation layer 333 is integrated with the insulation layer 329 into one insulation layer and may be patterned together with the insulation layer 329. In the present embodiment, it is described that the preliminary insulation layer 329 is formed in advance, but the preliminary insulation layer 329 may be omitted. In addition, the preliminary insulation layer 329 may be limitedly located on the mesa M. It is not easy to distinguish the preliminary insulation layer 329 from the lower insulation layer 333 because a thickness of the preliminary insulation layer 329 is small. Accordingly, all insulation layers disposed between the mesa M and a first contact layer 335a are referred to as the first insulation layer 329 and 333, unless otherwise noted.

The first insulation layer 329 and 333 expose the first conductivity type semiconductor layer 323 along a periphery of the mesa M to allow electrical connection to the first conductivity type semiconductor layer 323 in a specific region, and expose the first conductivity type semiconductor layer 323 in a region between the fingers Fs. These opening areas are indicated by reference numerals 333a1 and 333a2. Further, the first insulation layer 329 and 333 have openings 333b to allow electrical connection to the second contact layer 331. The first insulation layer 329 and 333 may have different thicknesses at respective positions depending on whether or not the preliminary insulation layer 329 is present. As shown in the drawing, a thickness of the first insulation layer 329 and 333 located on the second contact layer 331 is greater than a thickness of the first insulation layer 329 and 333 located around the second contact layer 331. In addition, when the preliminary insulation layer 329 is limitedly formed around the second contact layer 331 in the upper region of the mesa M, a thickness of the first insulation layer 329 and 333 located around the second contact layer 331 on the mesa M is greater than a thickness of the first insulation layer 333 located on the second contact layer 331 or on the first conductivity type semiconductor layer 323. In the meantime, the opening regions 333a1 and 333a2 may be formed by patterning the lower insulation layer 333 and the preliminary insulation layer 329 together, and the opening 333b may be formed by patterning only the lower insulation layer 333 without the preliminary insulation layer 329. Further, the opening 333b is located on the second contact layer 331, and overlaps with the second contact layer 331.

The opening regions 333a1 are located between the fingers F and expose the first conductivity type semiconductor layer 323. Further, an opening region 333a2 is formed near an edge of the substrate 321 along the periphery of the mesa M. The opening region 333a2 and the opening region 333a1 may be connected to each other, the present disclosure is not limited thereto, but they may be spaced apart from each other.

The opening region 333a2 is determined by a location of a front line of the first insulation layer 329 and 333. That is, the opening region 333a2 between an edge of an upper surface of the first conductivity type semiconductor layer 323 and the front line of the first insulation layer 329 and 333 is exposed. In the meantime, the front line of the first insulation layer 329 and 333 comprises protrusions 333p and recesses 333r. The front line may have a triangular waveform, for example, it is not limited thereto, but it may have various forms. Further, the protrusions 333p and the recesses 333r may be alternately repeated. Accordingly, the opening region 333a2 has a shape in which a large area and a narrow area are repeated.

In the meantime, the opening 333b is disposed on the palm P of the mesa M. A number of openings 333b is not particularly limited, but it may be one or more. Further, when there are a plurality of openings 333b, they may be arranged so as to have a symmetrical structure, but the present disclosure is not limited thereto.

The lower insulation layer 333 may be formed of an oxide layer such as $SiO_2$ or others, a nitride layer such as $SiN_x$ or others, or an insulating layer of $MgF_2$ using a chemical vapor deposition (CVD) technique or the like, and may be patterned by using a photolithography and etching technique.

The lower insulation layer 333 may be formed of a distributed Bragg reflector (DBR) in which a low refractive index material layer and an high refractive index material layer are alternately laminated. For example, an insulating reflection layer having a high reflectance may be formed by laminating layers such as $SiO_2/TiO_2$, $SiO_2/Nb_2O_5$, or others.

Figure 35A:
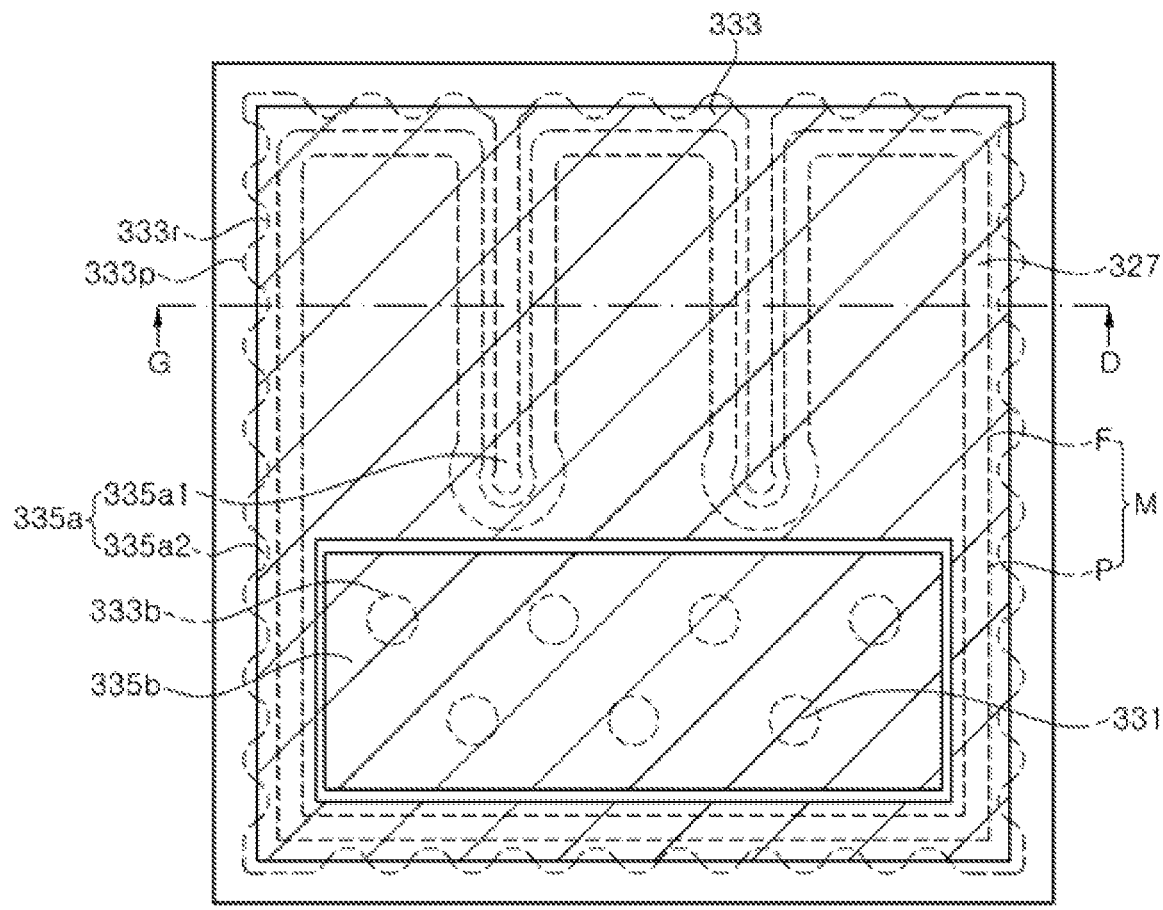
Figure 35B:
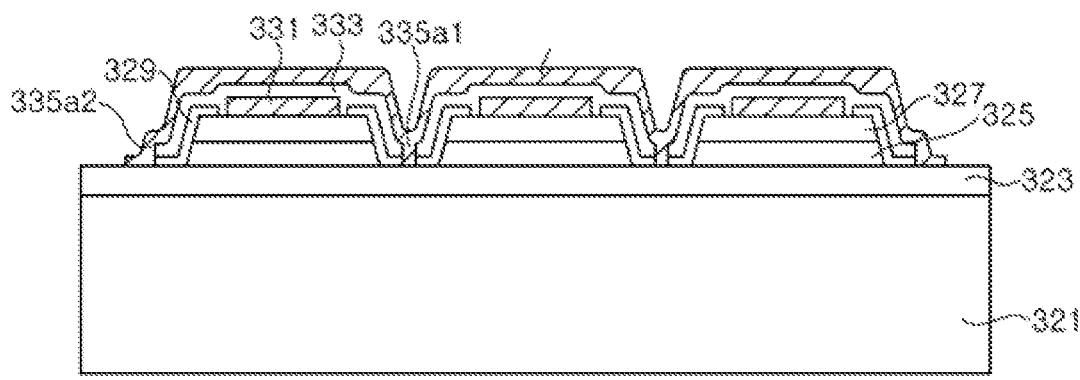

Referring to FIGS. 35A and 35B, the first contact layer 335a and an intermediate connection portion 335b are formed on the first insulation layer 329 and 333. The first contact layer 335a and the intermediate connection portion 335b may be formed simultaneously with the same material using a lift-off technique, for example.

The first contact layer 335a covers over most of the first conductivity type semiconductor layer 323 except for a region where the intermediate connection portion 335b is to be formed. The first contact layer 335a is insulated from the mesa M and the second contact layer 331 by the first insulation layer 329 and 333. The first contact layer 335a has an opening surrounding the intermediate connection portion 335b, and the intermediate connection portion 335b is formed in the opening.

In addition, the first contact layer 335a comprises an inner contact portion 335a1 contacting the first conductivity type semiconductor layer 323 exposed in the opening region 333a1 and an outer contact portion 335a2 contacting the first conductivity type semiconductor layer 323 through the opening region 333a2. The outer contact portion 335a2 contacts the first conductivity type semiconductor layer 323 near the edge of the first conductivity type semiconductor layer 323 along the periphery of the mesa M. At this time, a portion of the front line of the first contact layer 335a is located on the protrusions 333p of the first insulation layer 329 and 333 and is separated from the first conductivity type semiconductor layer 323, and another portion is located on the first conductivity type semiconductor layer 323 exposed in the recess portions 333r of the first insulation layer 329 and 333 and forms the outer contact portion 335a2. Therefore, the outer contact portions 335a of the first contact layer 335a alternately contact the first conductivity type semiconductor layer 323 along a side surface of the mesa M with the first insulation layer 329 and 333. Accordingly, a total area of the outer contact portion 335a2 is reduced as compared with a case where the line-shaped outer contact portion 335a2 is formed in the first insulation layer 329 and 333 formed without the protrusions 333p, but light can be reflected by using the first insulation layer 329 and 333 and light extraction efficiency may be improved.

The inner contact portion 335a1 is connected to the first conductivity type semiconductor layer 323 in a region surrounded by the outer contact portion 335a2, particularly in a region between the fingers Fs. In particular, three or more fingers Fs may be formed, and a plurality of inner contact portions 335a1 may be connected to the first conductivity type semiconductor layer 323. Accordingly, since a plurality of inner contact portions 335a1 together with the outer contact portions 335a2 are connected to various points of the first conductivity type semiconductor layer 323, electric current may be easily spread.

In the meantime, an opening of the first contact layer 335a is formed to surround the opening 333b of the first insulation layer, for example, the lower insulation layer 333, and the intermediate connection portion 335b covers the opening 333b of the lower insulation layer 333. Therefore, the intermediate connection portion 335b is connected to the second contact layer 331 through the opening 333b of the lower insulation layer 333. The intermediate connection portion 335b is also overlapped with and disposed on the second contact layer 331, and particularly may be limitedly located on the palm P of the mesa M.

According to the present embodiment, the first contact layer 335a is formed over almost an entire region of the first conductivity type semiconductor layer 323 except for openings. Therefore, current may be easily spread through the first contact layer 335a. The first contact layers 335a may comprise a highly reflective metal layer such as an Al layer, and the highly reflective metal layer may be formed on an adhesive layer such as Ti, Cr, Ni, or others. In addition, a protective layer of a single layer or a multilayer structure of Ni, Cr, Au, or others may be formed on the highly reflective metal layer. The first contact layer 335a may have a multilayer structure of Cr/Al/Ni/Ti/Ni/Ti/Au/Ti, for example.

Figure 36A:
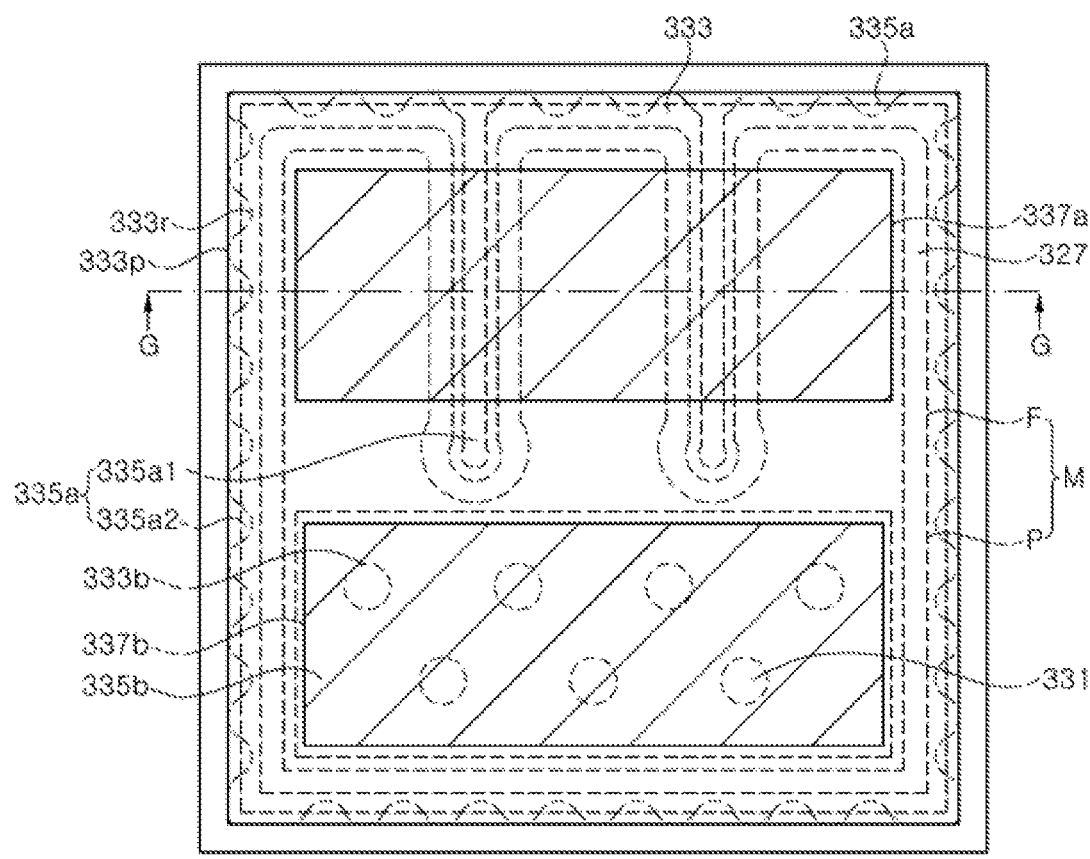
Figure 36B:
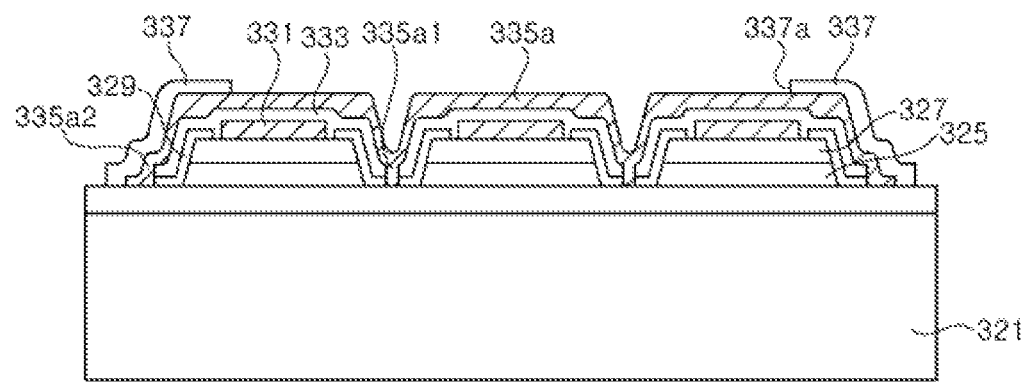

Referring to FIGS. 36A and 36B, an upper insulation layer 337 is formed on the first contact layer 335a. The upper insulation layer 337 has an opening 337a exposing the first contact layer 335a and an opening 337b exposing the intermediate connection portion 335b. The opening 337a may be formed to overlap the first contact layer 335a over the fingers Fs of the mesa M, and the opening 337b may be formed on the intermediate connection portion 335b to overlap the second contact layer 331 on the palm P of the mesa M.

The opening 337b is located to overlap the second contact layer 331, and may have a smaller size than the intermediate connection portion 335b. Therefore, an edge and sidewalls of the intermediate connection portion 335b are covered with the upper insulation layer 337. Further, sidewalls of the opening of the first contact layer 335a are also covered with the upper insulation layer 337.

The upper insulation layer 337 may be formed of a single layer of a silicon nitride or a silicon oxide layer, it is not limited thereto, but may be formed of multiple layers or a distributed Bragg reflector structure. The upper insulation layer 337 may cover an inclined surface L1 and may cover side surfaces of the first conductivity type semiconductor layer 323.

Figure 37A:
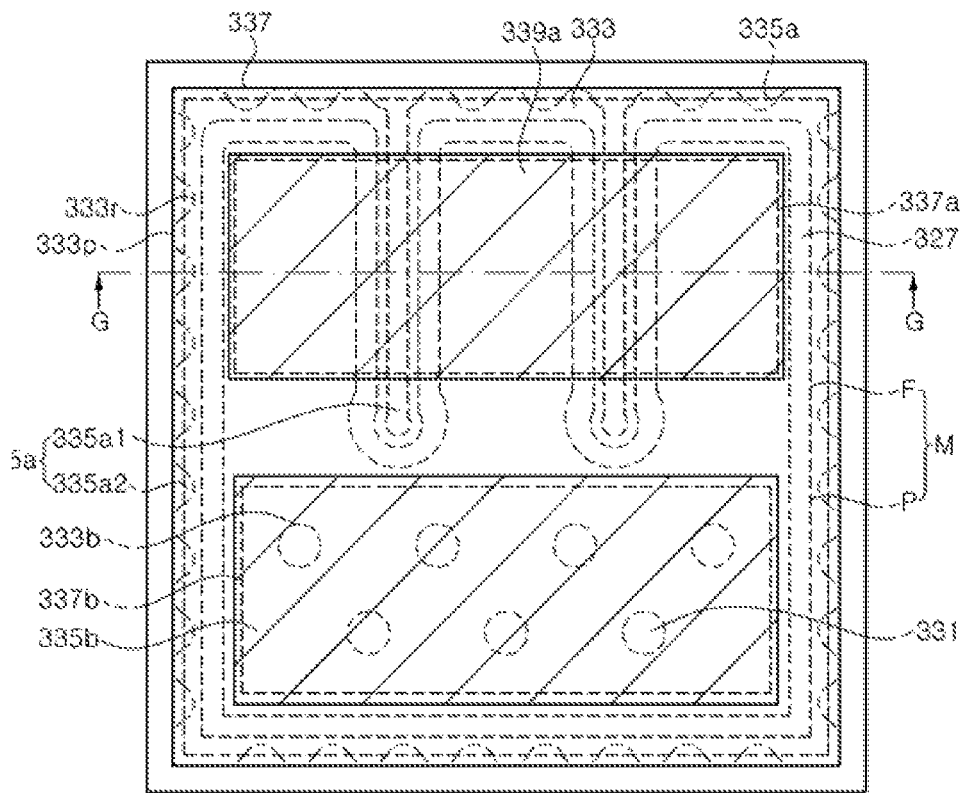
Figure 37B:
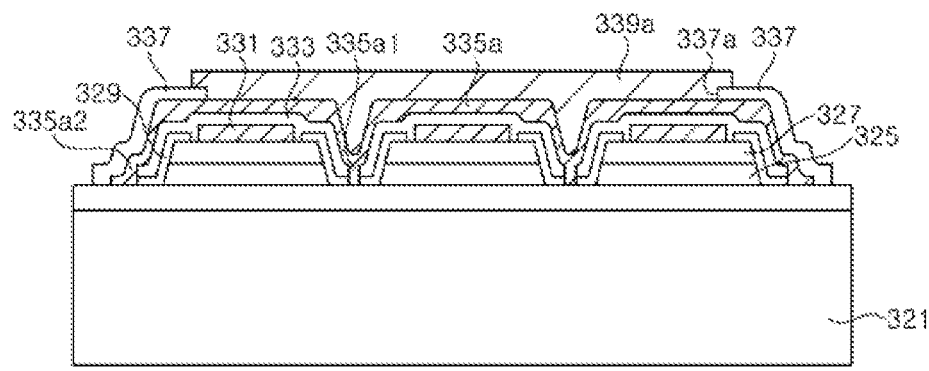

Referring to FIGS. 37A and 37B, a first electrode pad 339a and a second electrode pad 339b are formed on the upper insulation layer 337. The first electrode pad 339a is connected to the first contact layer 335a through the opening 337a of the upper insulation layer 337 and the second electrode pad 339b is connected to the intermediate connection portion 335b through the opening 337b of the upper insulation layer 337. The first electrode pad 339a and the second electrode pad 339b are used for mounting a light emitting diode on a submount, a printed circuit board, or others. The first electrode pad 339a and the second electrode pad 339b may be formed of AuSn, and may be mounted on a submount or others through eutectic bonding.

A distance D between first and second electrode pads may be about 80 μm or more to prevent a short circuit.

Meanwhile, the first and second electrode pads 339a and 339b may be formed together using the same process, for example, a lift-off technique.

Thereafter, light emitting diodes individually divided by processes such as laser scribing and cracking into individual light emitting elements are provided.

Figure 38:
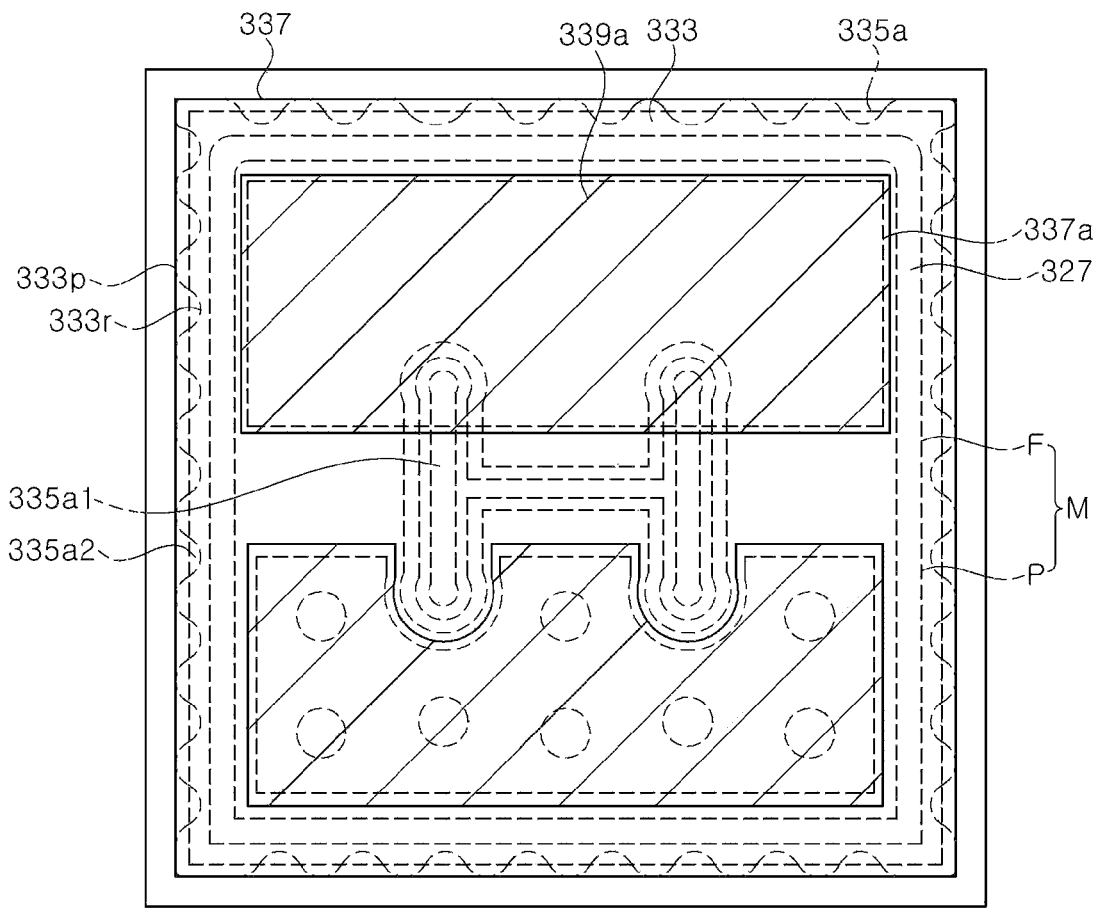
FIG. 38 is a schematic plan view illustrating a light emitting diode according to another embodiment of the present disclosure.

FIG. 38 is a schematic plan view illustrating a light emitting diode according to another embodiment of the present disclosure.

In the embodiment described above, it was described that the inner contact portions 335a1 are formed in the indent portions, however, there is a difference in the present embodiment that the inner contact portions 335a1 are in contact with a first conductivity type semiconductor layer 323 exposed in a groove formed in a mesa M.

That is, the mesa M has the groove passing through the second conductivity type semiconductor layer 327 and the active layer 325 and exposing the first conductivity type semiconductor layer 323. The groove is surrounded by the second conductivity type semiconductor layer 327 and the active layer 325, and the inner contact portions 335a1 are in contact with the first conductivity type semiconductor layer 323 exposed in the groove. Therefore, the inner contact portions 335a1 are separated from outer contact portions 335a2.

In the meantime, as shown in FIG. 38, the groove may have an H shape comprising two straight lines and a connection line connecting the straight lines. The groove may be disposed in a central region of the mesa. Furthermore, the inner contact portions 335a1 may be formed in the two straight lines in the H-shaped groove, but the inner contact portions 335a1 is may not be formed in the connection line. That is, the first contact layer 335a may be disposed over the connection line, but it may be separated from the first conductivity type semiconductor layer 323 by the first insulation layer 329 and 333.

In the meantime, at least one of end terminal portions of the groove may have a wider width than other portions of the straight lines. These terminal portions are located near regions, respectively where a first electrode pad 339a and a second electrode pad 339b are located. As shown in FIG. 38, the first electrode pad 339a may be disposed to overlap with two terminal portions of the terminal portions, and the second electrode pad 339b may be formed to surround the other two terminal portions.

In the meantime, a shortest distance between the inner contact portions 335a1 and the outer contact portions 335a2 may be the same at any point of the inner contact portions 335a1. Further, a distance between the inner contact portions 335a1 formed on the two straight lines in the H-shaped groove may be the same as the shortest distance between the inner contact portions 335a1 and the outer contact portions 335a2. Therefore, current may be evenly spread over an entire light emitting region.

Figure 39A:
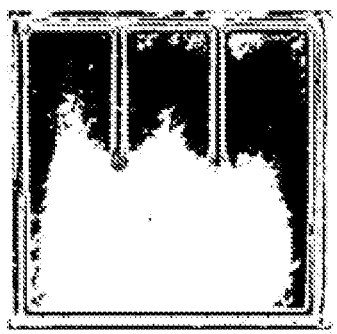
FIG. 39A and FIG. 39B are photographs showing light emission patterns of the light emitting diodes of FIG. 28A and FIG. 38.
Figure 39B:
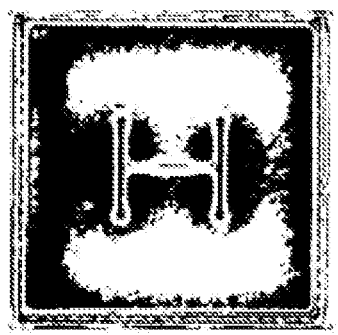

FIGS. 39A and 39B are photographs illustrating light emission patterns of the light emitting diodes according to the embodiments described above. FIG. 39A is the light emission pattern of the light emitting diode in which the inner contact portions are disposed in the indent portions, and FIG. 39B is the light emission pattern of the light emitting diode in which the inner contact portions are disposed in the H-shaped groove. The light emission pattern is observed from a surface of the substrate 321 which is the light emitting surface of the flip chip structure light emitting diode.

FIG. 39A shows that light is mainly emitted from regions of the indent portions where the inner contact portions 335a1 are formed, but light is not emitted well in a region where the second electrode pad 339b is disposed. In the meantime, FIG. 39B shows that light is preferably emitted from most of regions of the light emitting surface.

Although the various exemplary embodiments of the present disclosure have been described above, the present disclosure is not limited to these embodiments, and various modifications can be made. In addition, the elements described in one embodiment can be applied to other embodiments without departing from the technical spirit according to the appended claims of the present disclosure.

What is claimed is:
1. A light emitting diode, comprising:
a substrate;
a first light emitting cell and a second light emitting cell disposed adjacent to each other on the substrate and each comprising an n-type semiconductor layer, a p-type semiconductor layer, and an active layer disposed between the n-type semiconductor layer and the p-type semiconductor layer;
reflection structures disposed on the p-type semiconductor layers of the first light emitting cell and the second light emitting cell, respectively, and contacting the p-type semiconductor layers;
a first contact layer in ohmic contact with the n-type semiconductor layer of the first light emitting cell;
a second contact layer in ohmic contact with the n-type semiconductor layer of the second light emitting cell and connected to the reflection structure on the first light emitting cell;
an n-electrode pad disposed over the first light emitting cell and electrically connected to the first contact layer; and
a p-electrode pad disposed over the second light emitting cell and electrically connected to the reflection structure on the second light emitting cell,
wherein the first light emitting cell and the second light emitting cell are isolated from each other by an isolation region exposing the substrate,
wherein the n-type semiconductor layers of the first light emitting cell and the second light emitting cell comprise inner side surfaces facing each other and outer side surfaces exposed to outside, wherein the at least one outer side surface is inclined steeper than the inner side surfaces,
wherein each of the first light emitting cell and the second light emitting cell comprises a mesa disposed on a partial region of the n-type semiconductor layer and comprising the active layer and the p-type semiconductor layer, and each of the first contact layer and the second contact layer is in contact with the n-type semiconductor layer in a region between the outer side surfaces of the n-type semiconductor layer and the mesa along a periphery of the mesa, wherein each of the mesas has a through-hole exposing the n-type semiconductor layer through the p-type semiconductor layer and the active layer, and each of the first contact layer and the second contact layer further contacts the n-type semiconductor layer through the through-hole of the mesa.

2. The light emitting diode of claim 1,
wherein each of the n-type semiconductor layers of the first and second light emitting cells comprises one inner side surface and three outer side surfaces, and
the three outer side surfaces are inclined steeper than the one inner side surface.

3. The light emitting diode of claim 2,
wherein three outer side surfaces of each of the n-type semiconductor layers of the first and second light emitting cell are flush with the respective side surfaces of the substrate.

4. The light emitting diode of claim 1,
wherein the through-holes have elongated shapes and are disposed along a same line.

5. The light emitting diode of claim 4,
wherein the through-holes pass through centers of the mesas, respectively.

6. The light emitting diode of claim 1, further comprising:
a lower insulation layer covering the mesas and the reflection structures and disposed between the mesas and the first and second contact layers,
wherein the lower insulation layer has a hole exposing the reflection structure on the first light emitting cell and the second contact layer is connected to the reflection structure on the first light emitting cell through the hole.

7. The light emitting diode of claim 6,
wherein the second contact layer extends from the second light emitting cell to the first light emitting cell via an upper region of the isolation region, and
wherein the second contact layer located in the upper region of the isolation region is disposed within a width of the mesas.

8. The light emitting diode of claim 7,
wherein a portion of the first contact layer overlaps with the reflection structure on the first light emitting cell, and a portion of the second contact layer overlaps with the reflection structure on the second light emitting cell.

9. The light emitting diode of claim 8,
wherein each of the first and second contact layers comprises a reflection metal layer.

10. The light emitting diode of claim 6,
wherein the lower insulation layer comprises a distributed Bragg reflector.

11. The light emitting diode of claim 6,
wherein the hole of the lower insulation layer has an elongated shape along the isolation region.

12. The light emitting diode of claim 1, further comprising:
an upper insulation layer disposed between the first and second contact layers and the n-electrode and p-electrode pads,
wherein the upper insulation layer has a first via-hole exposing the first contact layer and a second via-hole exposing the reflection structure on the second light emitting cell,
wherein the n-electrode pad is connected to the first contact layer through the first via- hole, and
wherein the p-electrode pad is connected to the reflection structure through the second via-hole.

13. The light emitting diode of claim 12,
wherein the upper insulation layer covers the first and second contact layers disposed between the outer side surfaces of the n-type semiconductor layers and the mesas, and is connected to the n-type semiconductor layers between the outer side surfaces of the n-type semiconductor layers and the first and second contact layers.

14. A light emitting device comprising;
a light emitting diode according to claim 1; and
a wavelength conversion layer covering the substrate and side surfaces of the light emitting diode, and exposing the n-electrode pad and the p-electrode pad.

15. The light emitting device of claim 14, further comprising:
reflection sidewalls disposed on both side surfaces of the light emitting diode, respectively,
wherein the wavelength conversion layer covering the side surfaces of the light emitting diode is interposed between the sidewalls and the light emitting diode.

16. The light emitting device of claim 15,
wherein the reflection sidewalls is disposed on longer side surfaces of the light emitting diode.

* * * * *